(12) United States Patent
Wu et al.

(10) Patent No.: US 11,670,704 B2
(45) Date of Patent: Jun. 6, 2023

(54) SEMICONDUCTOR DEVICE STRUCTURE WITH BARRIER LAYER

(71) Applicant: Taiwan Semiconductor Manufacturing Company, Ltd., Hsinchu (TW)

(72) Inventors: Chia-Yang Wu, Tainan (TW); Shiu-Ko Jangjian, Tainan (TW); Ting-Chun Wang, Tainan (TW); Yung-Si Yu, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 11 days.

(21) Appl. No.: 17/340,276

(22) Filed: Jun. 7, 2021

(65) Prior Publication Data
US 2021/0296472 A1 Sep. 23, 2021

Related U.S. Application Data

(63) Continuation of application No. 16/852,973, filed on Apr. 20, 2020, now Pat. No. 11,031,488, which is a
(Continued)

(51) Int. Cl.
*H01L 29/66* (2006.01)
*H01L 29/417* (2006.01)
(Continued)

(52) U.S. Cl.
CPC .. *H01L 29/66795* (2013.01); *H01L 21/28556* (2013.01); *H01L 21/762* (2013.01); *H01L 21/76831* (2013.01); *H01L 21/76832* (2013.01); *H01L 21/76843* (2013.01); *H01L 29/41791* (2013.01); *H01L 29/4966* (2013.01); *H01L 29/665* (2013.01); *H01L 29/66545* (2013.01);
(Continued)

(58) Field of Classification Search
None
See application file for complete search history.

(56) References Cited

U.S. PATENT DOCUMENTS 5,985,749 A 11/1999 Lin et al.
6,093,642 A 7/2000 Cho et al.
(Continued)

OTHER PUBLICATIONS

U.S. Office Action for U.S. Appl. No. 17/833,363, dated Jan. 31, 2023.

*Primary Examiner* — Hsien Ming Lee
(74) *Attorney, Agent, or Firm* — Birch, Stewart, Kolasch & Birch, LLP

(57) ABSTRACT

A semiconductor device structure is provided. The semiconductor device structure includes a dielectric structure over the substrate. The semiconductor device structure includes a contact structure passing through the dielectric structure. The contact structure includes a contact layer, a first barrier layer, and a second barrier layer. The first barrier layer surrounds the contact layer, the second barrier layer surrounds a first upper portion of the first barrier layer, the contact layer passes through the first barrier layer and extends into the dielectric structure, and the first barrier layer passes through the second barrier layer and extends into the dielectric structure.

20 Claims, 43 Drawing Sheets

Related U.S. Application Data continuation of application No. 16/174,921, filed on Oct. 30, 2018, now Pat. No. 10,629,708.

(60) Provisional application No. 62/585,619, filed on Nov. 14, 2017.

(51) Int. Cl.
*H01L 29/78* (2006.01)
*H01L 21/768* (2006.01)
*H01L 21/762* (2006.01)
*H01L 21/285* (2006.01)
*H01L 29/49* (2006.01)
*H01L 29/165* (2006.01)

(52) U.S. Cl.
CPC ...... *H01L 29/7848* (2013.01); *H01L 29/7851* (2013.01); *H01L 21/76224* (2013.01); *H01L 29/165* (2013.01)

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 10,629,708 B2 | 4/2020 | Wu et al. |
| 2009/0206379 A1* | 8/2009 | Kitazaki ............ H01G 4/1245 257/295 |
| 2018/0315647 A1 | 11/2018 | Wang et al. |
| 2019/0067436 A1 | 2/2019 | Wu et al. |

\* cited by examiner

SEMICONDUCTOR DEVICE STRUCTURE WITH BARRIER LAYER

PRIORITY CLAIM AND CROSS-REFERENCE

This application is a Continuation of U.S. application Ser. No. 16/852,973, filed on Apr. 20, 2020, which is a Continuation of U.S. application Ser. No. 16/174,921, filed on Oct. 30, 2018, the entirety of which is incorporated by reference herein. This application claims the benefit of U.S. Provisional Application No. 62/585,619, filed on Nov. 14, 2017, and entitled "Semiconductor structure with barrier layer and method for forming the same", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes (e.g., diameters of contact structures) continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1B-1 is a top view of the semiconductor device structure of FIG. 1B, in accordance with some embodiments.

FIG. 2O-1 is a top view of the semiconductor device structure of FIG. 2O, in accordance with some embodiments.

FIG. 2O-2 is a top view of the semiconductor device structure of FIG. 2O, in accordance with some embodiments.

FIG. 7G-1 is a top view of the semiconductor device structure of FIG. 7G, in accordance with some embodiments.

FIG. 7G-2 is a top view of the semiconductor device structure of FIG. 7G, in accordance with some embodiments.

DETAILED DESCRIPTION

Figure 1A:
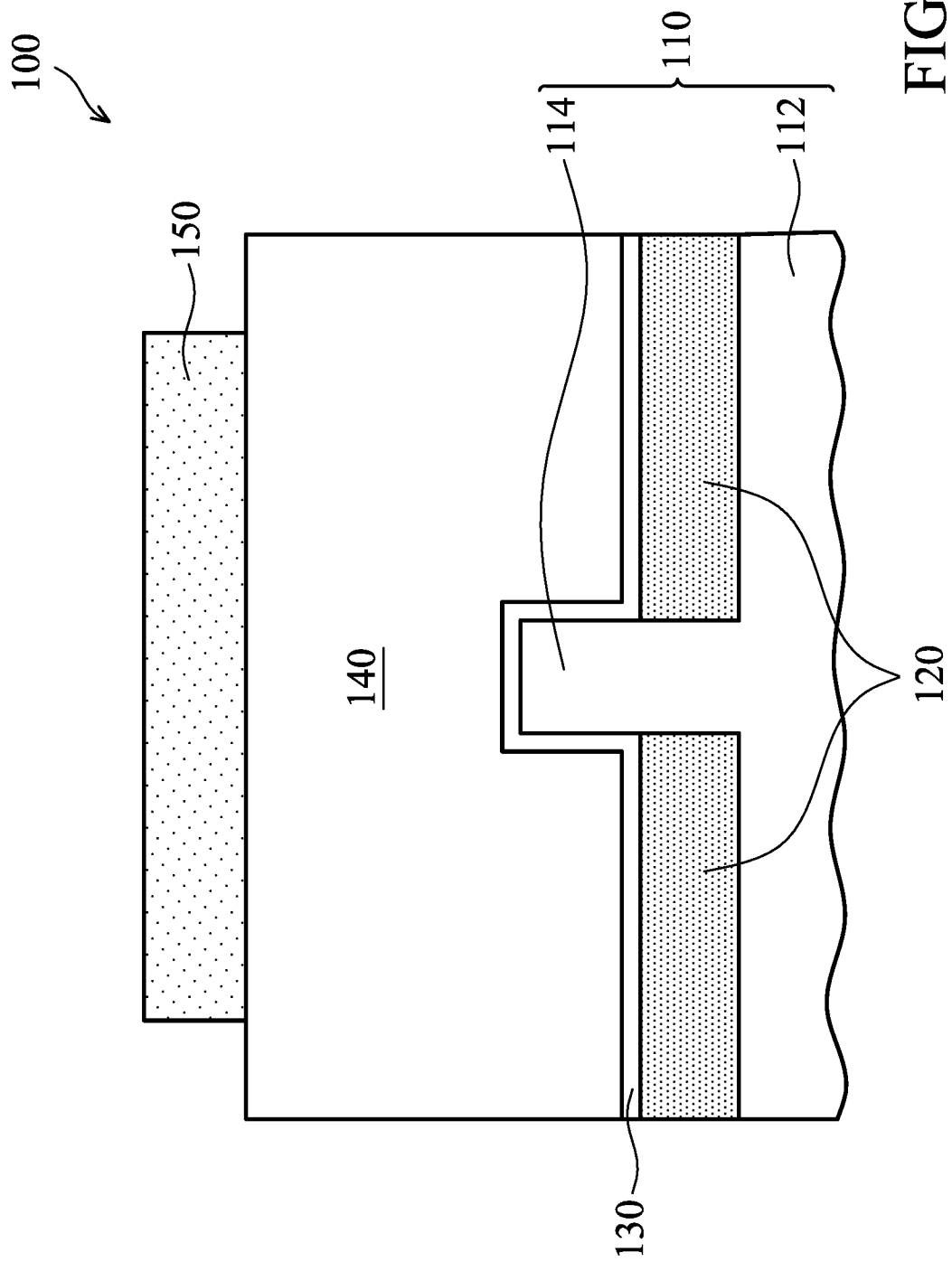
FIGS. 1A-1B are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 1B:
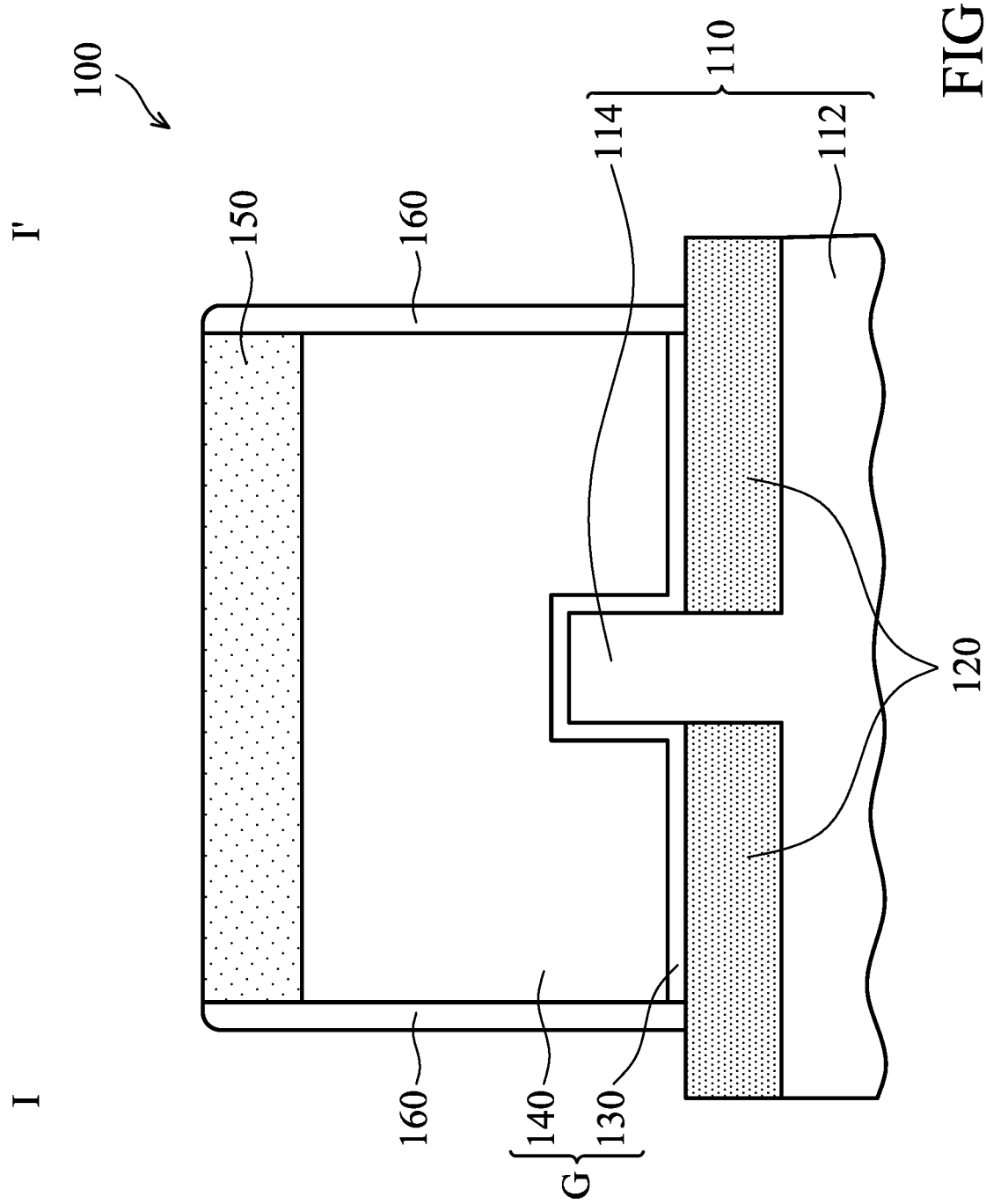

FIGS. 1A-1B are cross-sectional views of various stages of a process for forming a semiconductor device structure, in accordance with some embodiments. As shown in FIG. 1A, a substrate 110 is provided, in accordance with some embodiments. The substrate 110 has a base portion 112 and a fin portion 114, in accordance with some embodiments. The fin portion 114 is over the base portion 112, in accordance with some embodiments. In some embodiments, the substrate 110 is a bulk semiconductor substrate, such as a semiconductor wafer. For example, the substrate 110 is a silicon wafer.

The substrate 110 may include silicon or another elementary semiconductor material such as germanium. In some other embodiments, the substrate 110 includes a compound semiconductor. The compound semiconductor may include silicon germanium, gallium arsenide, silicon carbide, indium arsenide, indium phosphide, another suitable compound semiconductor, or a combination thereof.

In some embodiments, the substrate 110 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

In some embodiments, various device elements are formed in and/or over the substrate 110. The device elements are not shown in figures for the purpose of simplicity and clarity. Examples of the various device elements include transistors, diodes, another suitable element, or a combination thereof.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes are performed to form the various device elements. The processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIG. 1A, an insulating layer 120 is formed over the base portion 112 and surrounds the fin portion 114, in accordance with some embodiments. The insulating layer 120 is made of oxide (such as silicon dioxide), in accordance with some embodiments. The insulating layer 120 is formed by a chemical vapor deposition process and an etching back process, in accordance with some embodiments.

As shown in FIG. 1A, a gate dielectric layer 130 is formed over the fin portion 114 and the insulating layer 120, in accordance with some embodiments. The gate dielectric layer 130 conformally covers the fin portion 114 and the insulating layer 120, in accordance with some embodiments. The gate dielectric layer 130 is made of silicon dioxide, silicon nitride, silicon oxynitride, a dielectric material with high dielectric constant (high-K), another suitable insulating material, a combination thereof. The gate dielectric layer 130 is formed using a chemical vapor deposition process, in accordance with some embodiments.

As shown in FIG. 1A, a semiconductor layer 140 is formed over the gate dielectric layer 130, in accordance with some embodiments. The semiconductor layer 140 is made of silicon (e.g., polysilicon) or another elementary semiconductor material such as germanium.

In some other embodiments, the semiconductor layer 140 is made of a compound semiconductor. The compound semiconductor may include silicon germanium, gallium arsenide, silicon carbide, indium arsenide, indium phosphide, another suitable compound semiconductor, or a combination thereof. The semiconductor layer 140 is formed using a chemical vapor deposition process, in accordance with some embodiments.

As shown in FIG. 1A, a hard mask layer 150 is formed over the semiconductor layer 140, in accordance with some embodiments. The hard mask layer 150 partially covers the semiconductor layer 140, in accordance with some embodiments. The hard mask layer 150 includes nitrides (e.g., silicon nitride), oxides (e.g., silicon dioxide), or another suitable material. The hard mask layer 150 and the semiconductor layer 140 are made of different materials, in accordance with some embodiments.

The hard mask layer 150 is formed using a deposition process and an etching process, in accordance with some embodiments. The deposition process includes a chemical vapor deposition process or a physical vapor deposition process, in accordance with some embodiments.

Figures 1, 1B:
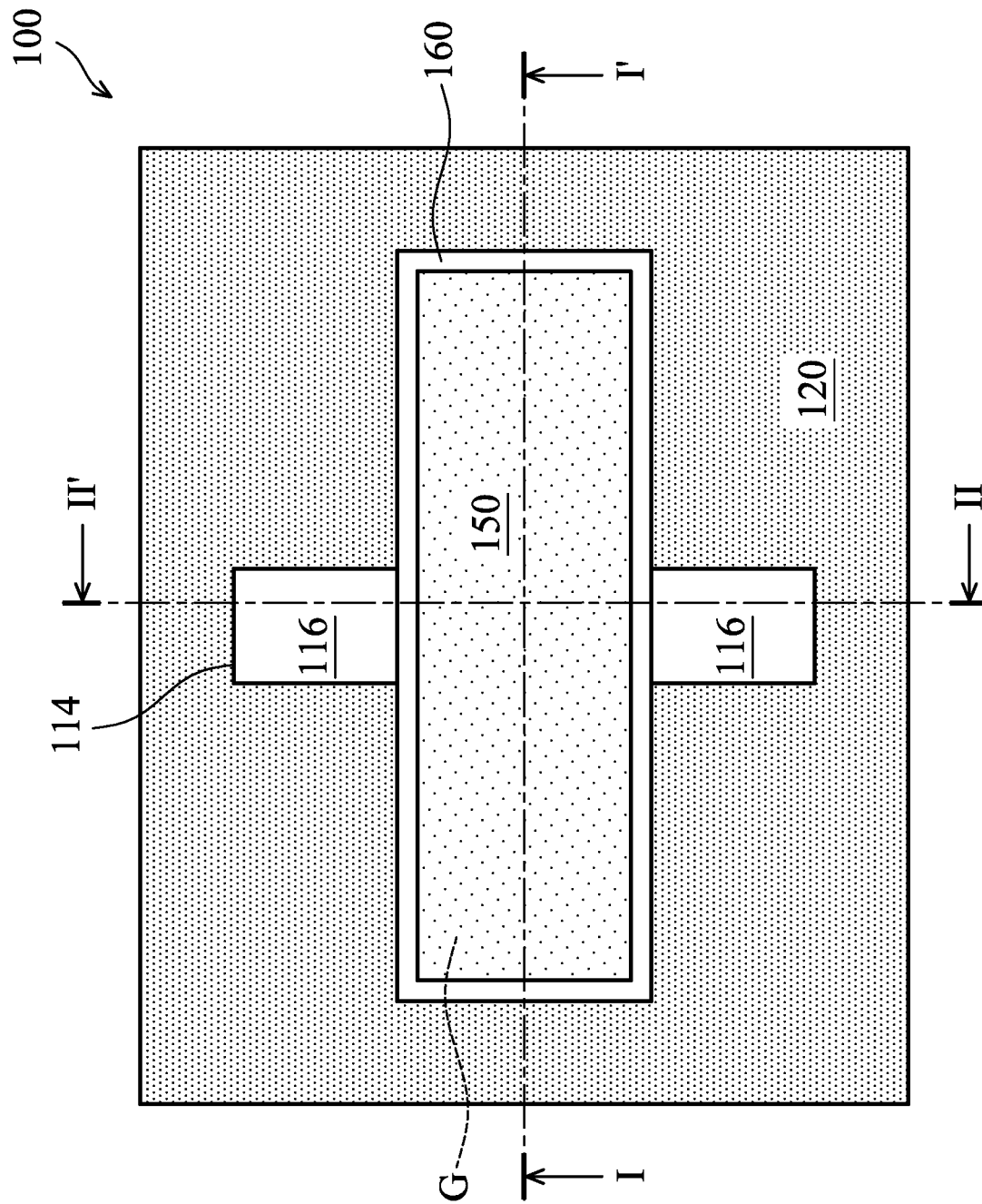
Figure 2A:
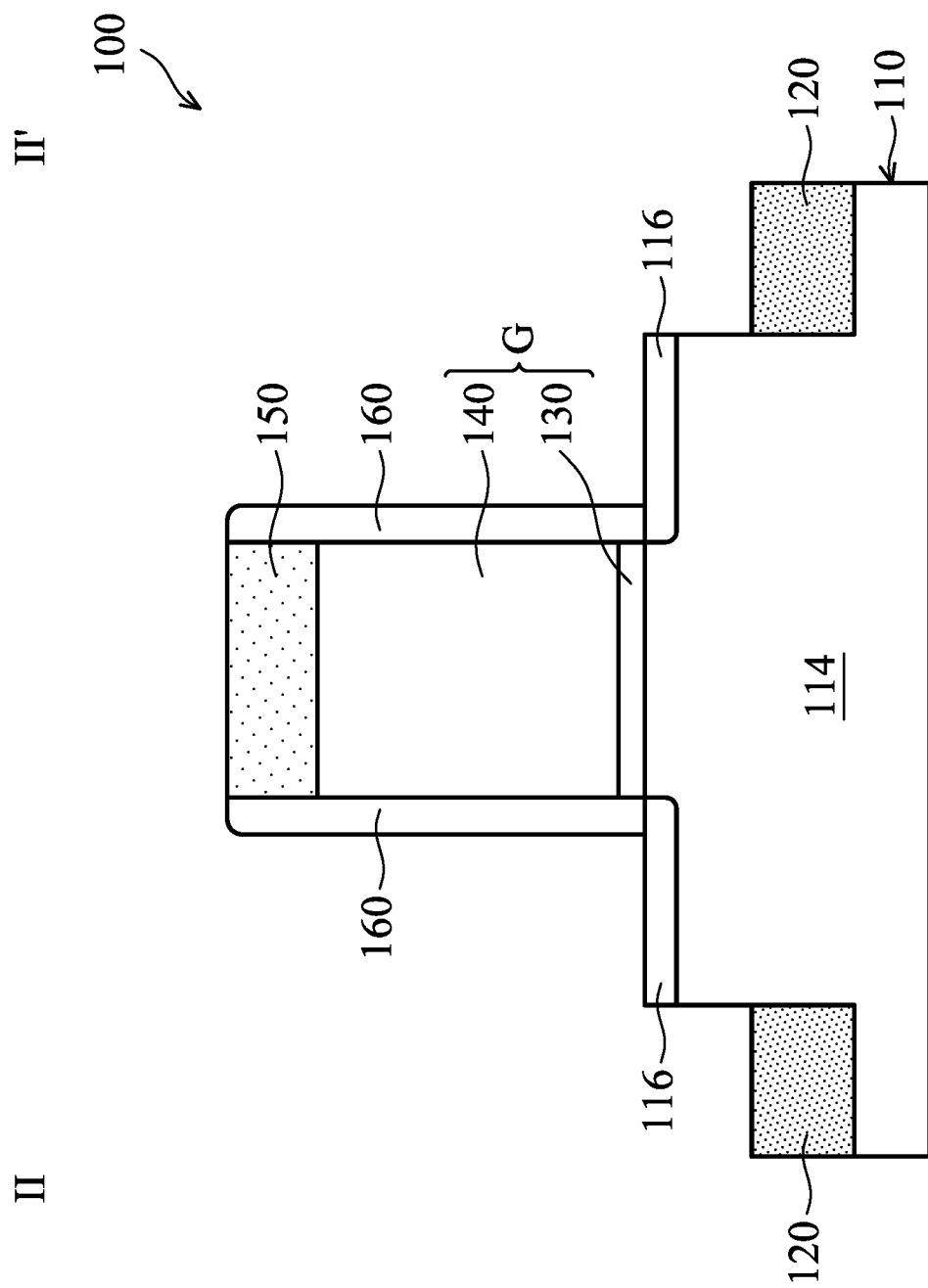
FIGS. 2A-2O are cross-sectional views of various stages of a process for forming a semiconductor device structure, in accordance with some embodiments.

FIG. 1B-1 is a top view of the semiconductor device structure 100 of FIG. 1B, in accordance with some embodiments. FIG. 1B is a cross-sectional view illustrating the semiconductor device structure 100 along a sectional line I-I' in FIG. 1B-1, in accordance with some embodiments. FIG. 2A is a cross-sectional view illustrating the semiconductor device structure 100 along a sectional line II-IF in FIG. 1B-1, in accordance with some embodiments.

As shown in FIGS. 1B, 1B-1, and 2A, portions of the semiconductor layer 140 and the gate dielectric layer 130, which are not covered by the hard mask layer 150, are removed, in accordance with some embodiments. The removal process of the portions of the semiconductor layer 140 and the gate dielectric layer 130 includes an etching process, such as a dry etching process, in accordance with some embodiments. The removal process uses the hard mask layer 150 as an etching mask, in accordance with some embodiments.

As shown in FIGS. 1B, 1B-1, and 2A, the remaining semiconductor layer 140 and the remaining gate dielectric layer 130 together form a gate stack G, in accordance with some embodiments. The gate stack G is formed across the fin portion 114, in accordance with some embodiments.

As shown in FIGS. 1B, 1B-1, and 2A, a spacer layer 160 is formed over sidewalls of the gate stack G and the hard mask layer 150, in accordance with some embodiments. The spacer layer 160 surrounds the gate stack G and the hard mask layer 150, in accordance with some embodiments. The spacer layer 160 includes an insulating material, such as silicon dioxide or silicon nitride, in accordance with some embodiments. The spacer layer 160 is formed using a chemical vapor deposition process and an etching process (e.g., a dry etching process), in accordance with some embodiments.

As shown in FIG. 2A, doped regions 116 are formed in the fin portion 114, in accordance with some embodiments. The doped regions 116 are formed in the fin portion 114 exposed by the gate stack G, in accordance with some embodiments. The doped regions 116 are located at two opposite sides of the gate stack G, in accordance with some embodiments. The doped regions 116 are also referred to as light doped regions, in accordance with some embodiments.

The doped regions 116 are formed using an ion implantation process, in accordance with some embodiments. The ion implantation process is performed to introduce p-type dopants (e.g., boron) or n-type dopants (e.g., phosphorus) into the fin portion 114, in accordance with some embodiments.

Figure 2B:
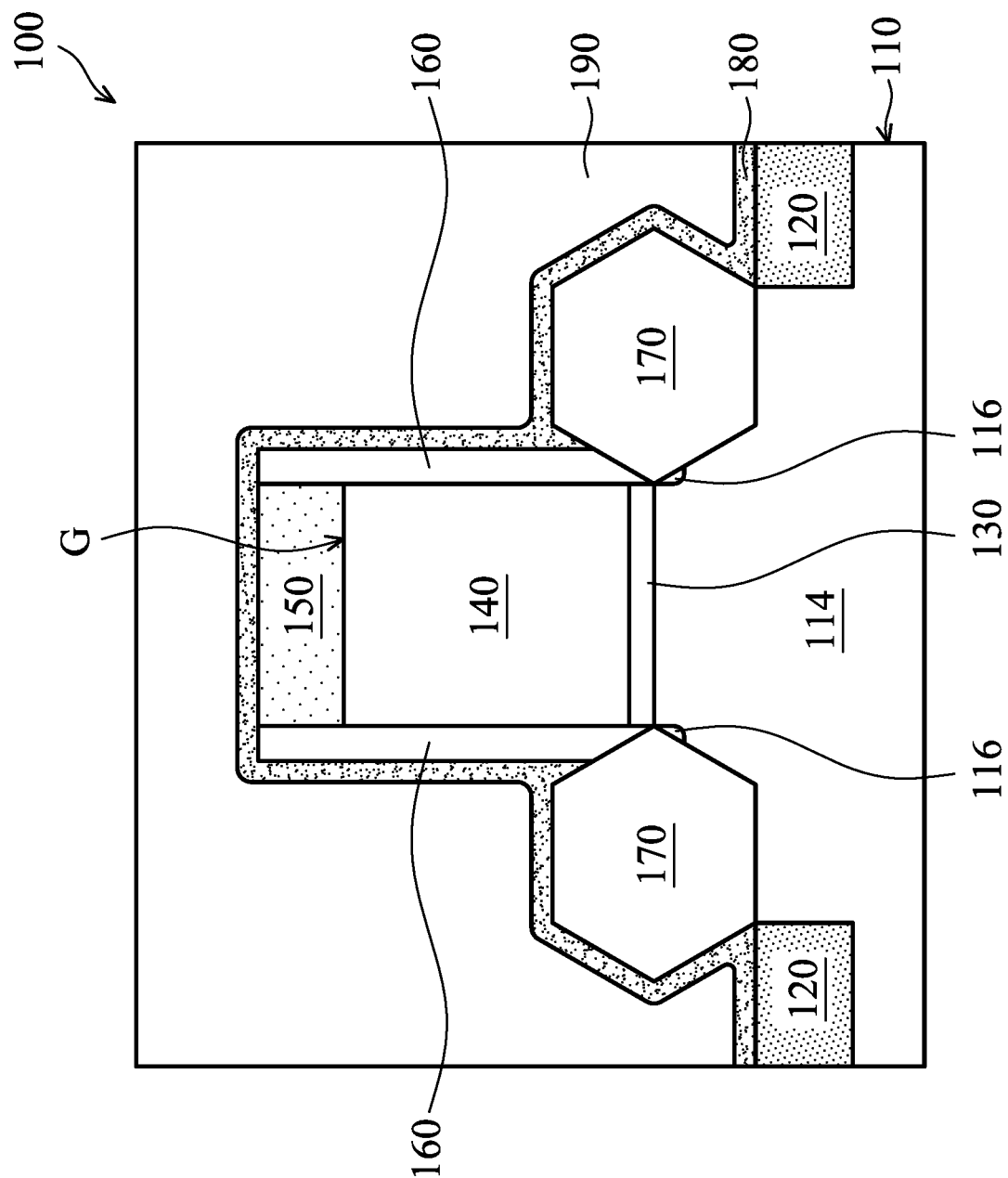

FIGS. 2A-2P are cross-sectional views of various stages of a process for forming a semiconductor device structure 100, in accordance with some embodiments. As shown in FIG. 2B, source/drain structures 170 are formed in the fin portion 114, in accordance with some embodiments. The source/drain structures 170 are formed using, for example, an etching process for removing a portion of the fin portion 114 and a selective epitaxial growth (SEG) process.

The source/drain structures 170 are used to be a source structure and a drain structure of a transistor, in accordance with some embodiments. The source/drain structures 170 are also used to be stressors, in accordance with some embodiments. In some embodiments, the source/drain structures 170 apply a compressive stress to a channel region of the fin portion 114 under the gate stack G, and the source/drain structures 170 include SiGe or another suitable material. Alternatively, in some other embodiments, the source/drain structures 170 apply a tensile stress to a channel region of the fin portion 114 under the gate stack G, and the source/drain structures 170 include SiC or another suitable material.

As shown in FIG. 2B, an etch stop layer 180 is formed over the substrate 110 to cover the source/drain structures 170, in accordance with some embodiments. The etch stop layer 180 further covers the hard mask layer 150, the gate stack G, the spacer layer 160, and the insulating layer 120, in accordance with some embodiments. The etch stop layer 180 includes a dielectric material, in accordance with some embodiments. The etch stop layer 180 includes silicon nitride, in accordance with some embodiments.

As shown in FIG. 2B, a dielectric layer 190 is formed over the etch stop layer 180, in accordance with some embodiments. The dielectric layer 190 includes silicon dioxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 190 is formed using a chemical vapor deposition process, a high-density plasma chemical vapor deposition process, a spin-on process, a sputtering process, or a combination thereof, in accordance with some embodiments.

Figure 2C:
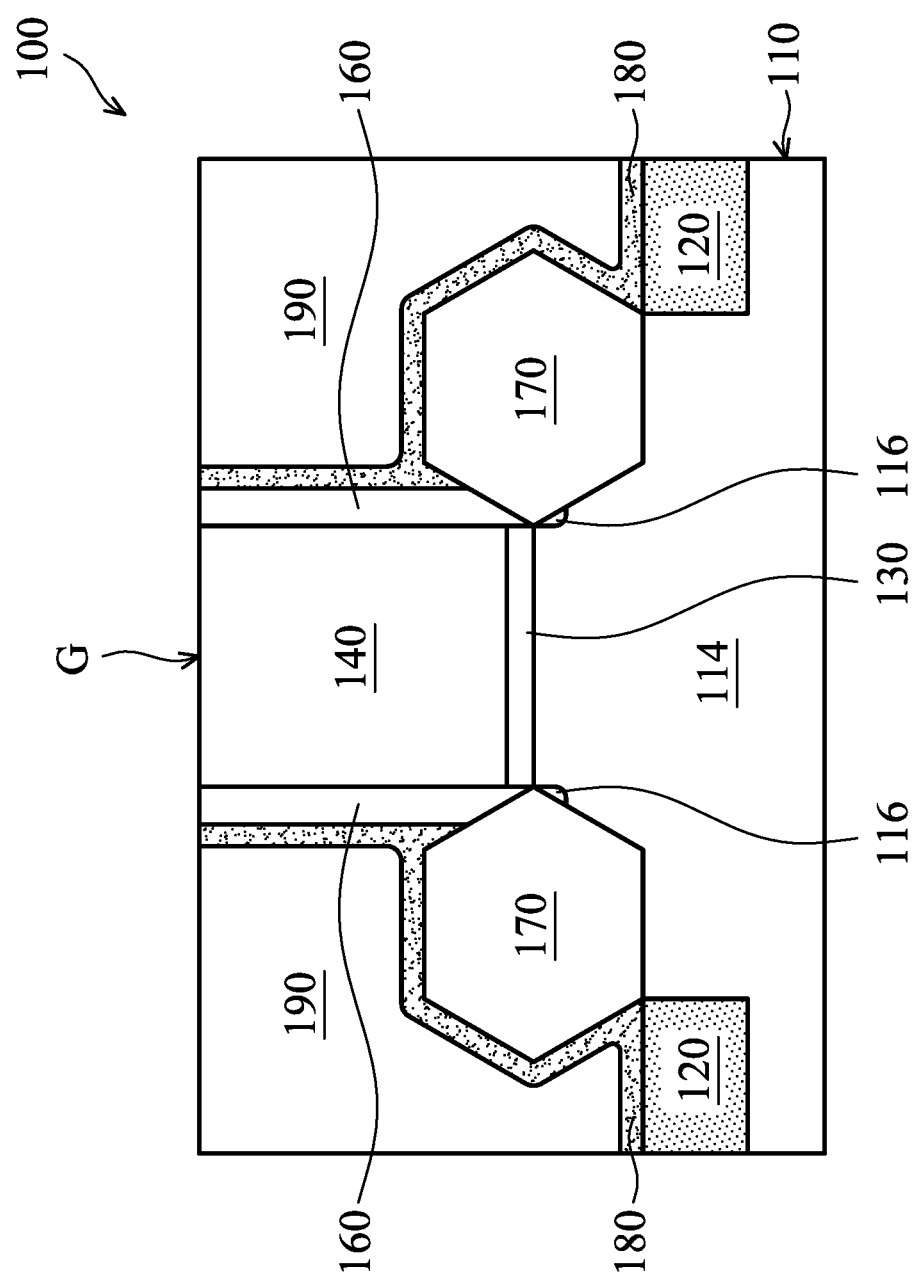

Afterwards, as shown in FIG. 2C, a planarization process is performed on the dielectric layer 190 until a top surface of the gate stack G is exposed, in accordance with some embodiments. The planarization process includes a chemical mechanical polishing (CMP) process, in accordance with some embodiments.

Figure 2D:
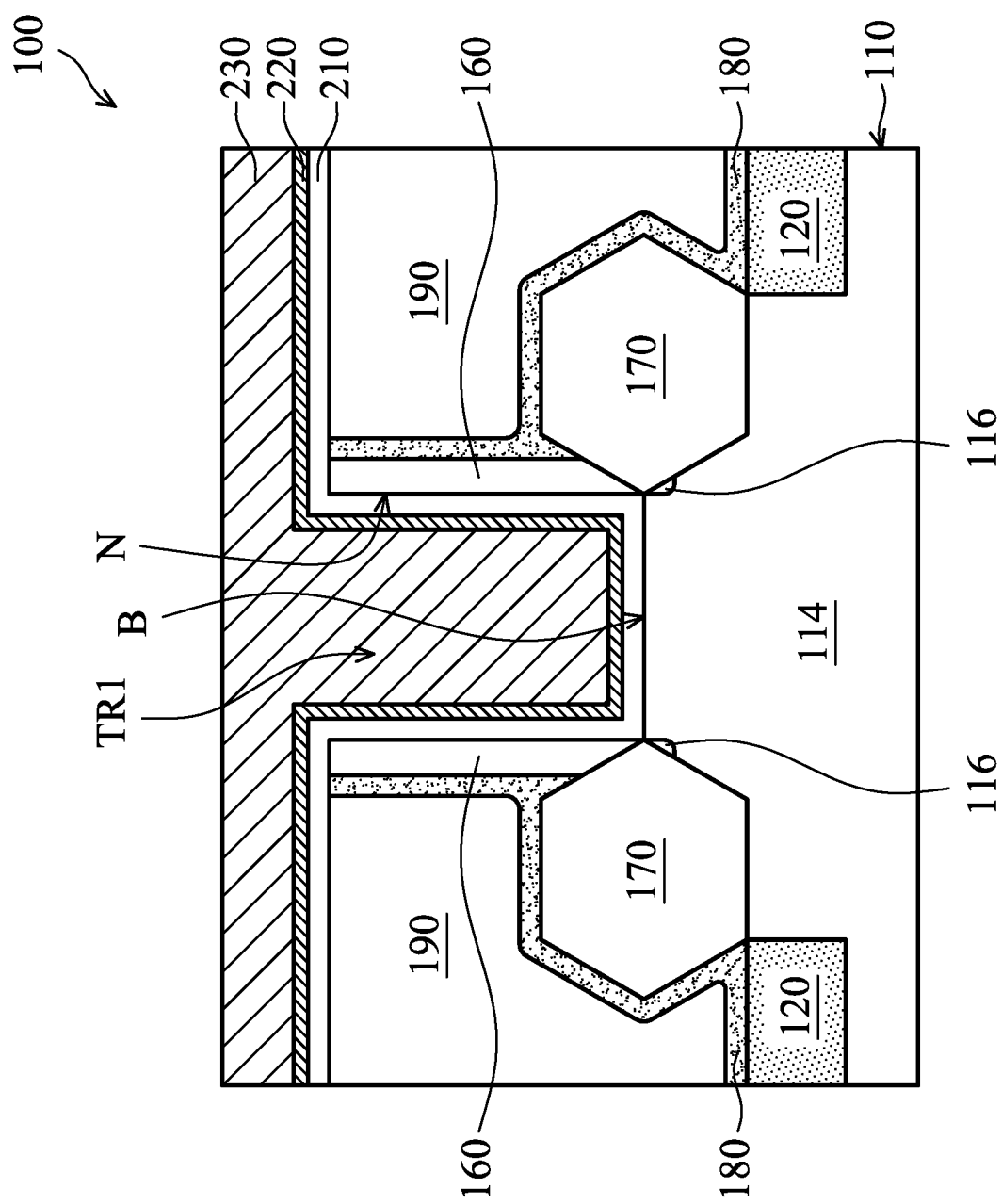

As shown in FIG. 2D, the gate stack G is removed, in accordance with some embodiments. The removal process for removing the gate stack G includes a wet etching process, a dry etching process, or a combination thereof, in accordance with some embodiments.

As shown in FIG. 2D, after the gate stack G is removed, a trench TR1 is formed in the spacer layer 160, in accordance with some embodiments. The trench TR1 passes through the spacer layer 160 and the dielectric layer 190, in accordance with some embodiments. The trench TR1 partially exposes the fin portion 114, in accordance with some embodiments.

As shown in FIG. 2D, a gate dielectric layer 210 is formed over a bottom surface B of the trench TR1, in accordance with some embodiments. The gate dielectric layer 210 is further formed over the dielectric layer 190, the spacer layer 160, and inner walls N of the trench TR1, in accordance with some embodiments.

The gate dielectric layer 210 includes a dielectric material, such as a high dielectric constant (high-k) material. The high-k material includes hafnium dioxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), other suitable high-k dielectric materials, or a combination thereof.

The high-k material is made of metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, other suitable materials, or a combination thereof, in accordance with some embodiments.

The gate dielectric layer 210 is deposited by any suitable process, such as an atomic layer deposition process, a chemical vapor deposition process, a physical vapor deposition process, other suitable processes, or a combination thereof, in accordance with some embodiments. In some embodiments, the gate dielectric layer 210 needs to be further annealed.

As shown in FIG. 2D, a work function layer 220 is deposited over the gate dielectric layer 210, in accordance with some embodiments. The work function layer 220 provides a desired work function for a transistor to enhance device performance including improved threshold voltage.

In the embodiments of forming an N-type fin field effect transistor (FinFET), the work function layer 220 can be an n-type metal capable of providing a work function value suitable for the device, such as equal to or less than about 4.5 eV. The n-type metal includes metal, metal carbide, metal nitride, or a combination thereof, in accordance with some embodiments. For example, the n-type metal is made of tantalum, tantalum nitride, or a combination thereof.

On the other hand, in the embodiments of forming a P-type FinFET, the work function layer 220 can be a p-type metal capable of providing a work function value suitable for the device, such as equal to or greater than about 4.8 eV. The p-type metal includes metal, metal carbide, metal nitride, other suitable materials, or a combination thereof, in accordance with some embodiments.

For example, the p-type metal is made of titanium, titanium nitride, other suitable materials, or a combination thereof. The work function layer 220 is deposited using a physical vapor deposition process, a chemical vapor deposition process, an atomic layer deposition process, a plating process, another suitable method, or a combination thereof, in accordance with some embodiments.

As shown in FIG. 2D, a gate electrode layer 230 (also called a metal gate electrode layer) is deposited over the work function layer 220 to fill the trench TR1, in accordance with some embodiments. The gate electrode layer 230 includes a suitable metal material, such as aluminum, tungsten, gold, platinum, cobalt, another suitable metal, an alloy thereof, or a combination thereof, in accordance with some embodiments. In some embodiments, the gate electrode layer 230 is deposited using a physical vapor deposition process, a plating process, the like, or a combination thereof.

Figure 2E:
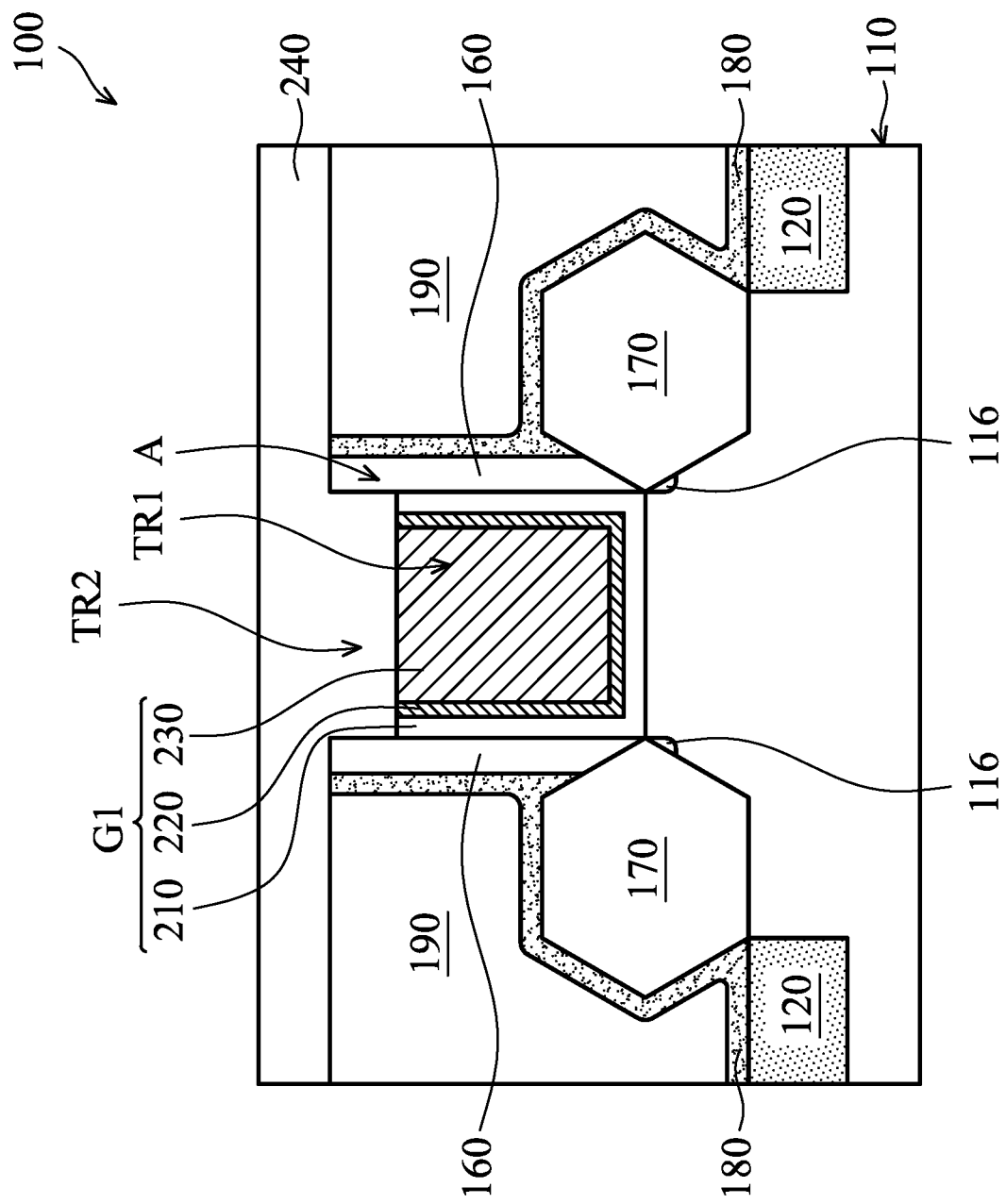

As shown in FIG. 2E, the gate electrode layer 230, the work function layer 220, and the gate dielectric layer 210 outside of the trench TR1 are removed, in accordance with some embodiments. The removal process includes a planarization process, in accordance with some embodiments. The planarization process includes a chemical mechanical polishing (CMP) process, in accordance with some embodiments.

The gate electrode layer 230, the work function layer 220, and the gate dielectric layer 210 in the trench TR1 together form a gate stack G1, in accordance with some embodiments. The gate stack G1, the source/drain structures 170, and the doped regions 116 together form a transistor A, in accordance with some embodiments. The transistor A includes a fin field effect transistor (FinFET), in accordance with some embodiments.

As shown in FIG. 2E, an upper portion of the gate stack G1 is removed, in accordance with some embodiments. The removal process of the upper portion of the gate stack G1 includes an etching process, such as a wet etching process or a dry etching process, in accordance with some embodiments. After the upper portion of the gate stack G1 is removed, a trench TR2 is formed, in accordance with some embodiments. The remaining gate stack G1 and the spacer layer 160 surround the trench TR2, in accordance with some embodiments. In some embodiments, the upper portion of the gate stack G1 is not removed. As a result, a top surface of the gate stack G1 is substantially co-planer with a top surface of the spacer layer 160.

As shown in FIG. 2E, a cap layer 240 is formed in the trench TR2, in accordance with some embodiments. The cap layer 240 is further formed over the spacer layer 160, the etch stop layer 180, and the dielectric layer 190, in accordance with some embodiments. The cap layer 240 includes a dielectric material, in accordance with some embodiments. The cap layer 240 includes silicon nitride, in accordance with some embodiments. The cap layer 240 is formed using a chemical vapor deposition process, an atomic layer deposition process, a physical vapor deposition process, in accordance with some embodiments.

Figure 2F:
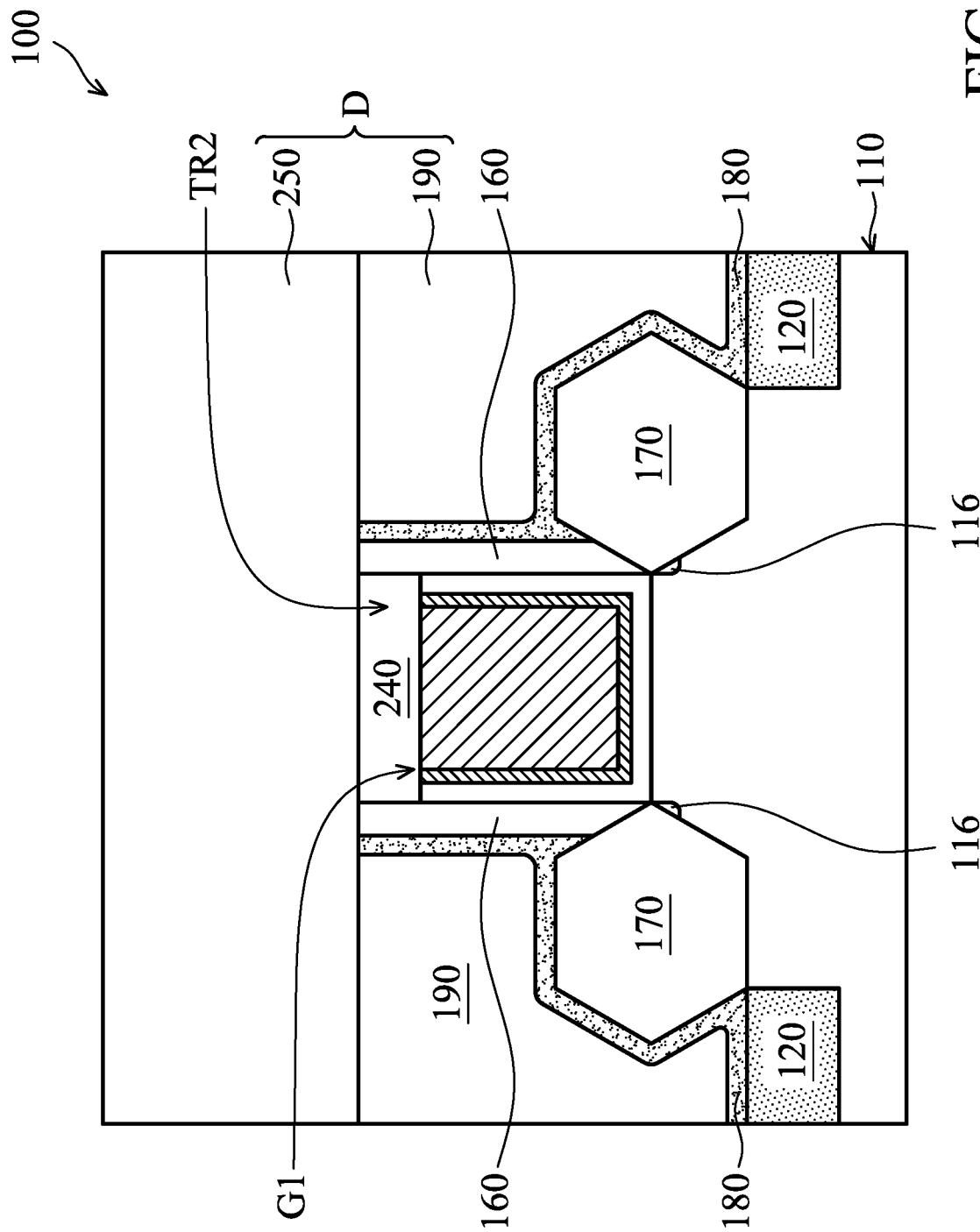

As shown in FIG. 2F, the cap layer 240 outside of the trench TR2 is removed, in accordance with some embodiments. The cap layer 240 is used to protect the gate stack G1 from damage during subsequent processes, in accordance with some embodiments. The cap layer 240 is used to prevent from short circuit between the gate stack G1 and contact structures formed subsequently, in accordance with some embodiments. The removal process of the cap layer 240 outside of the trench TR2 includes a planarization process, in accordance with some embodiments. The planarization process includes a chemical mechanical polishing (CMP) process, in accordance with some embodiments.

As shown in FIG. 2F, a dielectric layer 250 is formed over the dielectric layer 190, the etch stop layer 180, the spacer layer 160, and the cap layer 240, in accordance with some embodiments. The dielectric layers 190 and 250 together form a dielectric structure D, in accordance with some embodiments.

The dielectric layer 250 includes silicon dioxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 250 is formed using a chemical vapor deposition process, a high-density plasma chemical vapor deposition process, a spin-on process, a sputtering process, or a combination thereof, in accordance with some embodiments.

Figure 2G:
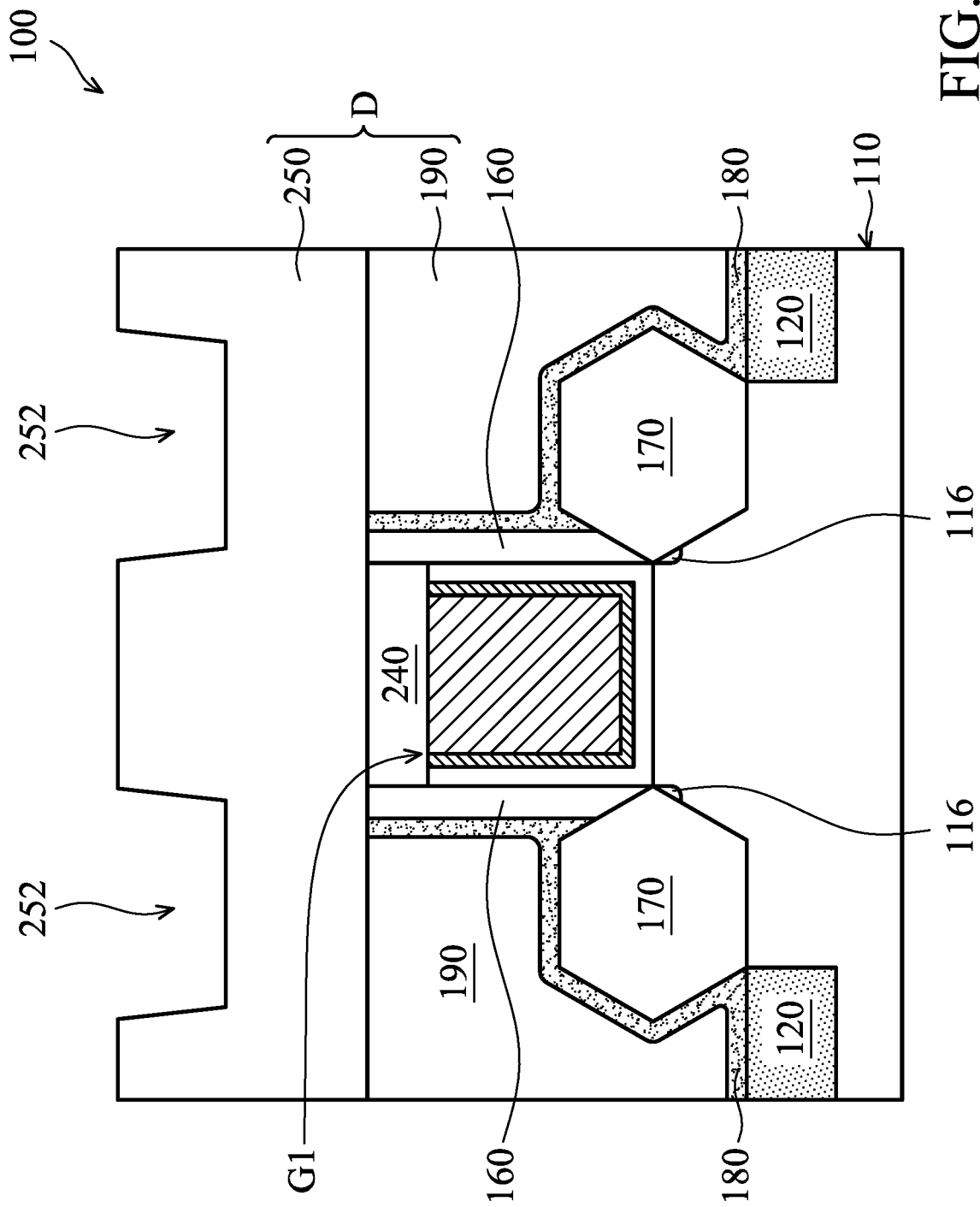

As shown in FIG. 2G, portions of the dielectric layer 250 are removed to form recesses 252 in the dielectric layer 250, in accordance with some embodiments. The recesses 252 are respectively directly over the source/drain structures 170, in accordance with some embodiments. The recesses 252 do not pass through the dielectric structure D, in accordance with some embodiments. The recesses 252 do not pass through the dielectric layer 250, in accordance with some embodiments. The portions of the dielectric layer 250 are removed using an etching process, such as a dry etching process, in accordance with some embodiments.

Figure 2H:
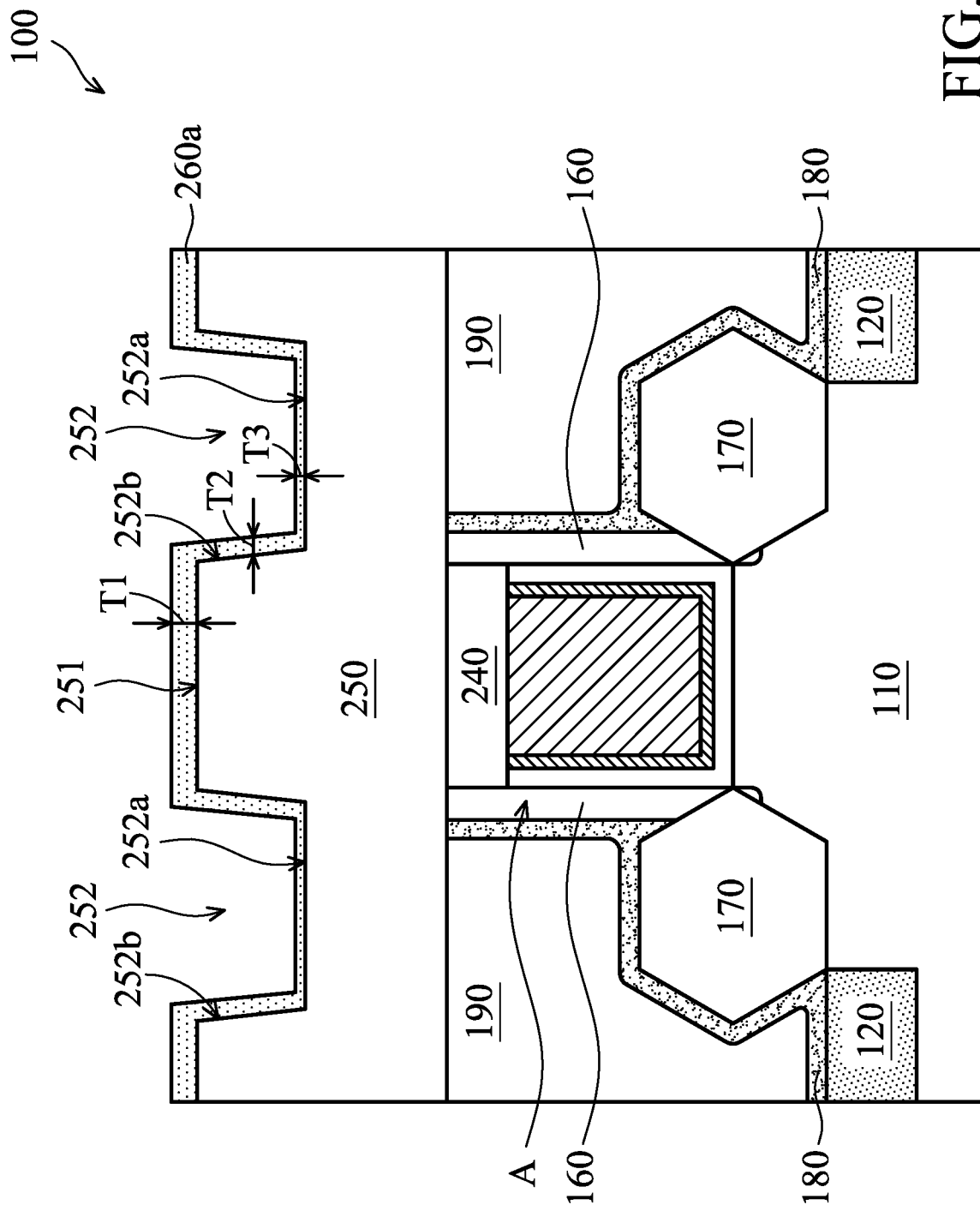

As shown in FIG. 2H, a barrier material layer 260a is formed over the dielectric layer 250, in accordance with some embodiments. The barrier material layer 260a covers bottom surfaces 252a and inner walls 252b of the recesses 252, in accordance with some embodiments. The barrier material layer 260a further covers a top surface 251 of the dielectric layer 250, in accordance with some embodiments.

The barrier material layer 260a over the top surface 251 has a thickness T1, in accordance with some embodiments. The barrier material layer 260a over the inner wall 252b has a thickness T2, in accordance with some embodiments. The barrier material layer 260a over the bottom surface 252a has a thickness T3, in accordance with some embodiments. The thickness T1 is greater than the thickness T2 and is greater than the thickness T3, in accordance with some embodiments.

The barrier material layer 260a is made of a metal-containing material, in accordance with some embodiments. The metal-containing material includes titanium, titanium nitride, cobalt, cobalt nitride, ruthenium, ruthenium nitride, a combination thereof, or another suitable material, in accordance with some embodiments. The barrier material layer 260a and the dielectric layer 250 are made of different materials, in accordance with some embodiments. In some embodiments, the barrier material layer 260a is a multi-layered structure, such as a bi-layered structure. In some embodiments, the barrier material layer 260a is a single-layered structure.

The barrier material layer 260a is formed using a deposition process or an electroplating process, in accordance with some embodiments. The deposition process includes a chemical vapor deposition process, an atomic layer deposition process, or a physical vapor deposition process, such as a sputtering process, in accordance with some embodiments.

Figure 2I:
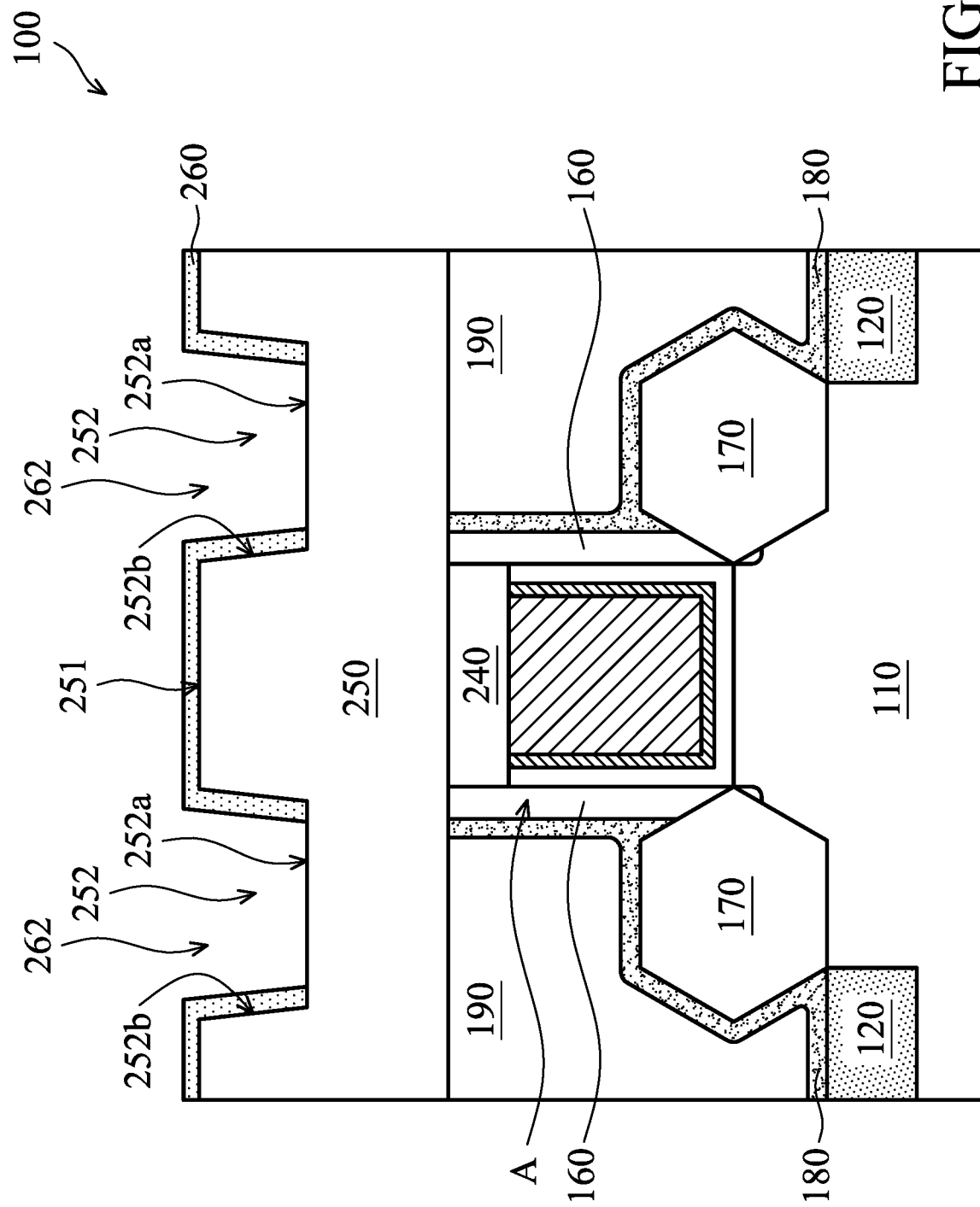

As shown in FIG. 2I, the barrier material layer 260a over the bottom surfaces 252a is removed to form holes 262 in the barrier material layer 260a, in accordance with some embodiments. The holes 262 are respectively formed in the recesses 252, in accordance with some embodiments. The holes 262 expose portions of the dielectric layer 250, in accordance with some embodiments.

The barrier material layer 260a with the holes 262 forms a barrier layer 260, in accordance with some embodiments. The barrier layer 260 is used to prevent metal materials of a contact layer subsequently formed in the holes 262 from diffusing into the dielectric layer 250, in accordance with some embodiments. The barrier layer 260 conformally covers the top surface 251 and the entire inner walls 252b, in accordance with some embodiments.

The barrier material layer 260a over the bottom surfaces 252a is removed using an etching process, such as an anisotropic etching process, in accordance with some embodiments. The anisotropic etching process includes a dry etching process, such as a sputtering etching process, in accordance with some embodiments.

Since the barrier material layer 260a over the bottom surfaces 252a is thinner than the barrier material layer 260a over the top surface 251 (as shown in FIG. 2H), the anisotropic etching process removes the barrier material layer 260a over the bottom surfaces 252a and thins the barrier material layer 260a over the top surface 251 (as shown in FIG. 2I).

In some embodiments, the barrier material layer 260a is formed using a sputtering deposition process, and the barrier material layer 260a over the bottom surfaces 252a is removed using a sputtering etching process. The formation of the barrier material layer 260a and the removal of the barrier material layer 260a over the bottom surfaces 252a are performed in the same chamber, such as a sputtering chamber, in accordance with some embodiments.

Figure 2J:
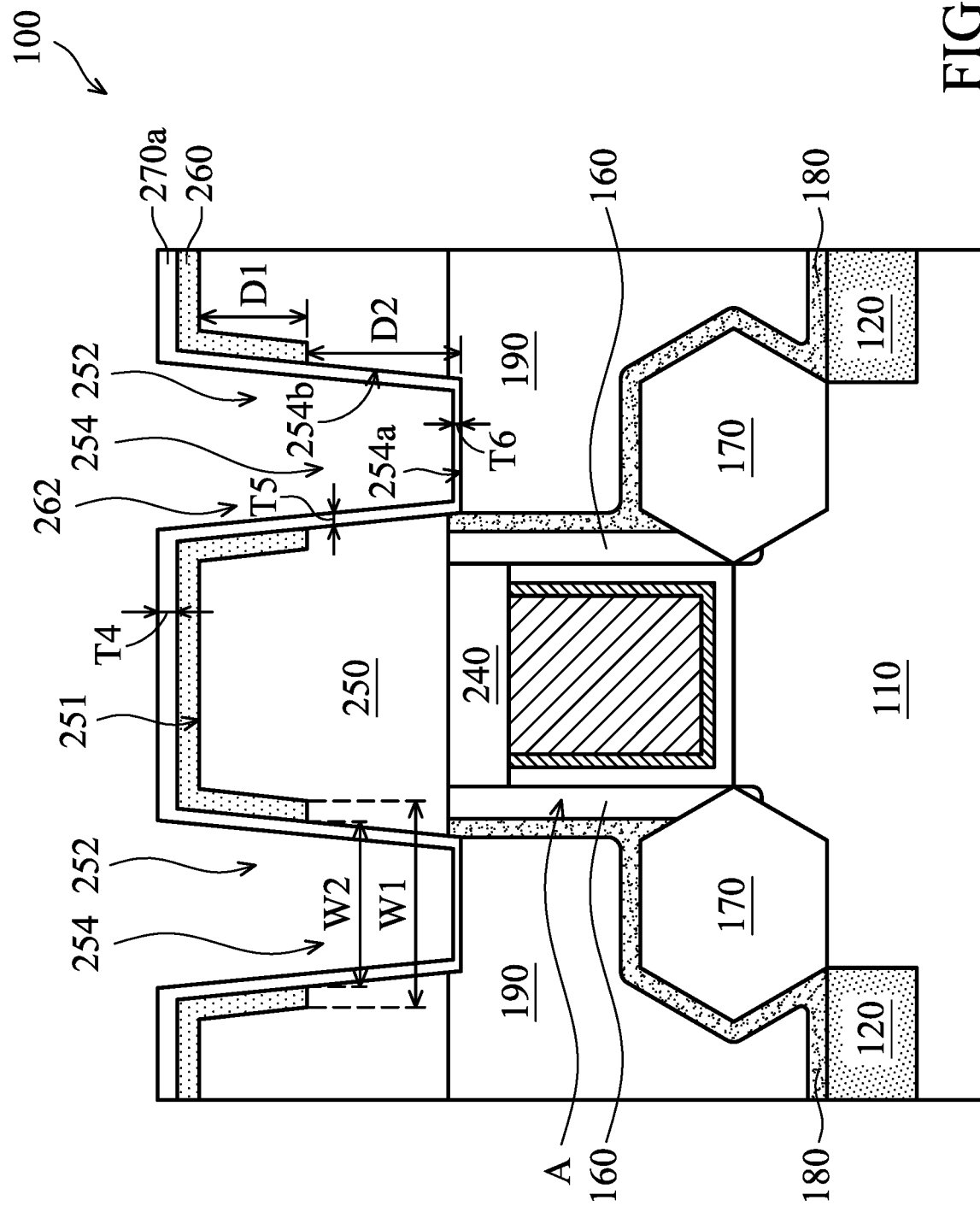

As shown in FIG. 2J, the portions of the dielectric layer 250 exposed by the holes 262 are removed through the holes 262 to form recesses 254 in the dielectric layer 250, in accordance with some embodiments. The recesses 254 extend into the dielectric layer 190, in accordance with some embodiments. The recesses 254 do not pass through the dielectric layer 190, in accordance with some embodiments.

The recess 254 is directly under the corresponding recess 252, in accordance with some embodiments. In some embodiments, a depth D2 of the recess 254 is greater than a depth D1 of the recesses 252. In some embodiments, an average width of the recess 252 is greater than an average width of the recess 254. The term "average width" refers to the average value of the width measurements along the depth of the single recess. In some embodiments, a minimum width W1 of the recess 252 is greater than a maximum width W2 of the recess 254.

The portions of the dielectric layer 250 exposed by the holes 262 are removed using an etching process, such as a dry etching process, in accordance with some embodiments. The barrier layer 260 is used as an etching mask during the etching process, in accordance with some embodiments.

As shown in FIG. 2J, a barrier material layer 270a is formed over the barrier layer 260 and the dielectric layers 190 and 250, in accordance with some embodiments. The barrier material layer 270a covers bottom surfaces 254a and inner walls 254b of the recesses 254, in accordance with some embodiments.

The barrier material layer 270a over the top surface 251 has a thickness T4, in accordance with some embodiments. The barrier material layer 270a over the inner wall 254b has a thickness T5, in accordance with some embodiments. The barrier material layer 270a over the bottom surface 254a has a thickness T6, in accordance with some embodiments. The thickness T4 is greater than the thickness T5 and is greater than the thickness T6, in accordance with some embodiments.

The barrier material layer 270a is made of a metal-containing material, in accordance with some embodiments. The metal-containing material includes titanium, titanium nitride, cobalt, cobalt nitride, ruthenium, ruthenium nitride, a combination thereof, or another suitable material, in accordance with some embodiments. The barrier material layer 270a and the dielectric layer 190 are made of different materials, in accordance with some embodiments. In some embodiments, the barrier material layer 270a is a multi-layered structure, such as a bi-layered structure. In some embodiments, the barrier material layer 270a is a single-layered structure.

The barrier material layer 270a is formed using a deposition process or an electroplating process, in accordance with some embodiments. The deposition process includes a chemical vapor deposition process, an atomic layer deposition process, or a physical vapor deposition process, such as a sputtering process, in accordance with some embodiments.

Figure 2K:
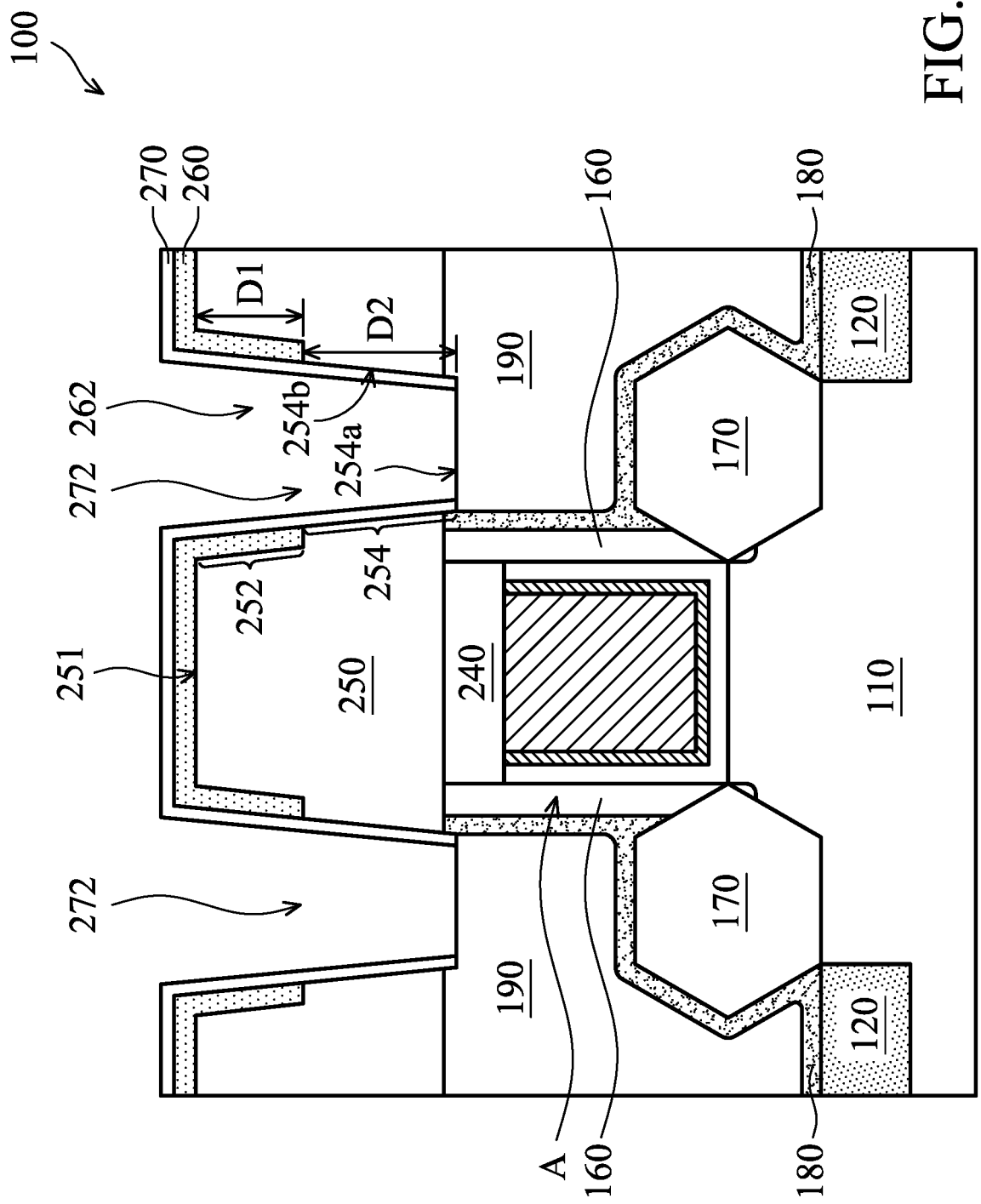

As shown in FIG. 2K, the barrier material layer 270a over the bottom surfaces 254a is removed to form holes 272 in the barrier material layer 270a, in accordance with some embodiments. Each hole 272 is in the corresponding recesses 252 and 254, in accordance with some embodiments. The holes 272 expose portions of the dielectric layer 190, in accordance with some embodiments. Each hole 272 is in the corresponding hole 262, in accordance with some embodiments.

The barrier material layer 270a with the holes 272 forms a barrier layer 270, in accordance with some embodiments. The barrier layer 270 is in direct contact with the dielectric layer 250, in accordance with some embodiments. The barrier layer 270 is used to prevent metal materials of a contact layer subsequently formed in the holes 272 from diffusing into the dielectric layers 190 and 250, in accordance with some embodiments. The barrier layer 270 conformally covers the barrier layer 260 and the entire inner walls 254b, in accordance with some embodiments.

The barrier material layer 270a over the bottom surfaces 254a is removed using an etching process, such as an anisotropic etching process, in accordance with some embodiments. The anisotropic etching process includes a dry etching process, such as a sputtering etching process, in accordance with some embodiments.

Since the barrier material layer 270a over the bottom surfaces 254a is thinner than the barrier material layer 270a over the top surface 251 (as shown in FIG. 2J), the anisotropic etching process removes the barrier material layer 270a over the bottom surfaces 254a and thins the barrier material layer 270a over the top surface 251 (as shown in FIG. 2K), in accordance with some embodiments.

In some embodiments, the barrier material layer 270a is formed using a sputtering deposition process, and the barrier material layer 270a over the bottom surfaces 254a is removed using a sputtering etching process. The formation of the barrier material layer 270a and the removal of the barrier material layer 270a over the bottom surfaces 254a are performed in the same chamber, such as a sputtering chamber, in accordance with some embodiments.

Figure 2L:
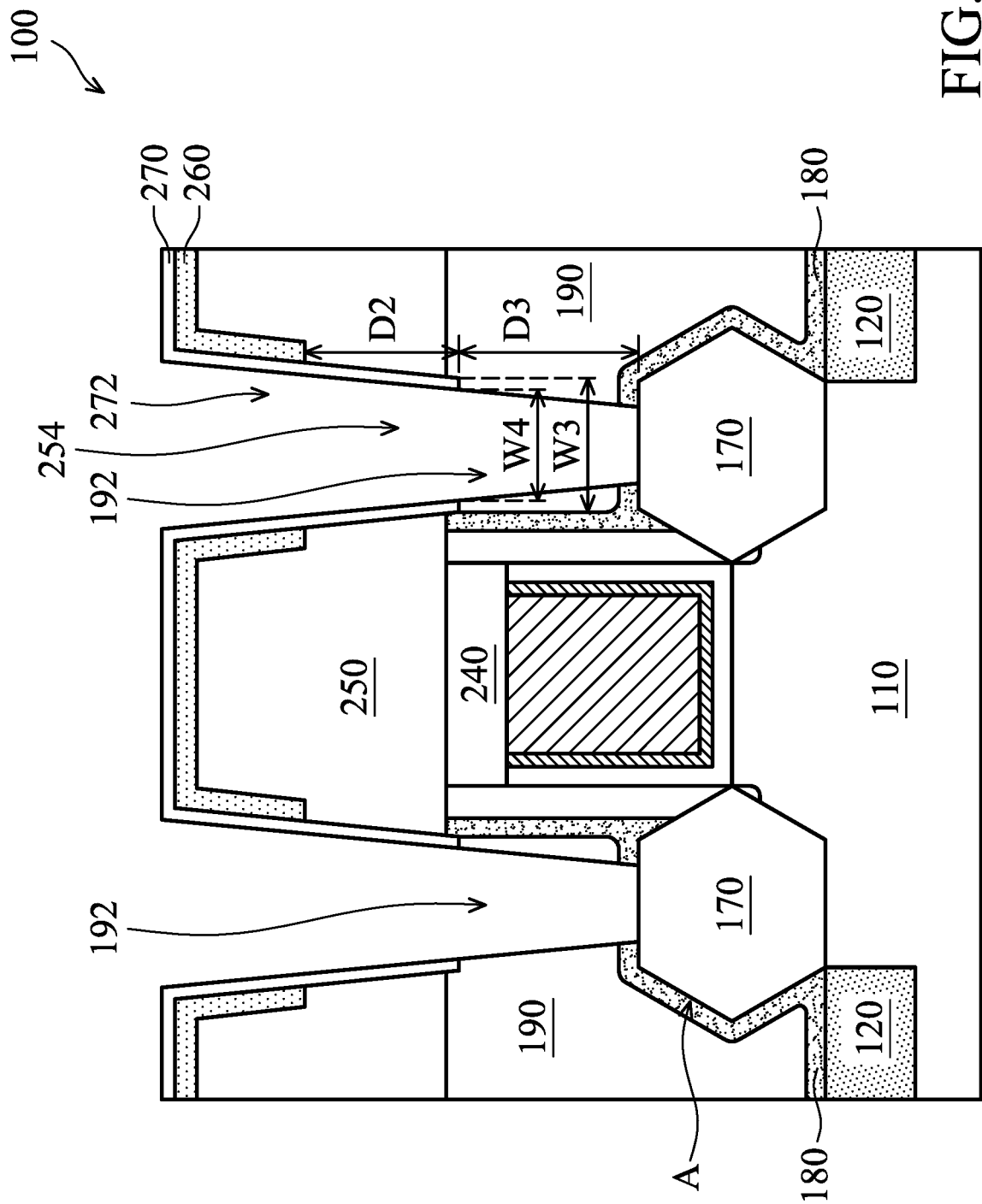

As shown in FIG. 2L, the portions of the dielectric layer 190 exposed by the holes 272 are removed through the holes 272 to form recesses 192 in the dielectric layer 190, in accordance with some embodiments. The recesses 192 pass through the dielectric layer 190 and expose the source/drain structures 170, in accordance with some embodiments.

The recess 192 is directly under the corresponding recess 254, in accordance with some embodiments. In some embodiments, an average width of the recess 254 is greater than an average width of the recess 192. In some embodiments, a minimum width W3 of the recess 254 is greater than a maximum width W4 of the recess 192. In some embodiments, a depth D3 of the recess 192 is greater than a depth D2 of the recesses 254. The portions of the dielectric layer 190 exposed by the holes 272 are removed using an etching process, such as a dry etching process, in accordance with some embodiments. The barrier layer 270 is used as an etching mask during the etching process, in accordance with some embodiments.

Figure 2M:
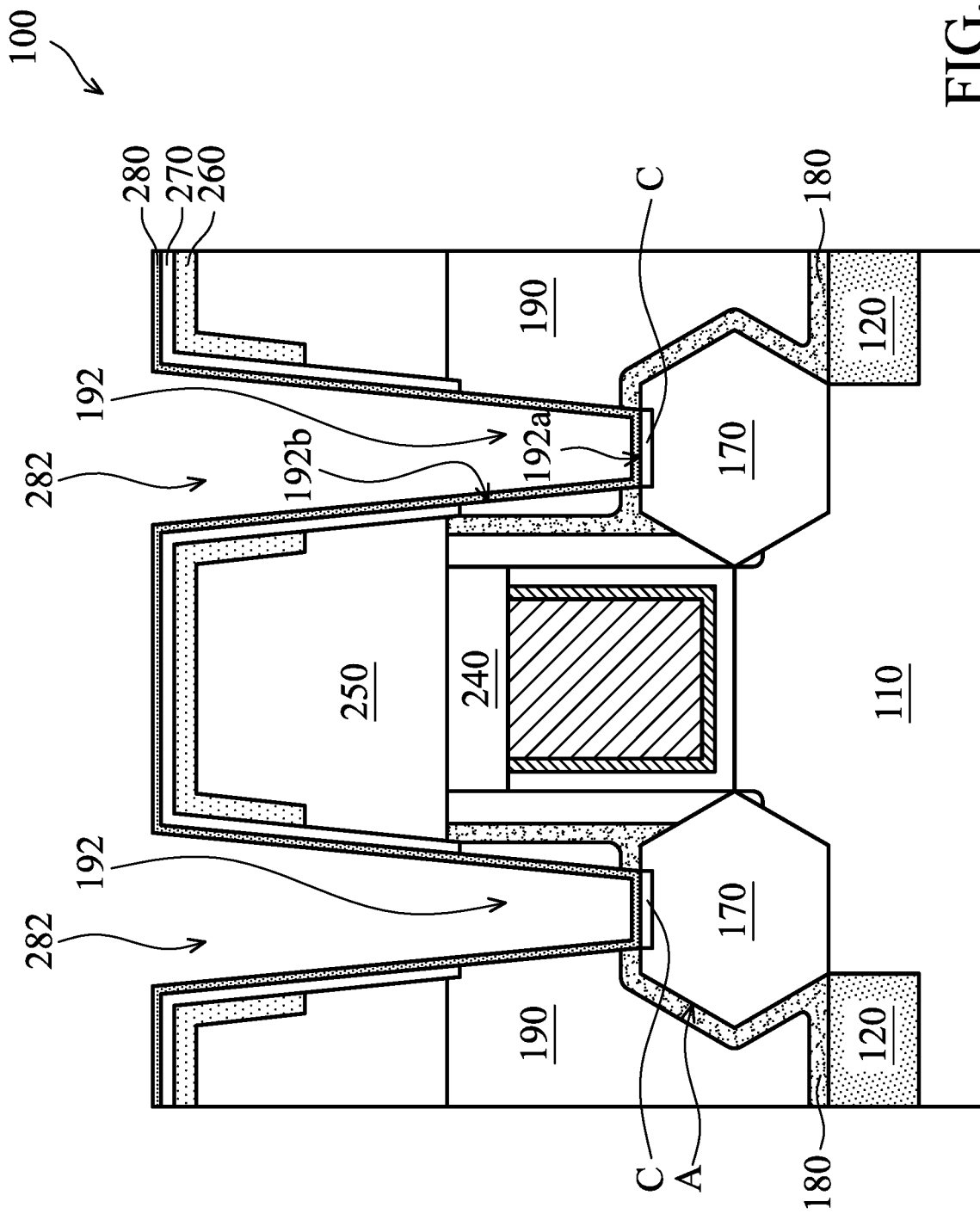

As shown in FIG. 2M, a barrier layer 280 is formed over the barrier layer 270 and the dielectric layer 190, in accordance with some embodiments. The barrier layer 280 covers bottom surfaces 192a and inner walls 192b of the recesses 192, in accordance with some embodiments. The barrier layer 280 conformally covers the barrier layer 270, the entire inner walls 192b, and the entire bottom surfaces 192a, in accordance with some embodiments.

The barrier layer 280 has openings 282, in accordance with some embodiments. The openings 282 are also referred to as holes, in accordance with some embodiments. The barrier layer 280 is used to prevent metal materials of a contact layer subsequently formed in the openings 282 from diffusing into the dielectric layer 190 and the source/drain structures 170, in accordance with some embodiments.

The barrier layer 280 is made of a metal-containing material, in accordance with some embodiments. The metal-containing material includes titanium, titanium nitride, cobalt, cobalt nitride, ruthenium, ruthenium nitride, a combination thereof, or another suitable material, in accordance with some embodiments. In some embodiments, the barrier layer 280 is a multi-layered structure, such as a bi-layered structure. In some embodiments, the barrier layer 280 is a single-layered structure.

The barrier layer 280 is formed using a deposition process or an electroplating process, in accordance with some embodiments. The deposition process includes a chemical vapor deposition process, an atomic layer deposition process, or a physical vapor deposition process, such as a sputtering process, in accordance with some embodiments.

In some embodiments, as shown in FIG. 2M, a metal silicide layer C is formed over the source/drain structures 170. The metal silicide layer C is made of TiSi$_2$ (titanium disilicide), CoSi2, RuSi, or another suitable conductive material. The metal silicide layer C may be formed before or after the barrier layer 280 is formed. The formation of the metal silicide layer C will be described in detail in the following embodiments of FIGS. 3A-3B and 4A-4B.

Figure 2N:
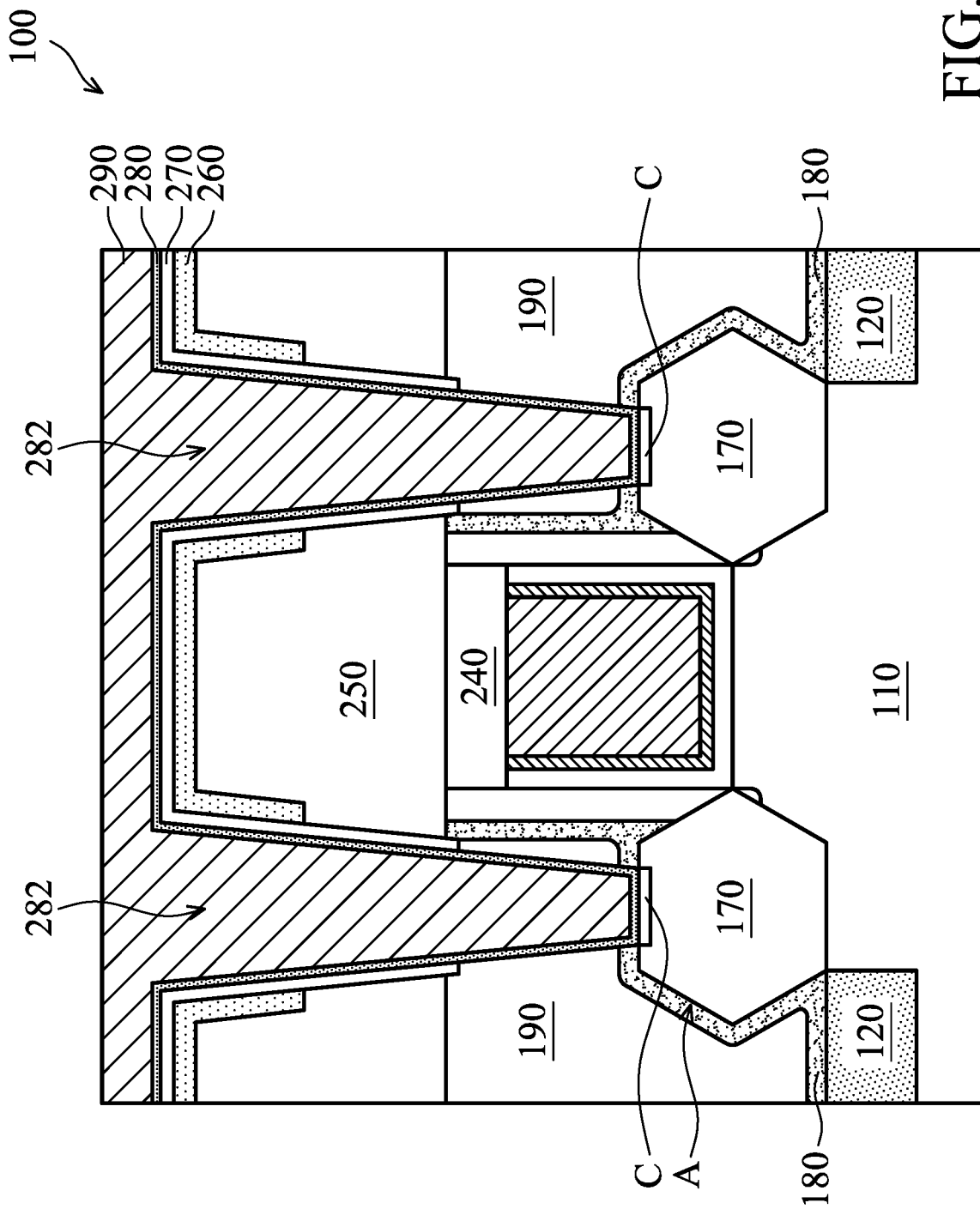

As shown in FIG. 2N, a contact layer 290 is formed over the barrier layer 280, in accordance with some embodiments. The openings 282 are filled with the contact layer 290, in accordance with some embodiments. In some embodiments, a material of the contact layer 290 is different from materials of the barrier layers 260, 270, and 280. The contact layer 290 is formed using a physical vapor deposition process, a plating process, another suitable method, or a combination thereof, in accordance with some embodiments. In some embodiments, the contact layer 290 is formed using different methods. That is, the contact layer 290 is formed in a sequential manner.

Figure 2O:
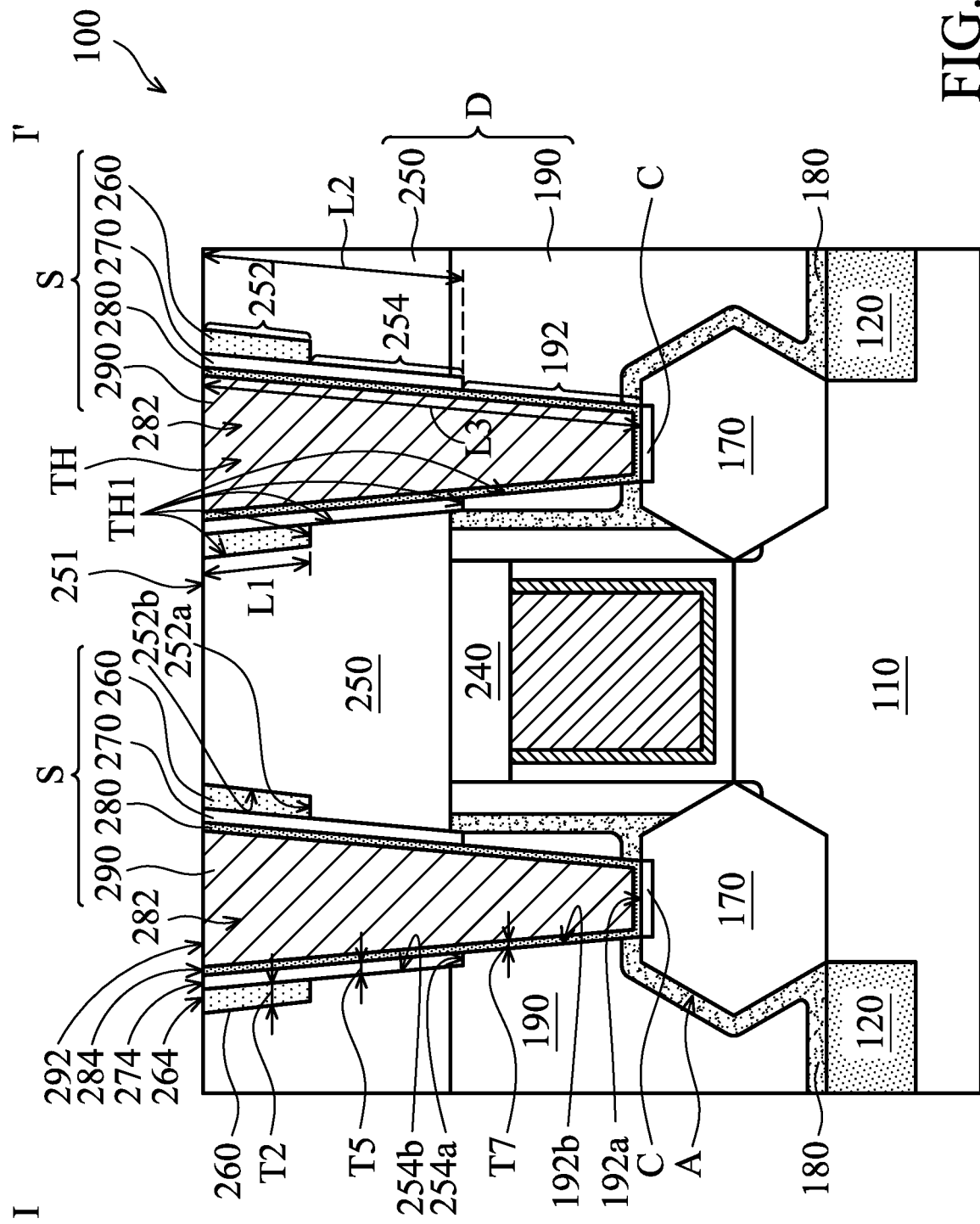
Figures 1, 2O:
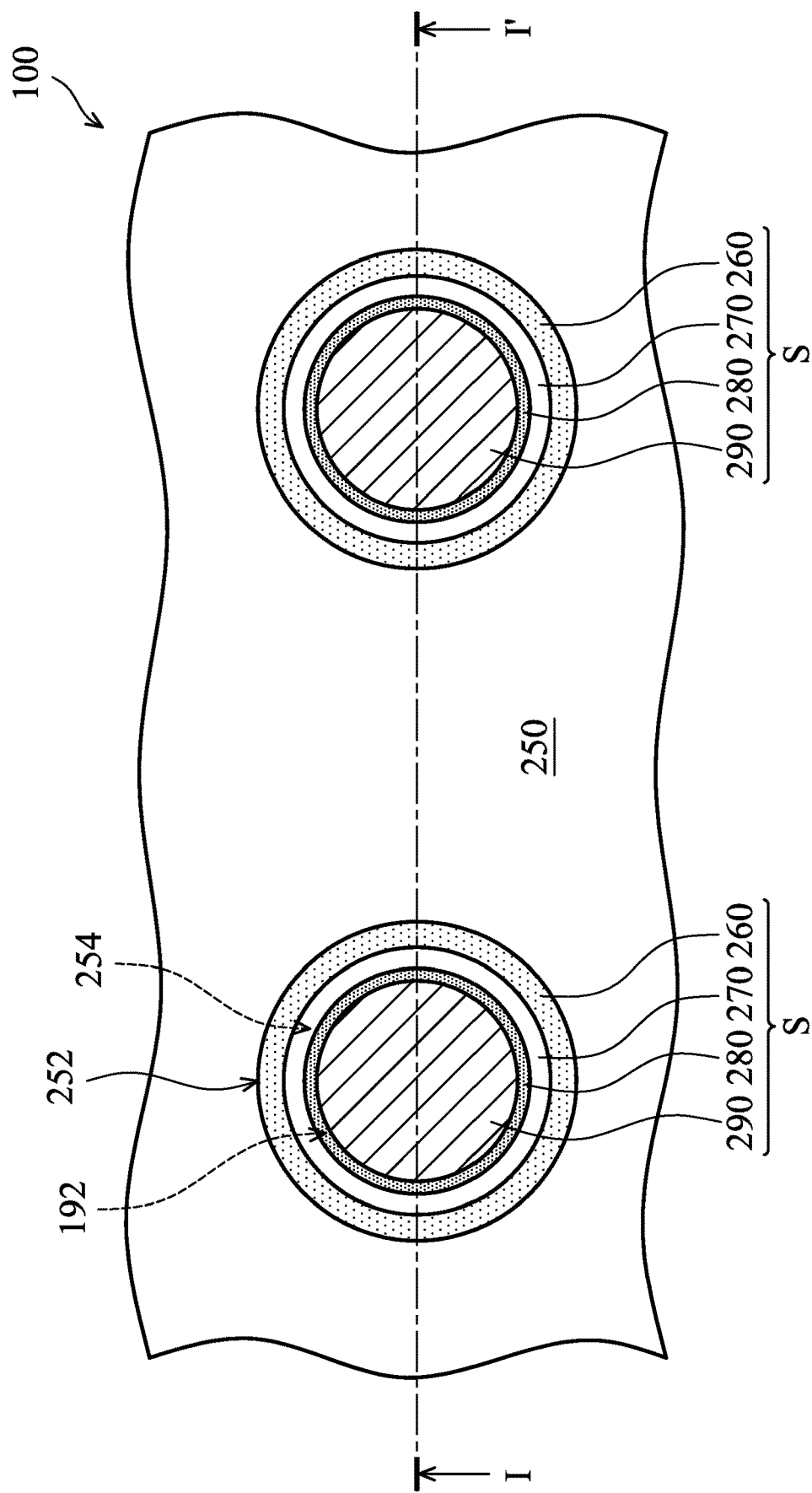

As shown in FIG. 2O, the contact layer 290 and the barrier layers 260, 270, and 280 outside of the recesses 252, 254 and 192 are removed, in accordance with some embodiments. The removal process includes a planarization process, such as a chemical mechanical process, in accordance with some embodiments.

After the removal process, top surfaces 251, 264, 274, 284, and 292 of the dielectric layer 250, the barrier layers 260, 270, and 280, and the contact layer 290 are substantially coplanar or substantially aligned with each other, in accordance with some embodiments. The term "substantially coplanar" in the application may include small deviations from coplanar geometries.

The contact layer 290, the barrier layers 260, 270, and 280 remaining in the recesses 252, 254 and 192 over the same source/drain structure 170 together form a contact structure S, in accordance with some embodiments. The contact structure S is positioned over and is electrically connected to the source/drain structure 170 thereunder, in accordance with some embodiments. The contact structures S pass through the dielectric layers 190 and 250 (or the dielectric structure D), in accordance with some embodiments.

The thickness T2 of the barrier layer 260 is greater than the thickness T5 of the barrier layer 270, in accordance with some embodiments. The thickness T5 of the barrier layer 270 is greater than the thickness T7 of the barrier layer 280, in accordance with some embodiments.

The distance between the recesses 252 is less than the distance between the recesses 254, and therefore the dielectric layer 250 between the recesses 252 is thinner than the dielectric layer 250 between the recesses 254, in accordance with some embodiments. The thicker barrier layer 260 is able to prevent short circuit between the contact structures S resulting from that the metal materials of the contact layer 290 diffuse through the thinner dielectric layer 250 between the recesses 252, in accordance with some embodiments.

Since the material of the barrier layer 280 may have an electrical resistance higher than the material of the contact layer 290, the thinner barrier layer 280 may provide a lower electrical resistance between the contact layer 290 and the source/drain structure 170 thereunder.

FIG. 2O-1 is a top view of the semiconductor device structure 100 of FIG. 2O, in accordance with some embodiments. FIG. 2O is a cross-sectional view illustrating the semiconductor device structure 100 along a sectional line I-I' in FIG. 2O-1, in accordance with some embodiments.

As shown in FIGS. 2O and 2O-1, in one of the contact structures S, the barrier layer 280 continuously surrounds the entire contact layer 290, in accordance with some embodiments. The barrier layer 270 continuously surrounds an upper portion of the barrier layer 280, in accordance with some embodiments. In some embodiments, a lower portion of the barrier layer 280 is in direct contact with the dielectric layer 190. The barrier layer 260 continuously surrounds an upper portion of the barrier layer 270, in accordance with some embodiments. In some embodiments, a lower portion of the barrier layer 270 is in direct contact with the dielectric layers 190 and 250.

Each contact structure S is directly over and is electrically connected to the source/drain structure 170 thereunder, in accordance with some embodiments. The barrier layer 280 is between the contact layer 290 and the source/drain structure 170, in accordance with some embodiments. The barrier layer 280 separates the contact layer 290 from the source/drain structure 170, the dielectric layers 190 and 250, the barrier layers 260 and 270, in accordance with some embodiments.

In some embodiments, an electrical resistance of the barrier layer 280 is less than an electrical resistance of the barrier layer 270. In some embodiments, the electrical resistance of the barrier layer 270 is less than an electrical resistance of the barrier layer 260.

Since metal nitride has a good barrier ability of diffusion of metal, the barrier layer 260 contains a higher ratio of metal nitride to other materials in the barrier layer 260 than the barrier layers 270 and 280, in accordance with some embodiments. Since metal nitride may have a high electrical resistance, the electrical resistance of the barrier layer 260 may be greater than the electrical resistance of the barrier layers 270 and 280.

Since the electrical resistance of the barrier layer 280 may affect the electrical resistance between the contact layer 290 and the source/drain structure 170, the barrier layer 280 may contain barrier materials with good conductivity (e.g., Co, CoN, Ru, and/or RuN) or contain a low ratio of metal nitride to other materials in the barrier layer 280. Therefore, the electrical resistance of the barrier layer 280 may be less than the electrical resistance of the barrier layers 270 and 260.

The barrier layer 260 has a length L1, in accordance with some embodiments. The barrier layer 270 has a length L2, in accordance with some embodiments. The barrier layer 280 has a length L3, in accordance with some embodiments. The length L3 is greater than the length L2, in accordance with some embodiments. The length L2 is greater than the length L1, in accordance with some embodiments.

As shown in FIGS. 2O and 2O-1, the recesses 252, 254, and 192 together form a through hole TH passing through the dielectric layers 190 and 250, in accordance with some embodiments. The through hole TH has an inner wall TH1, in accordance with some embodiments. The inner wall TH1 includes the inner walls 252b, 254b, and 192b and the bottom surfaces 252a and 254a, in accordance with some embodiments. The inner walls 252b, 254b, and 192b are discontinuous, in accordance with some embodiments. The inner wall TH1 is a step-like inner wall, in accordance with some embodiments.

The through hole TH is formed using three etching processes, which use the barrier layers 260 and 270 as etching masks. Therefore, the barrier layers 260 and 270 may protect the inner wall TH1 thereunder from being etched during the etching processes. As a result, the barrier layers 260 and 270 may prevent the width of the through hole TH from being undesirably enlarged by the etching processes. That is, the barrier layers 260 and 270 may maintain the critical dimension (e.g., the width) of the through hole TH.

If an etching process is performed to form a recess with a high aspect ratio, the recess with the high aspect ratio may tend to have a significant neck profile resulting from enlarging the width of the recess during the etching process. The term "neck profile" refers to the shape of the recess with a narrow opening in the cross section.

The through hole TH is formed by forming the recesses 252, 254, and 192 using three etching processes. Each of the recesses 252, 254, and 192 has an aspect ratio less than that of the through hole TH. Therefore, each of the recesses 252, 254, and 192 may have no neck profile or a slightly neck profile. As a result, each of the barrier layers 260, 270, and 280 may substantially conformally, uniformly, and continuously deposited over the inner wall TH1. Therefore, the yield of the barrier layers 260, 270, and 280 is improved.

Figures 2, 2O:
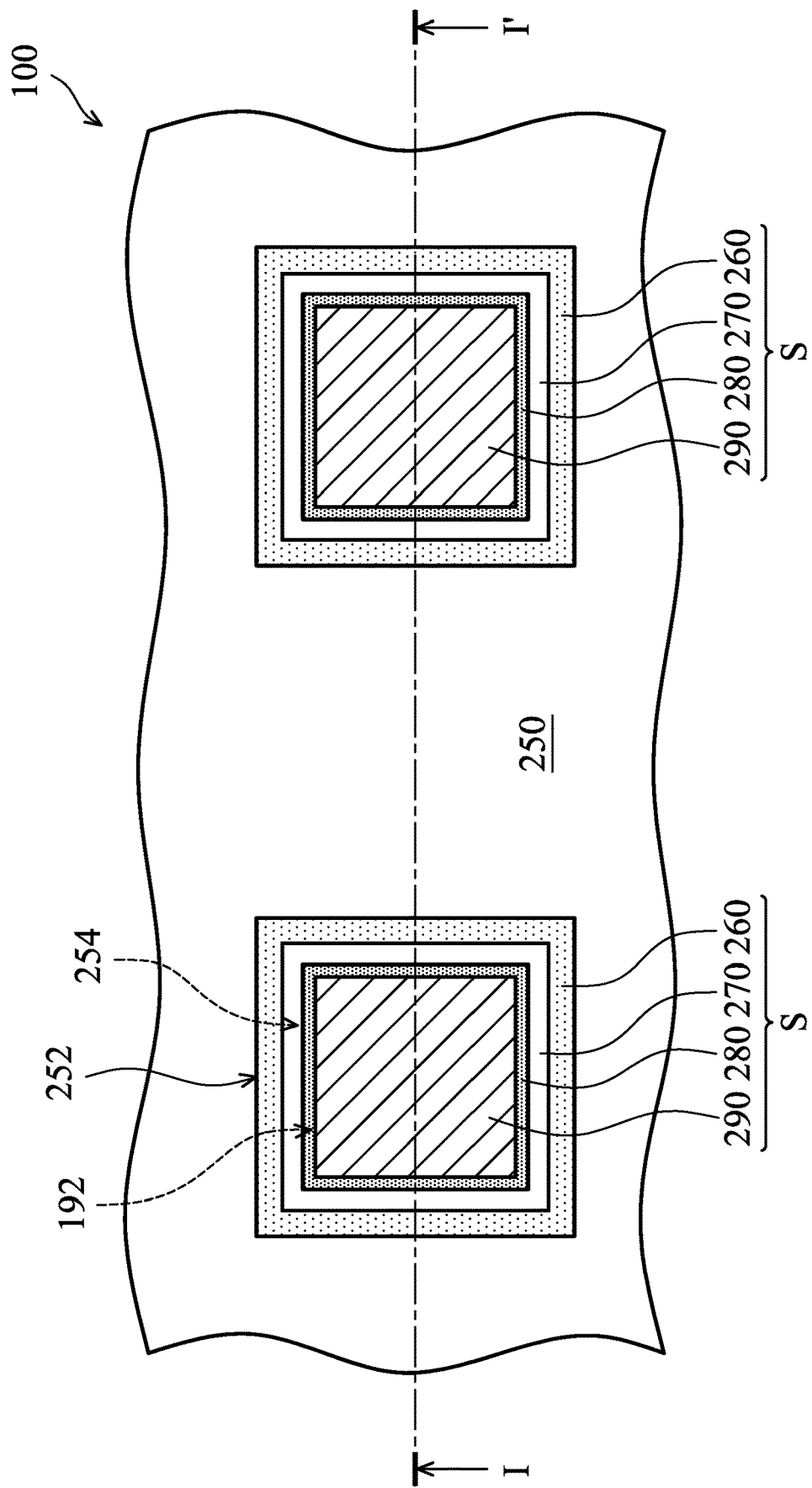

As shown in FIG. 2O-1, the recesses 252, 254, and 192 have a substantially circular shape, in accordance with some embodiments. In some other embodiments, as shown in FIG. 2O-2, the recesses 252, 254, and 192 have a non-circular shape, in accordance with some embodiments. For example, the recesses 252, 254, and 192 have a rectangular shape, a rounded rectangular shape or an oval shape, in accordance with some embodiments.

Figure 3A:
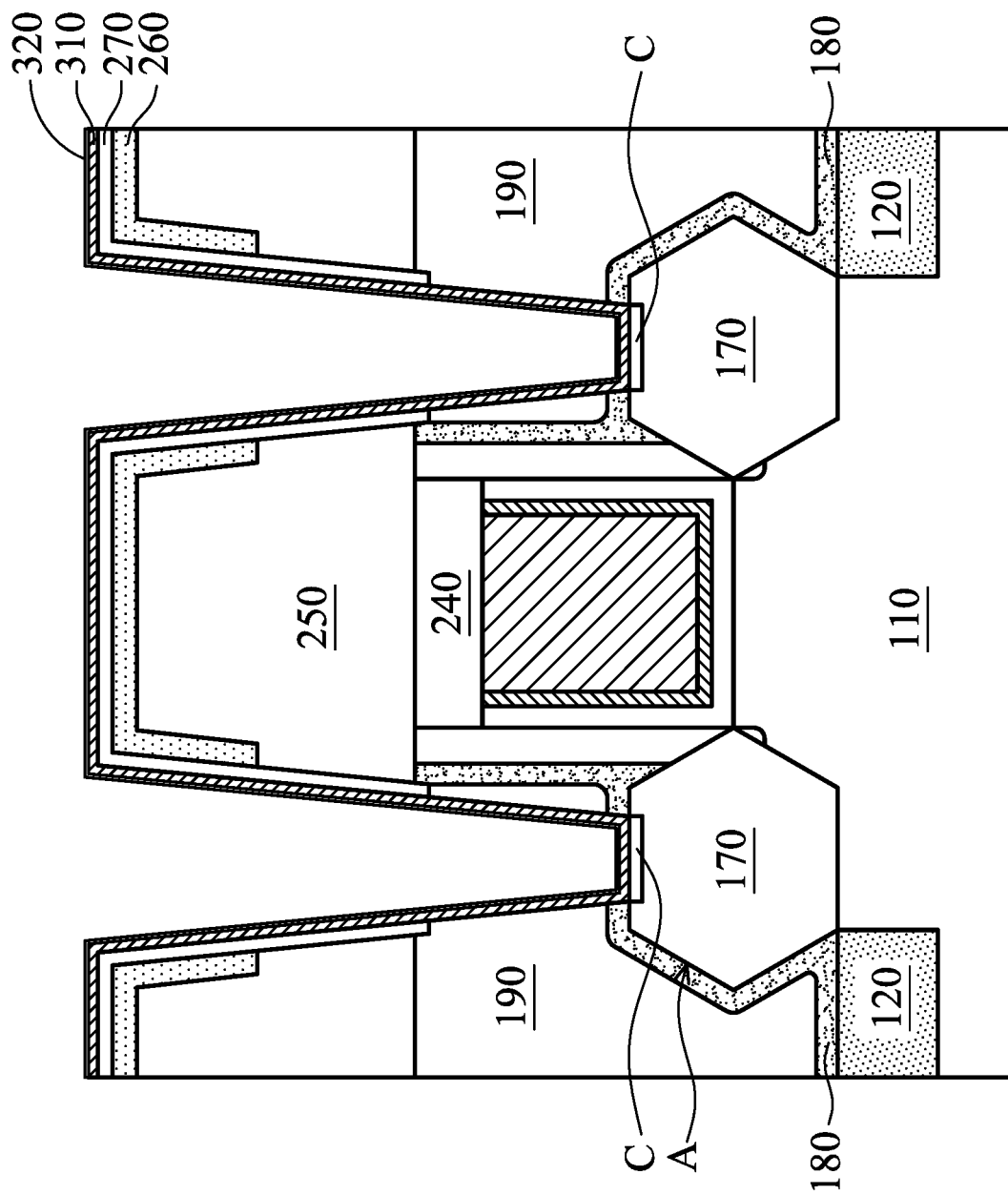
FIGS. 3A-3B are cross-sectional views of various stages of a process for forming a semiconductor device structure, in accordance with some embodiments.
Figure 3B:
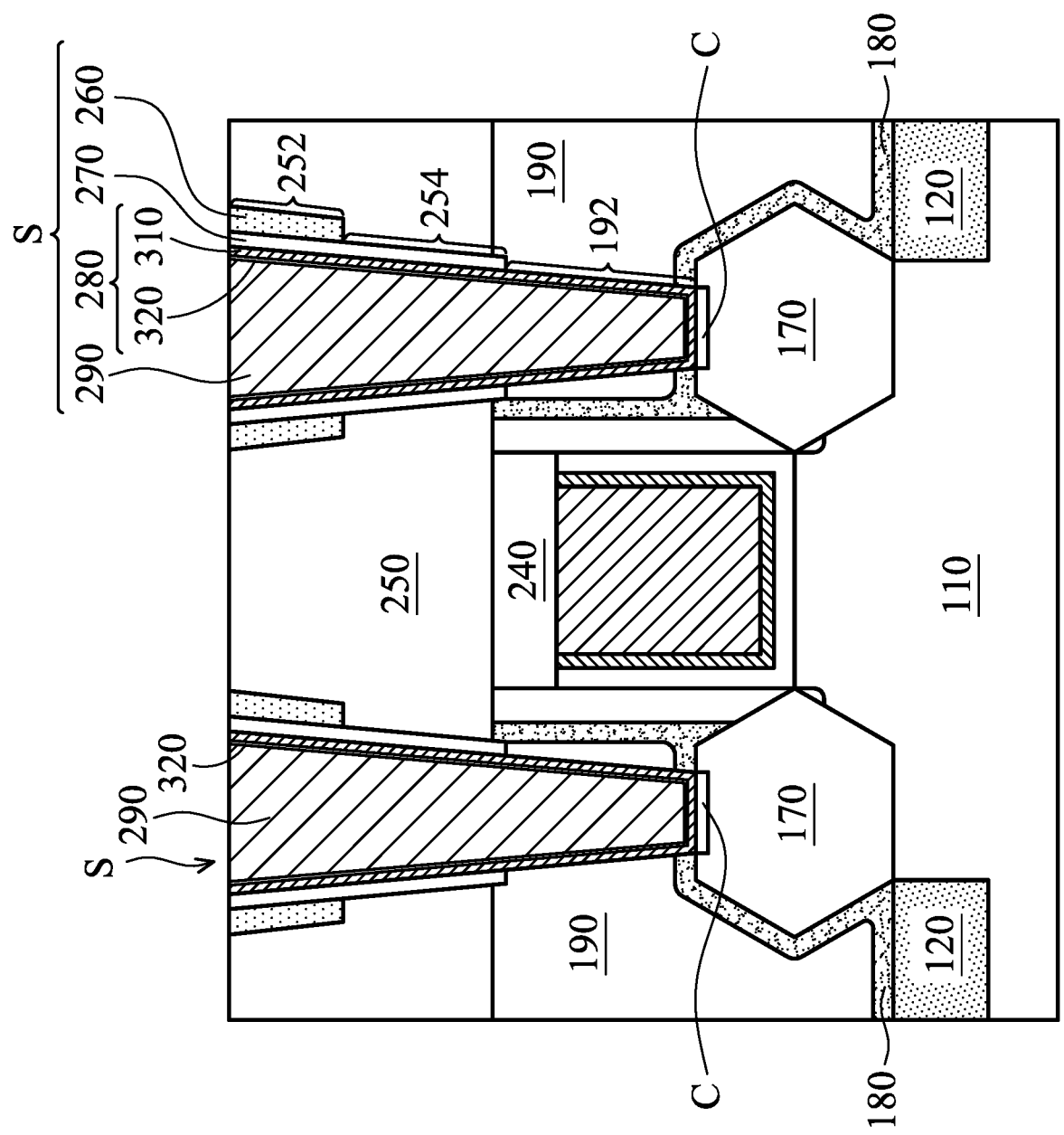

FIGS. 3A-3B are cross-sectional views of various stages of a process for forming a semiconductor device structure, in accordance with some embodiments. As shown in FIG. 3A, after the step of FIG. 2L, a metal layer 310 is formed over the barrier layer 270, the dielectric layer 190, and the source/drain structures 170, in accordance with some embodiments. The metal layer 310 is in direct contact with the barrier layer 270, the dielectric layer 190, and the source/drain structures 170, in accordance with some embodiments.

The metal layer 310 is made of Ti, Co, Ru, or another suitable metal material. The metal layer 310 is formed using a deposition process, such as a physical vapor deposition process, a plating process, another suitable method, or a combination thereof, in accordance with some embodiments.

As shown in FIG. 3A, an annealing process is performed on the metal layer 310 and the source/drain structures 170 to react the metal layer 310 with the source/drain structures 170 so as to form metal silicide layers C between the metal layer 310 and the source/drain structures 170, in accordance with some embodiments. The metal silicide layers C include $TiSi_2$ (titanium disilicide), CoSi2, or RuSi, in accordance with some embodiments.

As shown in FIG. 3A, a metal nitride layer 320 is formed over the metal layer 310, in accordance with some embodiments. In some embodiments, the metal silicide layers C are formed before the metal nitride layer 320 is formed. In some other embodiments, the metal silicide layers C are formed after the metal nitride layer 320 is formed.

The metal nitride layer 320 is formed by performing a nitridation process on the metal layer 310 to nitridize a top portion of the metal layer 310, in accordance with some embodiments. Therefore, the metal nitride layer 320 and the metal layer 310 include the same metal material, such as Ti, Co, or Ru, in accordance with some embodiments. In some other embodiments, the metal nitride layer 320 is formed by performing a deposition process on the metal layer 310.

As shown in FIG. 3B, steps of FIGS. 2N-2O are performed, in accordance with some embodiments. The metal layer 310 and the metal nitride layer 320 together form a barrier layer 280, in accordance with some embodiments. The contact layer 290, the barrier layers 260, 270, and 280 remaining in the recesses 252, 254 and 192 over the same source/drain structure 170 together form a contact structure S, in accordance with some embodiments.

The metal layer 310 is in direct contact with the metal silicide layers C, in accordance with some embodiments. The metal nitride layer 320 is in direct contact with the contact layer 290, in accordance with some embodiments. The contact layer 290 is made of tungsten (W), in accordance with some embodiments. The metal nitride layer 320 separates the contact layer 290 from the metal layer 310 to prevent tungsten in the contact layer 290 from reacting with the metal layer 310, in accordance with some embodiments.

Figure 4A:
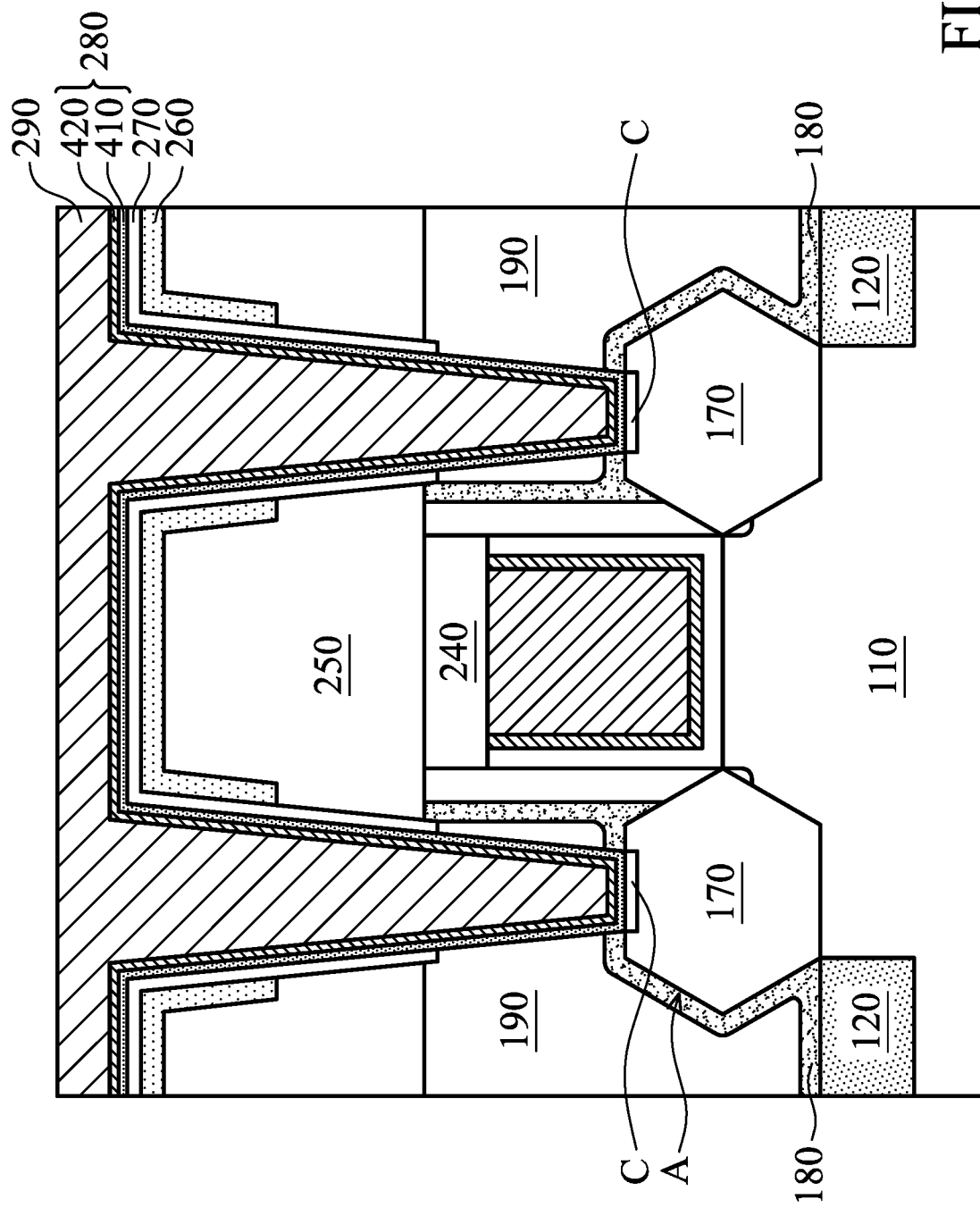
FIGS. 4A-4B are cross-sectional views of various stages of a process for forming a semiconductor device structure, in accordance with some embodiments.
Figure 4B:
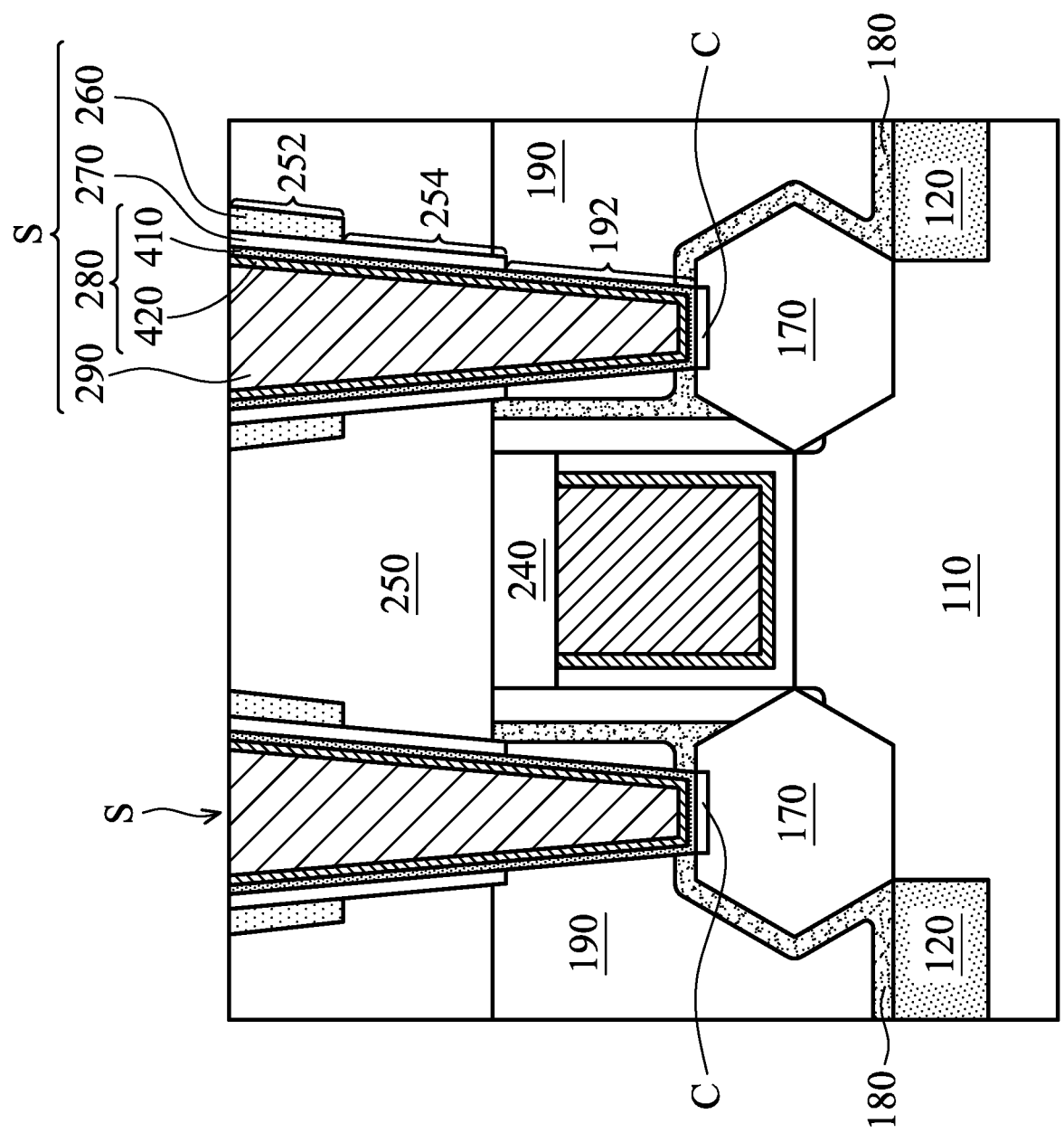

FIGS. 4A-4B are cross-sectional views of various stages of a process for forming a semiconductor device structure, in accordance with some embodiments. As shown in FIG. 4A, after the step of FIG. 2L, metal silicide layers C are formed over the source/drain structures 170, in accordance with some embodiments. The formation of the metal silicide layers C includes depositing a metal layer (not shown) over the source/drain structures 170; annealing the metal layer and the source/drain structures 170 to form the metal silicide layers C between the metal layer and the source/drain structures 170; and removing the metal layer.

As shown in FIG. 4A, a metal nitride film 410 is formed over the barrier layer 270, the dielectric layer 190, and the metal silicide layers C, in accordance with some embodiments. The metal nitride film 410 is in direct contact with the barrier layer 270, the dielectric layer 190, and the metal silicide layers C, in accordance with some embodiments. The metal nitride film 410 is made of titanium nitride, cobalt nitride, ruthenium nitride, a combination thereof, or another suitable material, in accordance with some embodiments.

As shown in FIG. 4A, a metal layer 420 is formed over the metal nitride film 410, in accordance with some embodiments. The metal layer 420 is in direct contact with the metal nitride film 410, in accordance with some embodiments. The metal layer 420 is made of Ti, Ru, or another suitable metal material. The metal layer 420 is formed using a deposition process, such as a physical vapor deposition process, a plating process, another suitable method, or a combination thereof, in accordance with some embodiments.

As shown in FIG. 4A, a contact layer 290 is formed over the metal layer 420, in accordance with some embodiments. The contact layer 290 is made of Cu, Co, and another suitable conductive material, which does not react with the metal layer 420, in accordance with some embodiments. The contact layer 290 is formed using a physical vapor deposition process, a plating process, another suitable method, or a combination thereof, in accordance with some embodiments.

As shown in FIG. 4B, a step of FIG. 2O is performed, in accordance with some embodiments. The metal nitride film 410 and the metal layer 420 together form a barrier layer 280, in accordance with some embodiments. The contact layer 290, the barrier layers 260, 270, and 280 remaining in the recesses 252, 254 and 192 over the same source/drain structure 170 together form a contact structure S, in accordance with some embodiments. In some embodiments, the barrier layers 260 and 270 are metal nitride films. The barrier layer 260 is thicker than the barrier layer 270, and the barrier layer 270 is thicker than the metal nitride film 410 of the barrier layer 280, in accordance with some embodiments. The barrier layer 280 of FIG. 2O may be replaced by the barrier layer 280 of FIG. 3B or the barrier layer 280 of FIG. 4B.

Figure 5:
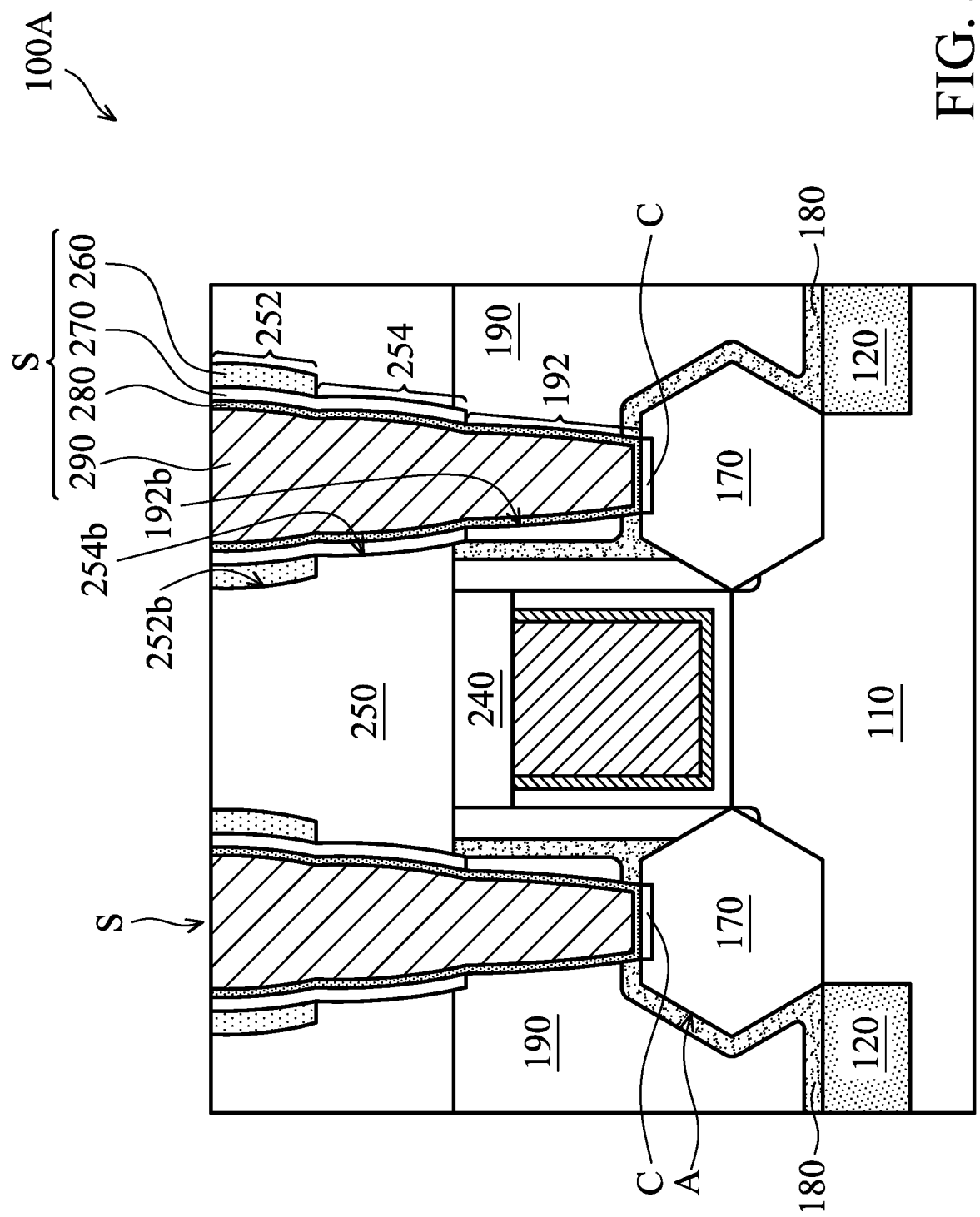
FIG. 5 is a cross-sectional view illustrating a semiconductor device structure, in accordance with some embodiments.

FIG. 5 is a cross-sectional view illustrating a semiconductor device structure 100A, in accordance with some embodiments. As shown in FIG. 5, the semiconductor device structure 100A is similar to the semiconductor device structure 100 of FIG. 2O, except that the inner walls 252b, 254b, and 192b of the recesses 252, 254, and 192 of the semiconductor device structure 100A are curved inner walls, in accordance with some embodiments. The barrier layers 260, 270, and 280 conformally covers the inner walls 252b, 254b, and 192b, in accordance with some embodiments. The inner walls 252b, 254b, and 192b are discontinuous, in accordance with some embodiments.

Figure 6:
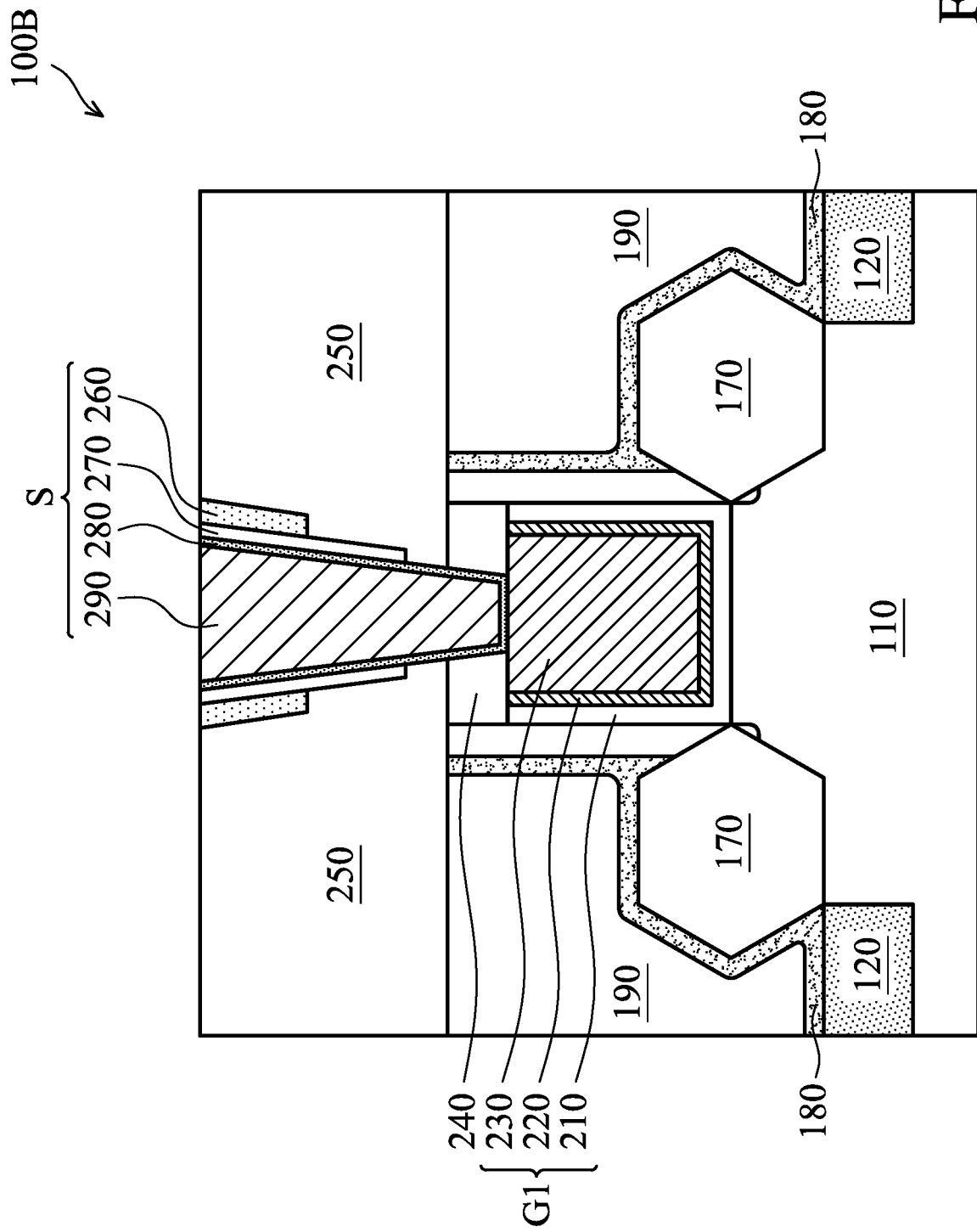
FIG. 6 is a cross-sectional view illustrating a semiconductor device structure, in accordance with some embodiments.

FIG. 6 is a cross-sectional view illustrating a semiconductor device structure 100B, in accordance with some embodiments. As shown in FIG. 6, the semiconductor device structure 100B is similar to the semiconductor device structure 100 of FIG. 2O, except that the contact structure S is formed directly over the gate stack G1, in accordance with some embodiments. The contact structure S passes through the dielectric layer 250 and the cap layer 240, in accordance with some embodiments. The contact structure S is electrically connected to the gate electrode layer 230 of the gate stack G1, in accordance with some embodiments.

Figure 7A:
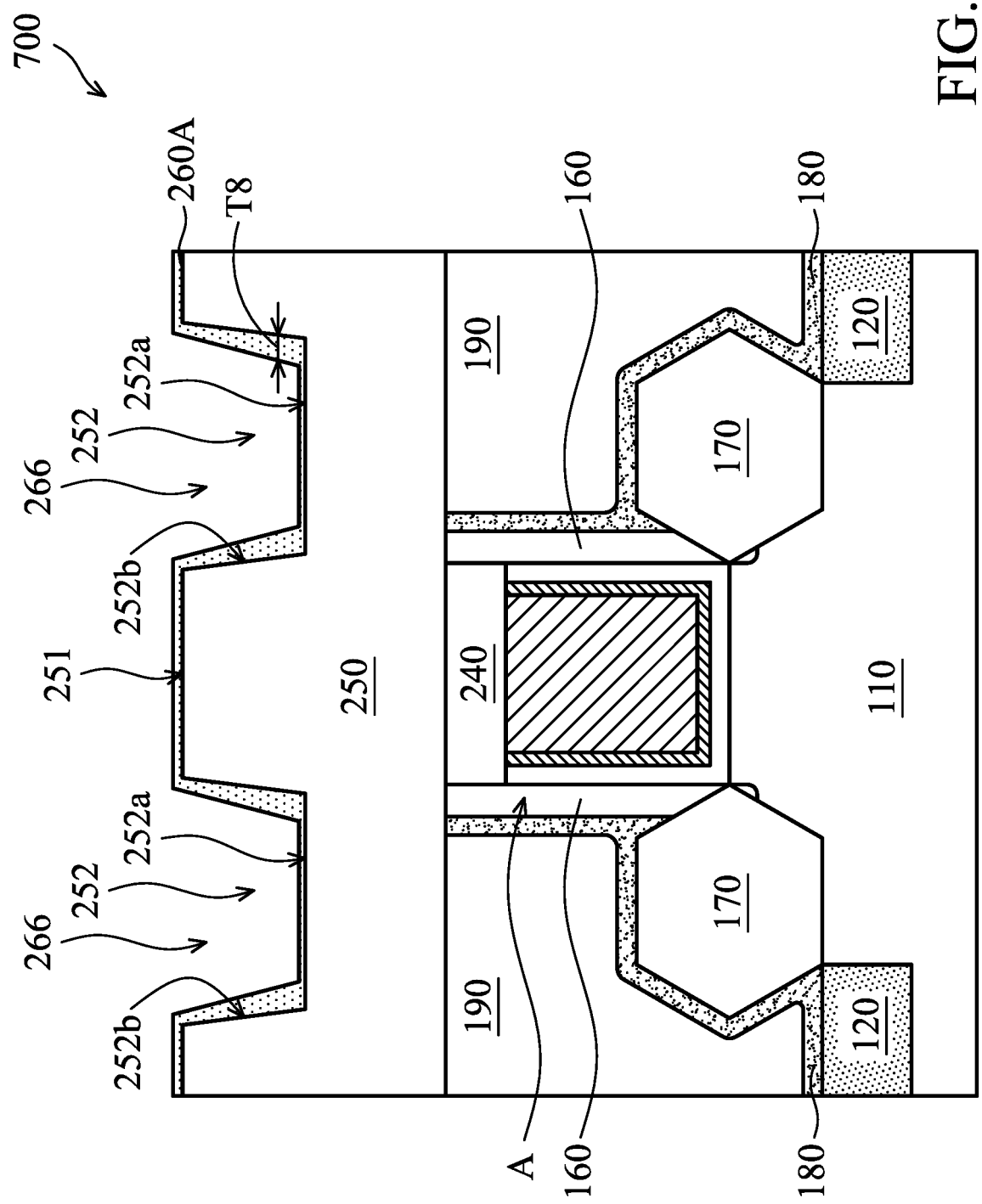
FIGS. 7A-7G are cross-sectional views of various stages of a process for forming a semiconductor device structure, in accordance with some embodiments.

FIGS. 7A-7G are cross-sectional views of various stages of a process for forming a semiconductor device structure 700, in accordance with some embodiments. After the step of FIG. 2H, as shown in FIG. 7A, the barrier material layer 260a over the bottom surfaces 252a is partially removed or thinned to form a barrier layer 260A, in accordance with some embodiments. The barrier layer 260A over the bottom surfaces 252a is thinner than the barrier material layer 260a over the bottom surfaces 252a of FIG. 2H, in accordance with some embodiments. The barrier layer 260A has openings 266 in the recesses 252 respectively, in accordance with some embodiments. In some other embodiments, the barrier material layer 260a over the bottom surfaces 252a is completely removed, as shown in FIG. 8.

As shown in FIGS. 2H and 7A, during the removal process of the barrier material layer 260a over the bottom surfaces 252a, a portion of the barrier material layer 260a over the bottom surfaces 252a is removed from the bottom surfaces 252a and then is redeposited over the barrier material layer 260a covering the inner walls 252b, in accordance with some embodiments. Therefore, over the inner walls 252b, the barrier layer 260A close to the bottom surface 252a is thicker than the barrier layer 260A close to the top surface 251, in accordance with some embodiments.

The thickness T8 of the barrier layer 260A over the inner walls 252b increases along a direction from the top surface 251 to the bottom surface 252a, in accordance with some embodiments. In some embodiments, the thickness T8 continuously increases along the direction from the top surface 251 to the bottom surface 252a.

The barrier material layer 260a over the bottom surfaces 252a is thinned using an etching process, such as an anisotropic etching process, in accordance with some embodiments. The anisotropic etching process includes a dry etching process, such as a sputtering etching process, in accordance with some embodiments.

In some embodiments, the barrier material layer 260a is formed using a sputtering deposition process, and the barrier material layer 260a over the bottom surfaces 252a is removed using a sputtering etching process. The formation of the barrier material layer 260a and the removal of the barrier material layer 260a over the bottom surfaces 252a are performed in the same chamber, such as a sputtering chamber, in accordance with some embodiments.

Figure 7B:
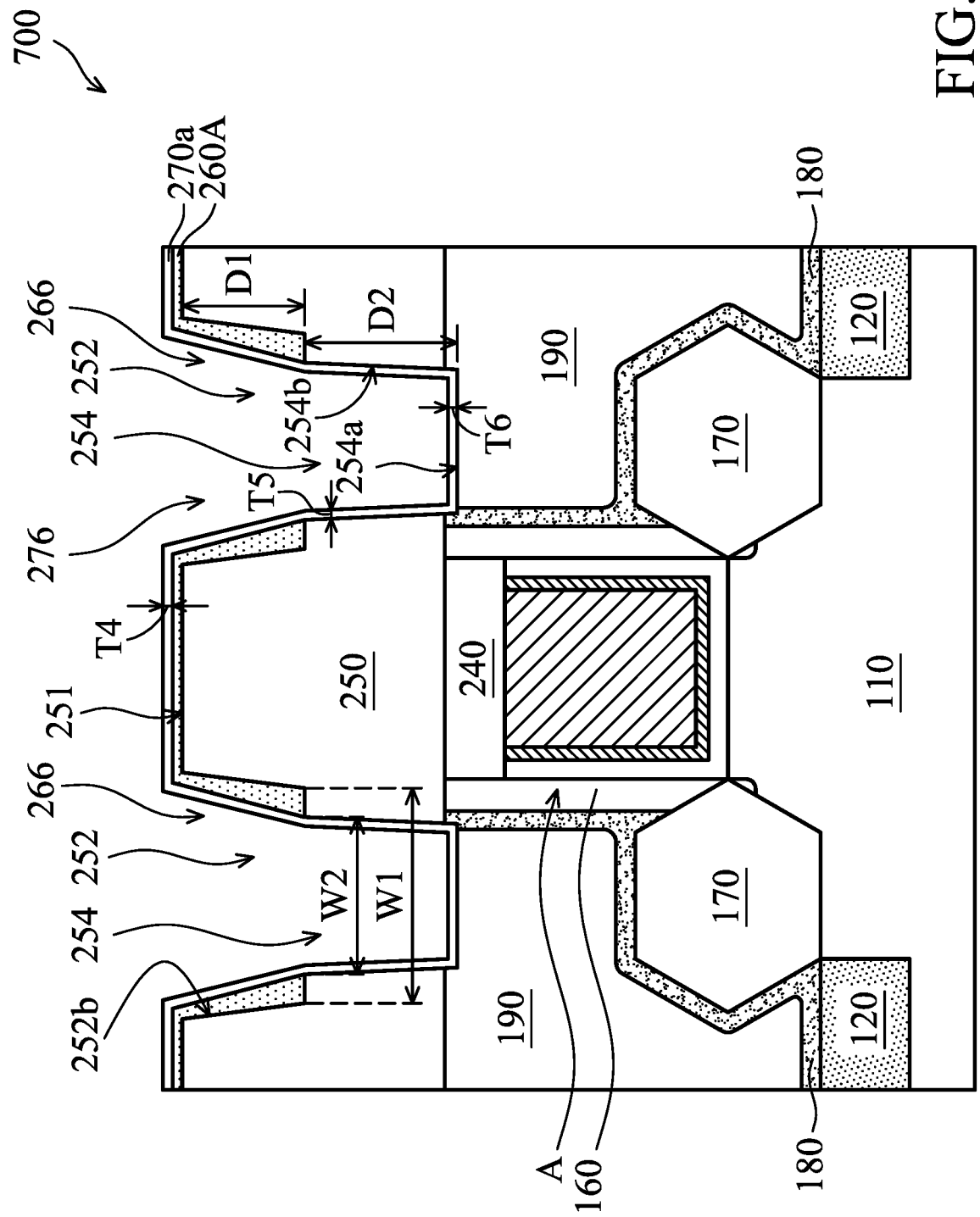
Figure 8:
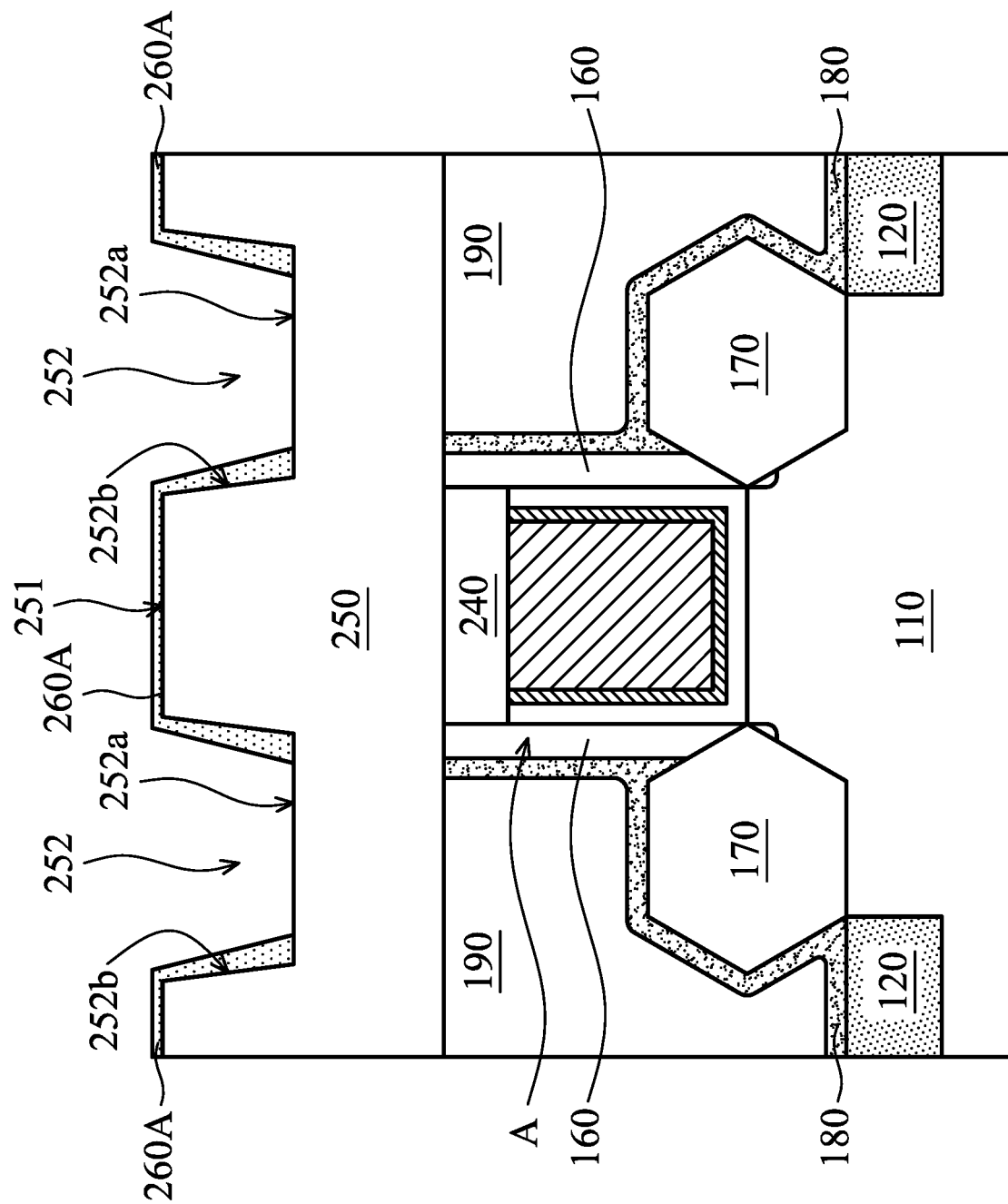
FIG. 8 is a cross-sectional view of a semiconductor device structure, in accordance with some embodiments.

As shown in FIG. 7B, portions of the dielectric layer 250 and the barrier layer 260A under the openings 266 are removed through the openings 266 to form recesses 254 in the dielectric layer 250, in accordance with some embodiments. The recesses 254 extend into the dielectric layer 190, in accordance with some embodiments. The recesses 254 do not pass through the dielectric layer 190, in accordance with some embodiments.

The recess 254 is directly under the corresponding recess 252, in accordance with some embodiments. In some embodiments, a depth D2 of the recess 254 is greater than a depth D1 of the recesses 252. In some embodiments, an average width of the recess 252 is greater than an average width of the recess 254. The term "average width" refers to the average value of the width measurements along the depth of the single recess. In some embodiments, a minimum width W1 of the recess 252 is greater than a maximum width W2 of the recess 254.

The portions of the dielectric layer 250 and the barrier layer 260A under the openings 266 are removed using an etching process, such as a dry etching process, in accordance with some embodiments. The barrier layer 260A over the inner walls 252b is used as an etching mask during the etching process, in accordance with some embodiments.

As shown in FIG. 7B, a barrier material layer 270a is formed over the barrier layer 260A and the dielectric layers 190 and 250, in accordance with some embodiments. The barrier material layer 270a covers bottom surfaces 254a and inner walls 254b of the recesses 254, in accordance with some embodiments.

The barrier material layer 270a over the top surface 251 has a thickness T4, in accordance with some embodiments.

The barrier material layer 270a over the inner wall 254b has a thickness T5, in accordance with some embodiments. The barrier material layer 270a over the bottom surface 254a has a thickness T6, in accordance with some embodiments. The thickness T4 is greater than the thickness T5 and is greater than the thickness T6, in accordance with some embodiments. The materials and the forming method of the barrier material layer 270a are the same as that of the barrier material layer 270a of FIG. 2J, in accordance with some embodiments.

Figure 7C:
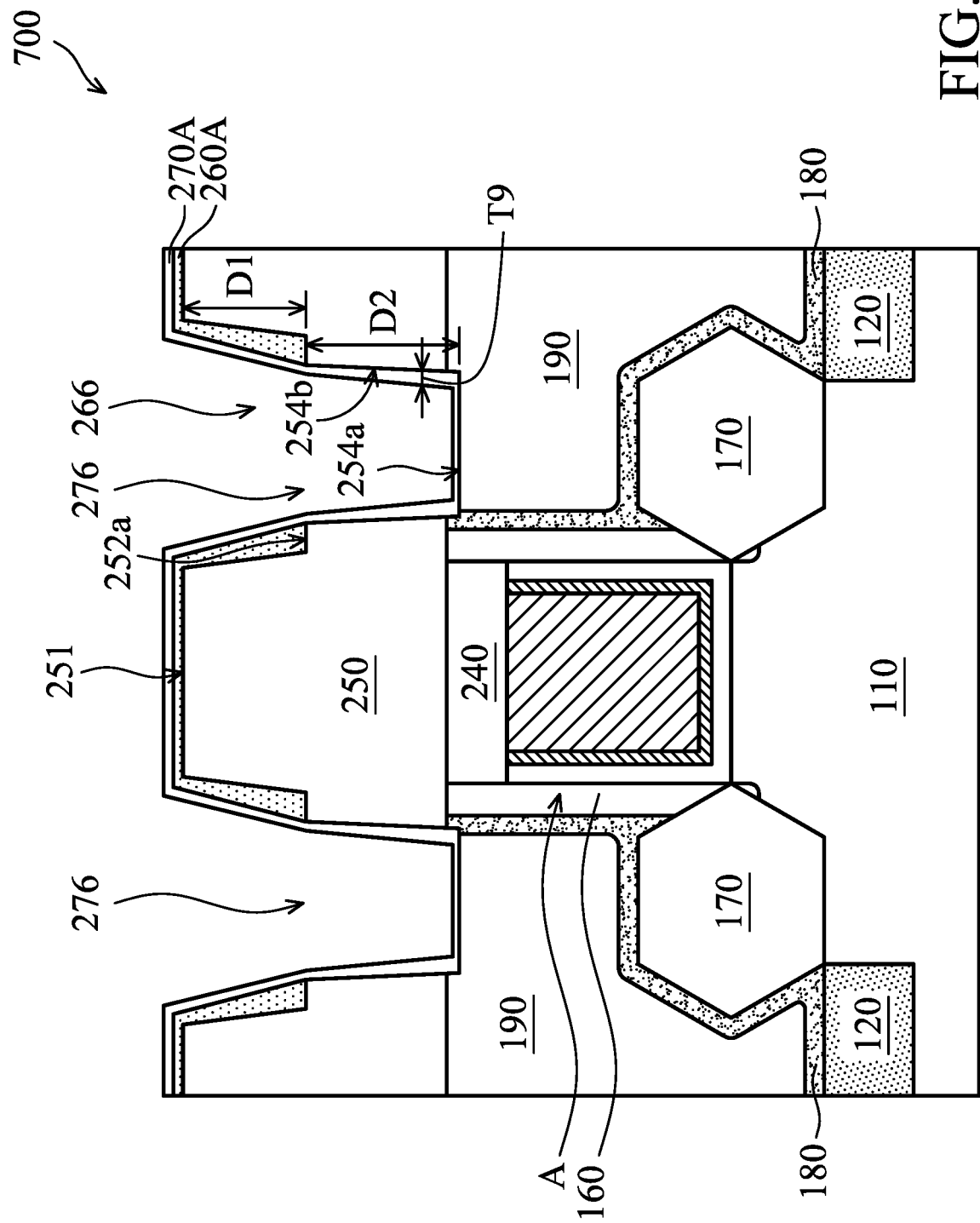
Figure 9:
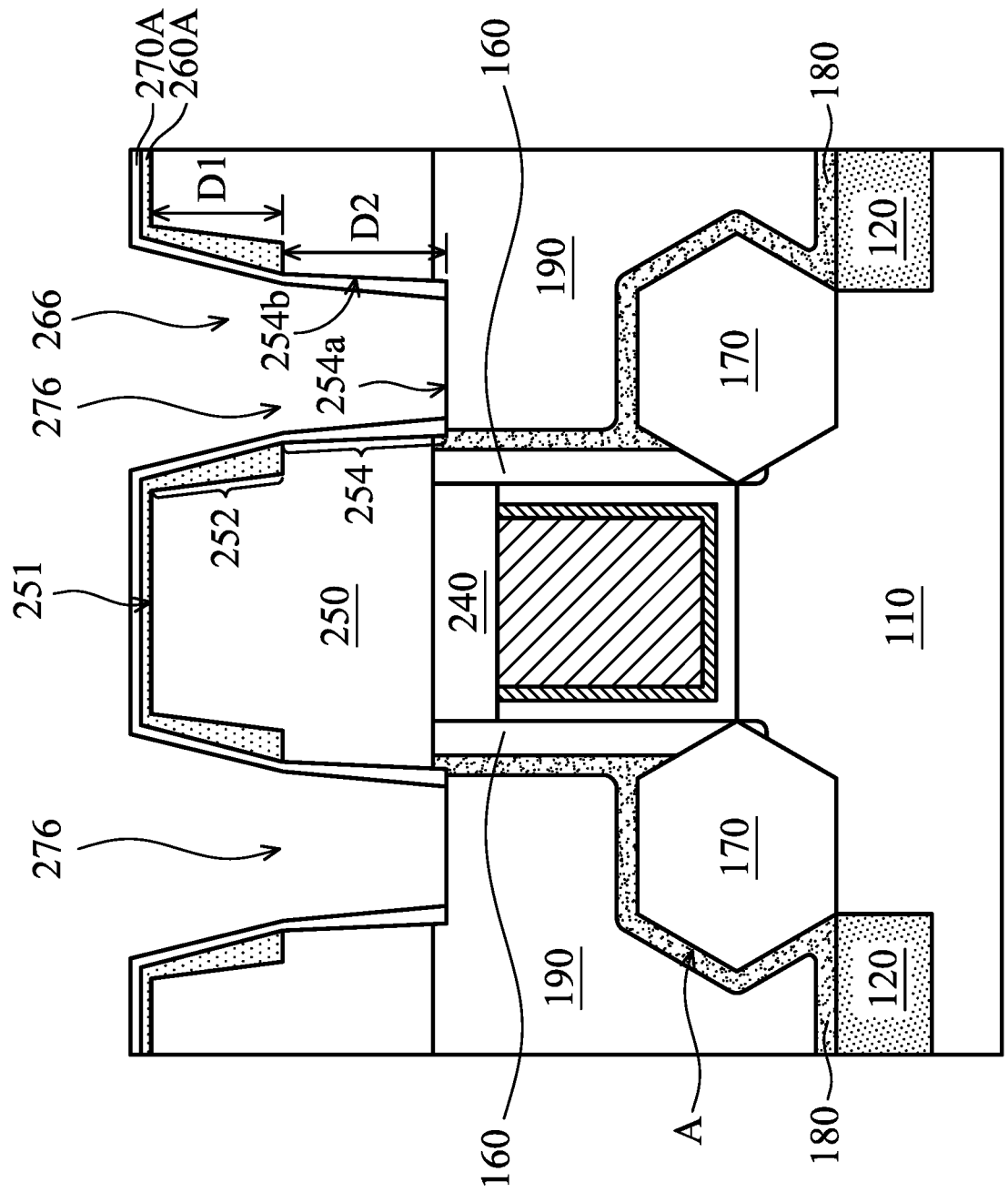
FIG. 9 is a cross-sectional view of a semiconductor device structure, in accordance with some embodiments.

As shown in FIG. 7C, the barrier material layer 270a over the bottom surfaces 254a is partially removed (or thinned) to form a barrier layer 270A, in accordance with some embodiments. The barrier layer 270A over the bottom surfaces 254a is thinner than the barrier material layer 270a over the bottom surfaces 254a of FIG. 7B, in accordance with some embodiments. In some other embodiments, the barrier material layer 270a over the bottom surfaces 254a is completely removed, as shown in FIG. 9.

As shown in FIG. 7C, the barrier layer 270A has openings 276, in accordance with some embodiments. Each opening 276 is in the corresponding recesses 252 and 254, in accordance with some embodiments. Each opening 276 is in the corresponding opening 266, in accordance with some embodiments.

The barrier layer 270A is in direct contact with the dielectric layer 250, in accordance with some embodiments. The barrier layer 270A is used to prevent metal materials of a contact layer subsequently formed in the holes 272 from diffusing into the dielectric layers 190 and 250, in accordance with some embodiments. The barrier layer 270A (conformally) covers the barrier layer 260A, the entire inner walls 254b, and the entire bottom surfaces 254a, in accordance with some embodiments.

As shown in FIGS. 7B and 7C, during the removal process of the barrier material layer 270a over the bottom surfaces 254a, a portion of the barrier material layer 270a over the bottom surfaces 254a is removed from the bottom surfaces 254a and then is redeposited over the barrier material layer 270a covering the inner walls 254b, in accordance with some embodiments. Therefore, over the inner walls 254b, the barrier layer 270A close to the bottom surface 254a is thicker than the barrier layer 270A close to the top surface 251 (or the bottom surface 252a), in accordance with some embodiments.

The thickness T9 of the barrier layer 270A over the inner walls 254b increases along a direction from the bottom surface 252a to the bottom surface 254a, in accordance with some embodiments. In some embodiments, the thickness T9 continuously increases along the direction from the bottom surface 252a to the bottom surface 254a.

The barrier material layer 270a over the bottom surfaces 254a is thinned using an etching process, such as an anisotropic etching process, in accordance with some embodiments. The anisotropic etching process includes a dry etching process, such as a sputtering etching process, in accordance with some embodiments.

In some embodiments, the barrier material layer 270a is formed using a sputtering deposition process, and the barrier material layer 270a over the bottom surfaces 254a is thinned or removed using a sputtering etching process. The formation of the barrier material layer 270a and the removal (or the thinning) of the barrier material layer 270a over the bottom surfaces 254a are performed in the same chamber, such as a sputtering chamber, in accordance with some embodiments.

Figure 7D:
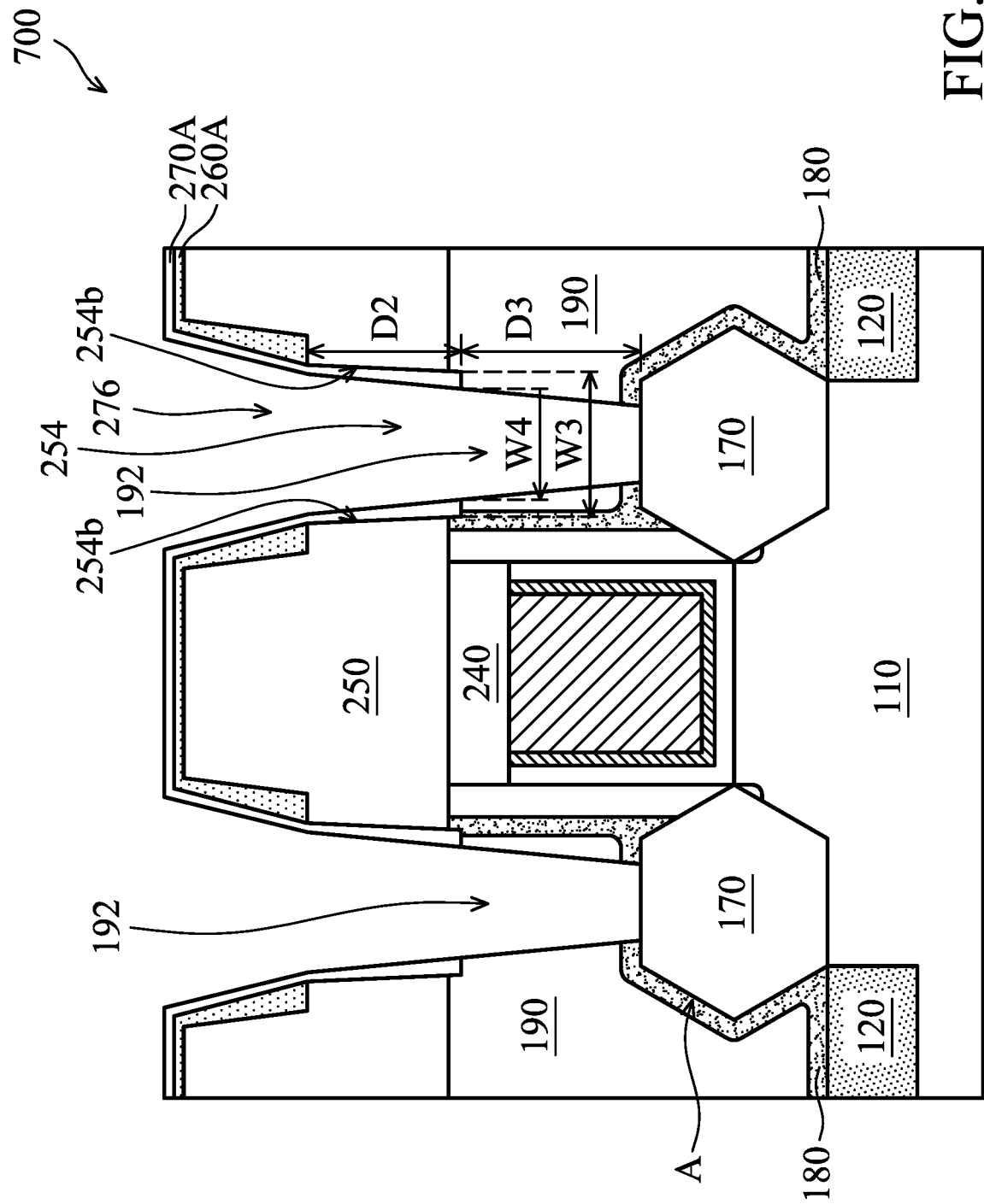

As shown in FIG. 7D, portions of the dielectric layer 190 and the barrier layer 270A under the openings 276 are removed through the openings 276 to form recesses 192 in the dielectric layer 190, in accordance with some embodiments. The recesses 192 pass through the dielectric layer 190 and expose the source/drain structures 170, in accordance with some embodiments.

The recess 192 is directly under the corresponding recess 254, in accordance with some embodiments. In some embodiments, an average width of the recess 254 is greater than an average width of the recess 192. In some embodiments, a minimum width W3 of the recess 254 is greater than a maximum width W4 of the recess 192. In some embodiments, a depth D3 of the recess 192 is greater than a depth D2 of the recesses 254. The portions of the dielectric layer 190 under the openings 276 are removed using an etching process, such as a dry etching process, in accordance with some embodiments. The barrier layer 270A over the inner walls 254b is used as an etching mask during the etching process, in accordance with some embodiments.

Figure 7E:
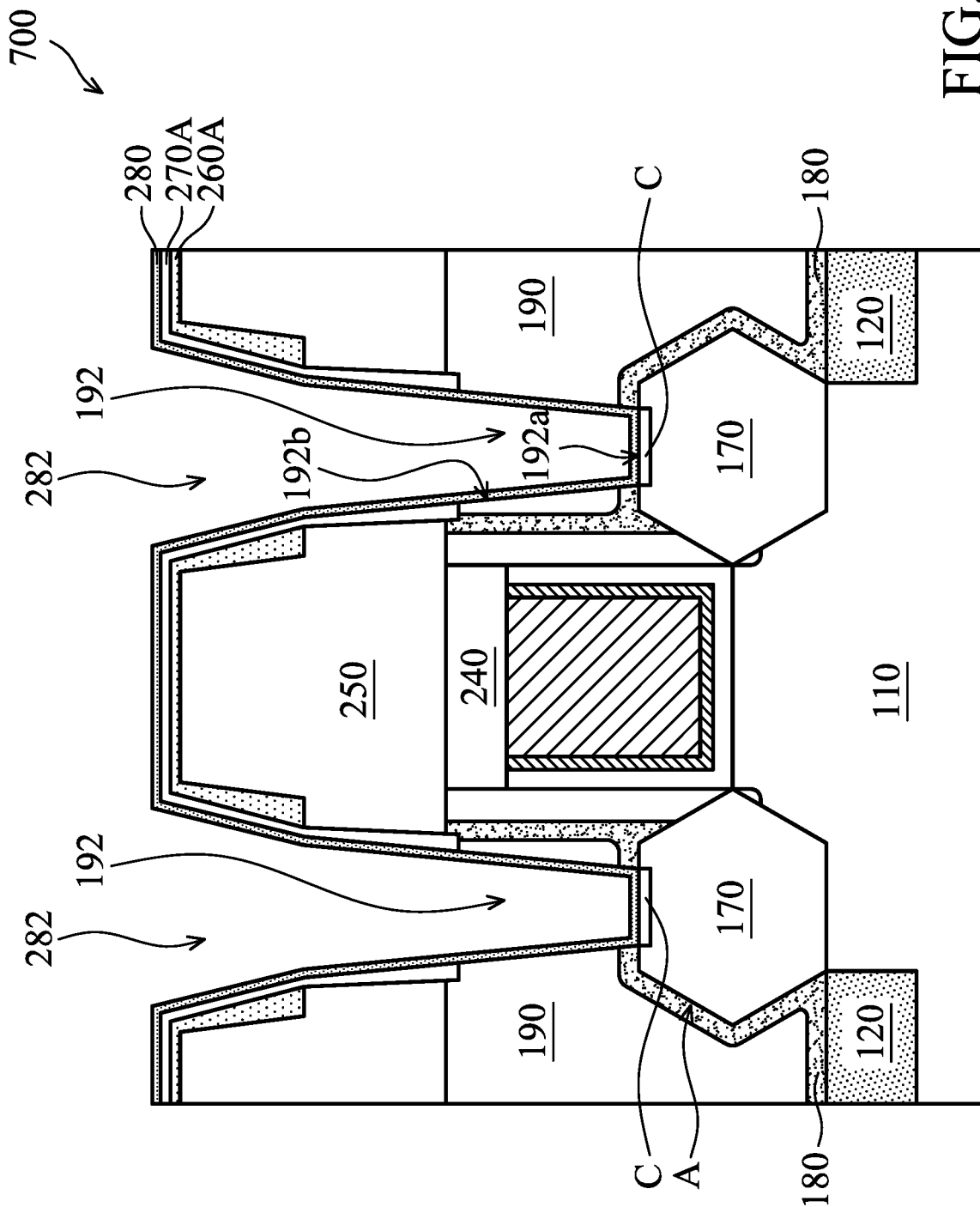

As shown in FIG. 7E, a barrier layer 280 is formed over the barrier layer 270A and the dielectric layer 190, in accordance with some embodiments. The barrier layer 280 covers bottom surfaces 192a and inner walls 192b of the recesses 192, in accordance with some embodiments. The barrier layer 280 conformally covers the barrier layer 270A, the entire inner walls 192b, and the entire bottom surfaces 192a, in accordance with some embodiments.

The barrier layer 280 has openings 282, in accordance with some embodiments. The openings 282 are also referred to as holes or recesses, in accordance with some embodiments. The barrier layer 280 is used to prevent metal materials of a contact layer subsequently formed in the openings 282 from diffusing into the dielectric layer 190 and the source/drain structures 170, in accordance with some embodiments.

The materials and the forming method of the barrier layer 280 are the same as that of the barrier layer 280 of FIG. 2M, in accordance with some embodiments. In some embodiments, the barrier layer 280 is a multi-layered structure, such as a bi-layered structure. In some embodiments, the barrier layer 280 is a single-layered structure. The barrier layers 260A, 270A, and 280 are made of the same material, in accordance with some embodiments.

In some embodiments, as shown in FIG. 7E, a metal silicide layer C is formed over the source/drain structures 170. The metal silicide layer C is made of $TiSi_2$ (titanium disilicide), CoSi2, RuSi, or another suitable conductive material. The metal silicide layer C may be formed before or after the barrier layer 280 is formed. The formation of the metal silicide layer C will be described in detail in the following embodiments of FIGS. 10A-10B and 11A-11B.

Figure 7F:
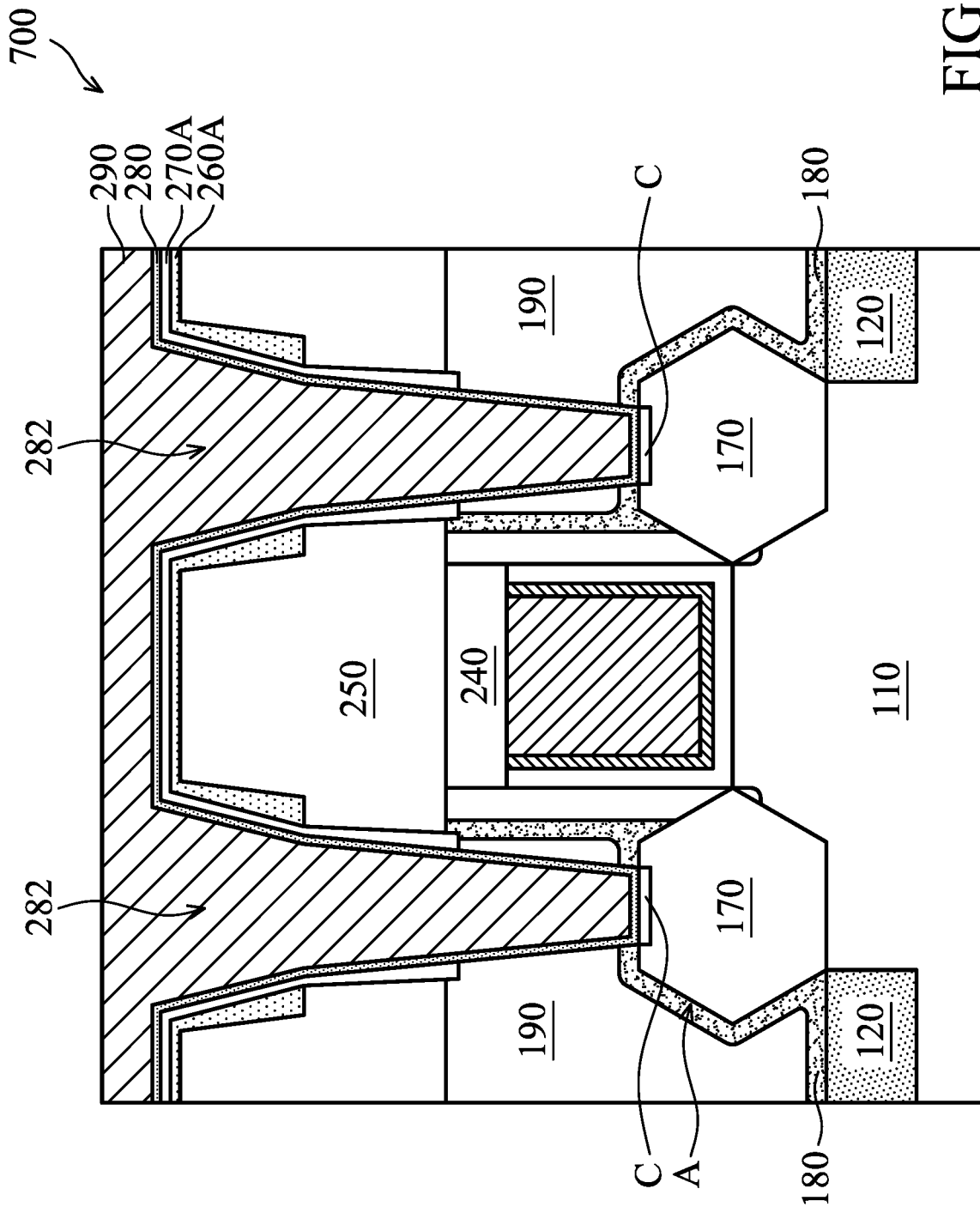

As shown in FIG. 7F, a contact layer 290 is formed over the barrier layer 280, in accordance with some embodiments. The openings 282 are filled with the contact layer 290, in accordance with some embodiments. In some embodiments, a material of the contact layer 290 is different from materials of the barrier layers 260A, 270A, and 280. The contact layer 290 is formed using a physical vapor deposition process, a plating process, another suitable method, or a combination thereof, in accordance with some embodiments.

Figure 7G:
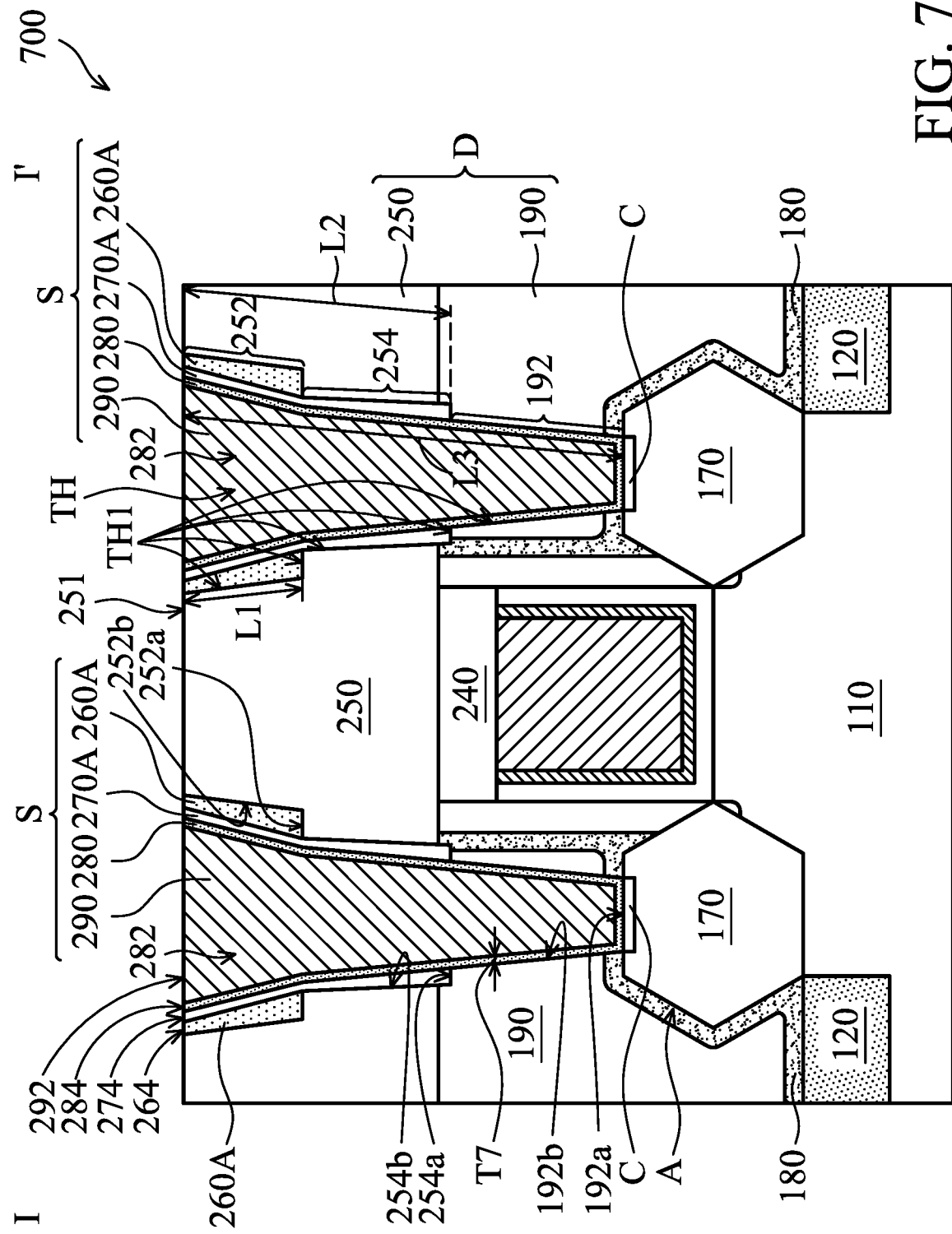
Figures 1, 7G:
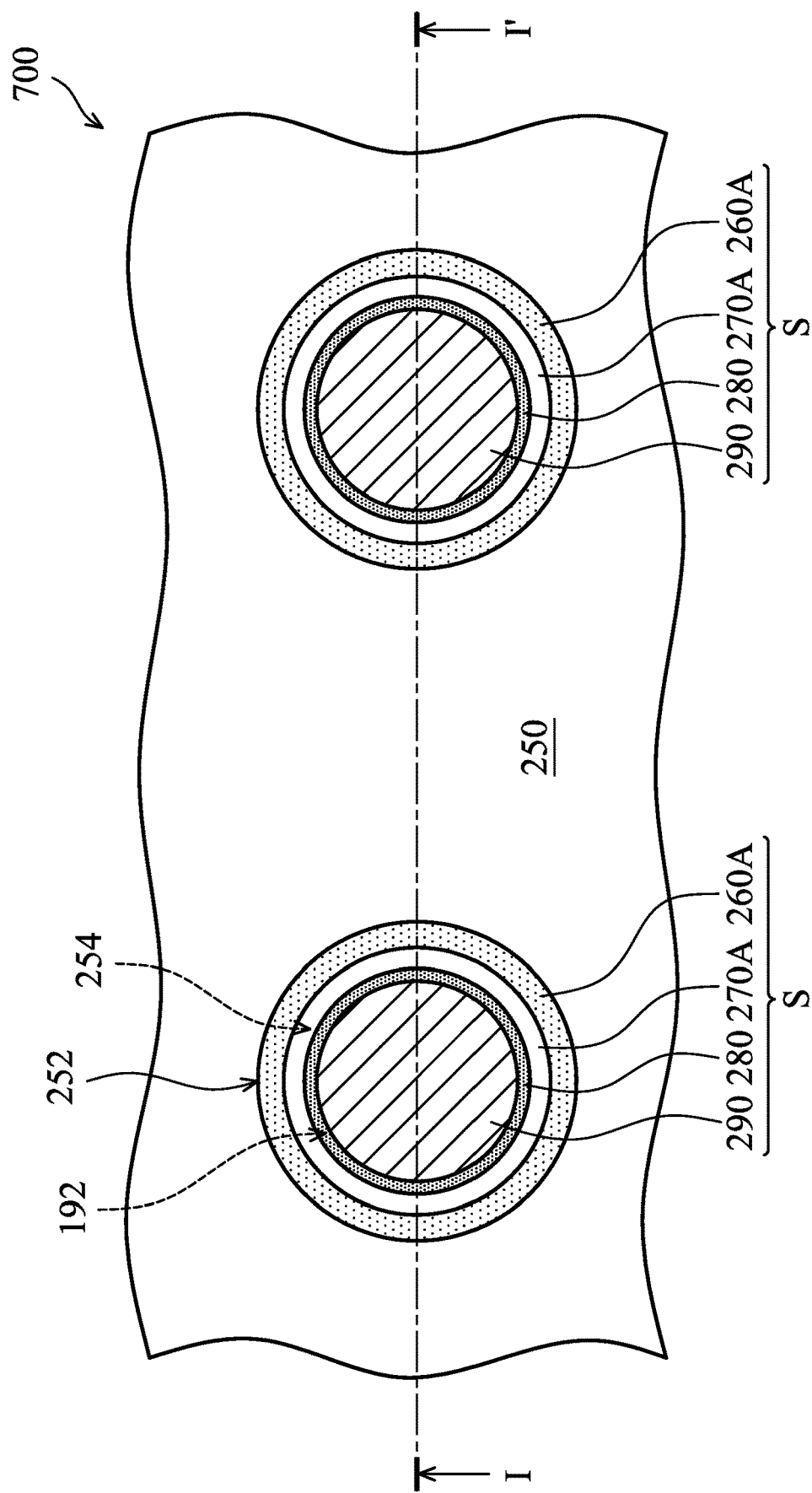
Figures 2, 7G:
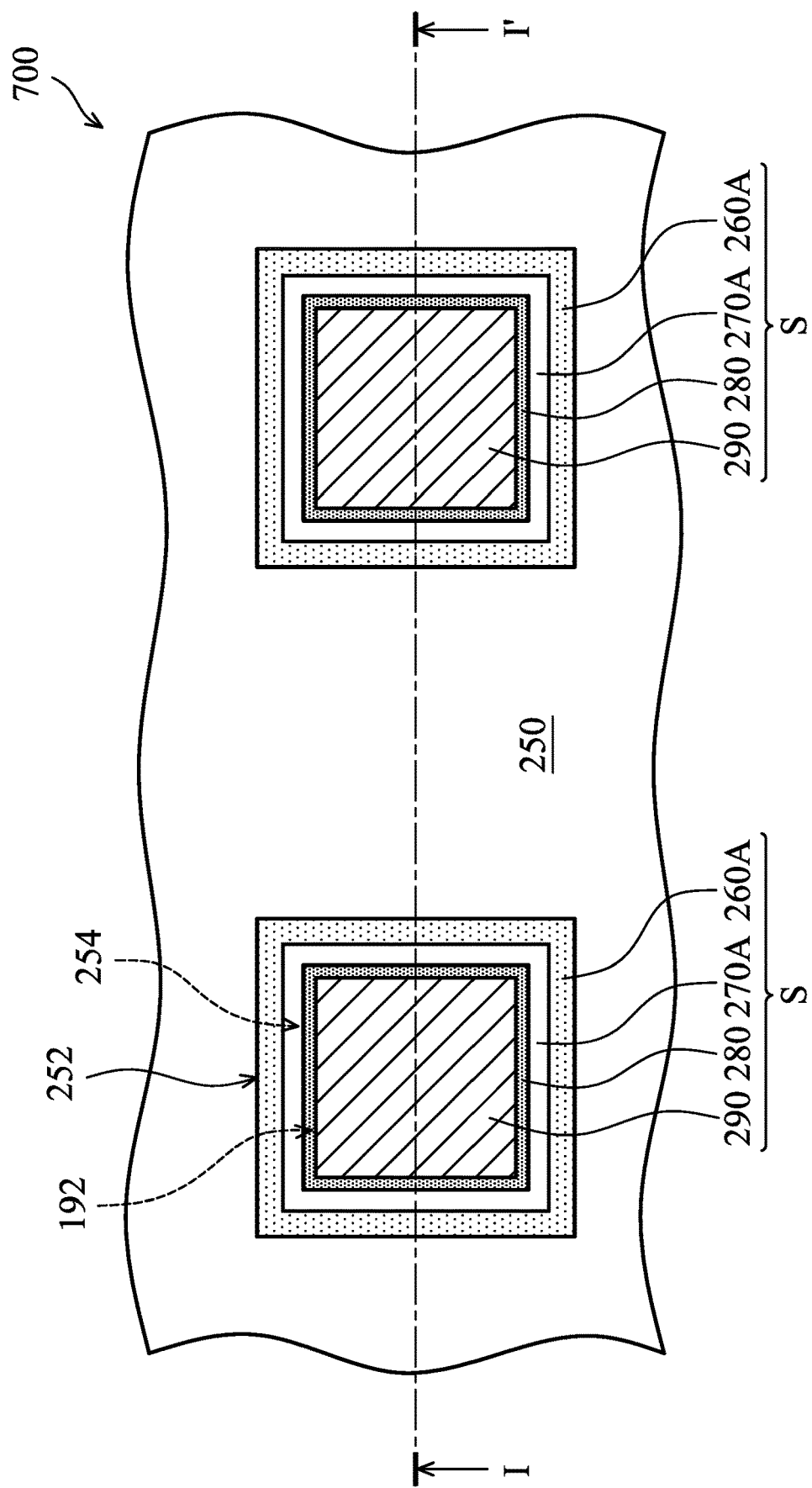

As shown in FIG. 7G, the contact layer 290 and the barrier layers 260A, 270A, and 280 outside of the recesses 252, 254 and 192 are removed, in accordance with some embodiments. The removal process includes a planarization process, such as a chemical mechanical process, in accordance with some embodiments.

After the removal process, top surfaces 251, 264, 274, 284, and 292 of the dielectric layer 250, the barrier layers 260A, 270A, and 280, and the contact layer 290 are substantially coplanar or substantially aligned with each other, in accordance with some embodiments. The term "substantially coplanar" in the application may include small deviations from coplanar geometries.

The contact layer 290, the barrier layers 260A, 270A, and 280 remaining in the recesses 252, 254 and 192 over the same source/drain structure 170 together form a contact structure S, in accordance with some embodiments. The contact structure S is positioned over and is electrically connected to the source/drain structure 170 thereunder, in accordance with some embodiments. The contact structures S pass through the dielectric layers 190 and 250 (or the dielectric structure D), in accordance with some embodiments.

The average thickness of the barrier layer 260A is greater than the average thickness of the barrier layer 270A, in accordance with some embodiments. The average thickness of the barrier layer 270A is greater than the average thickness of the barrier layer 280, in accordance with some embodiments.

The distance between the recesses 252 is less than the distance between the recesses 254, and therefore the dielectric layer 250 between the recesses 252 is thinner than the dielectric layer 250 between the recesses 254, in accordance with some embodiments. The thicker barrier layer 260A is able to prevent short circuit between the contact structures S resulting from that the metal materials of the contact layer 290 diffuse through the thinner dielectric layer 250 between the recesses 252, in accordance with some embodiments.

Since the material of the barrier layer 280 may have an electrical resistance higher than the material of the contact layer 290, the thinner barrier layer 280 may provide a lower electrical resistance between the contact layer 290 and the source/drain structure 170 thereunder.

FIG. 7G-1 is a top view of the semiconductor device structure 700 of FIG. 7G, in accordance with some embodiments. FIG. 7G is a cross-sectional view illustrating the semiconductor device structure 700 along a sectional line I-I' in FIG. 7G-1, in accordance with some embodiments.

As shown in FIGS. 7G and 7G-1, in one of the contact structures S, the barrier layer 280 continuously surrounds the entire contact layer 290, in accordance with some embodiments. The barrier layer 270A continuously surrounds an upper portion of the barrier layer 280, in accordance with some embodiments. In some embodiments, a lower portion of the barrier layer 280 is in direct contact with the dielectric layer 190. The barrier layer 260A continuously surrounds an upper portion of the barrier layer 270A, in accordance with some embodiments. In some embodiments, a lower portion of the barrier layer 270A is in direct contact with the dielectric layers 190 and 250.

Each contact structure S is directly over and is electrically connected to the source/drain structure 170 thereunder, in accordance with some embodiments. The barrier layer 280 is between the contact layer 290 and the source/drain structure 170, in accordance with some embodiments. The barrier layer 280 separates the contact layer 290 from the source/drain structure 170, the dielectric layers 190 and 250, the barrier layers 260A and 270A, in accordance with some embodiments.

In some embodiments, an electrical resistance of the barrier layer 280 is less than an electrical resistance of the barrier layer 270A. In some embodiments, the electrical resistance of the barrier layer 270A is less than an electrical resistance of the barrier layer 260A.

Since metal nitride has a good barrier ability of diffusion of metal, the barrier layer 260A contains a higher ratio of metal nitride to other materials in the barrier layer 260A than the barrier layers 270A and 280, in accordance with some embodiments. Since metal nitride may have a high electrical resistance, the electrical resistance of the barrier layer 260A may be greater than the electrical resistance of the barrier layers 270A and 280.

Since the electrical resistance of the barrier layer 280 may affect the electrical resistance between the contact layer 290 and the source/drain structure 170, the barrier layer 280 may contain barrier materials with good conductivity (e.g., Co, CoN, Ru, and/or RuN) or contain a low ratio of metal nitride to other materials in the barrier layer 280. Therefore, the electrical resistance of the barrier layer 280 may be less than the electrical resistance of the barrier layers 270A and 260A.

The barrier layer 260A has a length L1, in accordance with some embodiments. The barrier layer 270A has a length L2, in accordance with some embodiments. The barrier layer 280 has a length L3, in accordance with some embodiments. The length L3 is greater than the length L2, in accordance with some embodiments. The length L2 is greater than the length L1, in accordance with some embodiments.

As shown in FIGS. 7G and 7G-1, the recesses 252, 254, and 192 together form a through hole TH passing through the dielectric layers 190 and 250, in accordance with some embodiments. The through hole TH has an inner wall TH1, in accordance with some embodiments. The inner wall TH1 includes the inner walls 252b, 254b, and 192b and the bottom surfaces 252a and 254a, in accordance with some embodiments. The inner walls 252b, 254b, and 192b are discontinuous, in accordance with some embodiments. The inner wall TH1 is a step-like inner wall, in accordance with some embodiments.

The through hole TH is formed using three etching processes, which use the barrier layers 260A and 270A as etching masks. Therefore, the barrier layers 260A and 270A may protect the inner wall TH1 thereunder from being etched during the etching processes. As a result, the barrier layers 260A and 270A may prevent the width of the through hole TH from being undesirably enlarged by the etching processes. That is, the barrier layers 260A and 270A may maintain the critical dimension (e.g., the width) of the through hole TH.

The through hole TH is formed by forming the recesses 252, 254, and 192 using three etching processes. Each of the recesses 252, 254, and 192 has an aspect ratio less than that of the through hole TH. Therefore, each of the recesses 252, 254, and 192 may have no neck profile or a slightly neck profile. As a result, each of the barrier layers 260A, 270A, and 280 may substantially conformally, uniformly, and continuously deposited over the inner wall TH1. Therefore, the yield of the barrier layers 260A, 270A, and 280 is improved.

As shown in FIG. 7G-1, the recesses 252, 254, and 192 have a substantially circular shape, in accordance with some embodiments. In some other embodiments, as shown in FIG. 7G-2, the recesses 252, 254, and 192 have a non-circular shape, in accordance with some embodiments. For example, the recesses 252, 254, and 192 have a rectangular shape, in accordance with some embodiments.

Figure 10A:
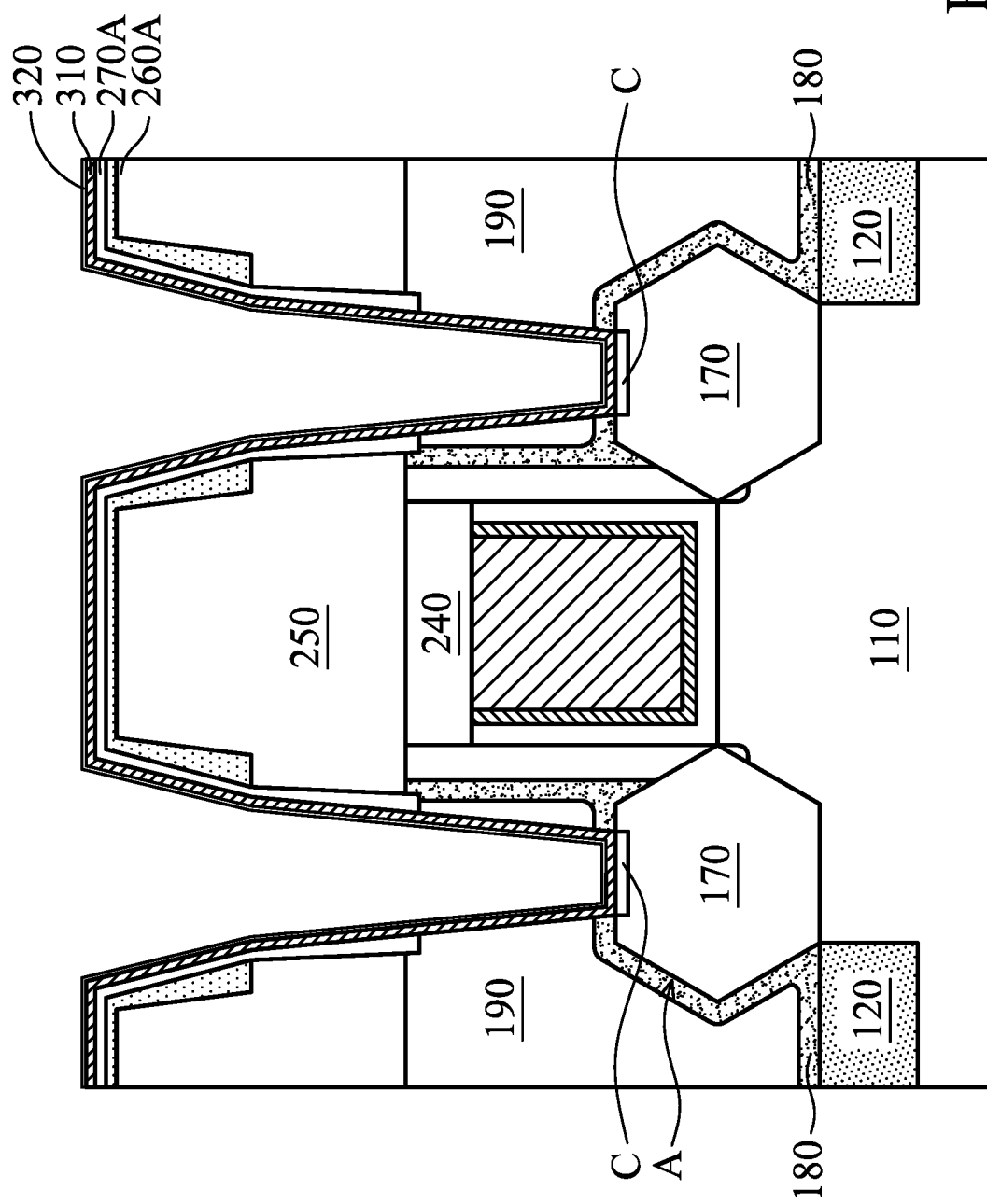
FIGS. 10A-10B are cross-sectional views of various stages of a process for forming a semiconductor device structure, in accordance with some embodiments.
Figure 10B:
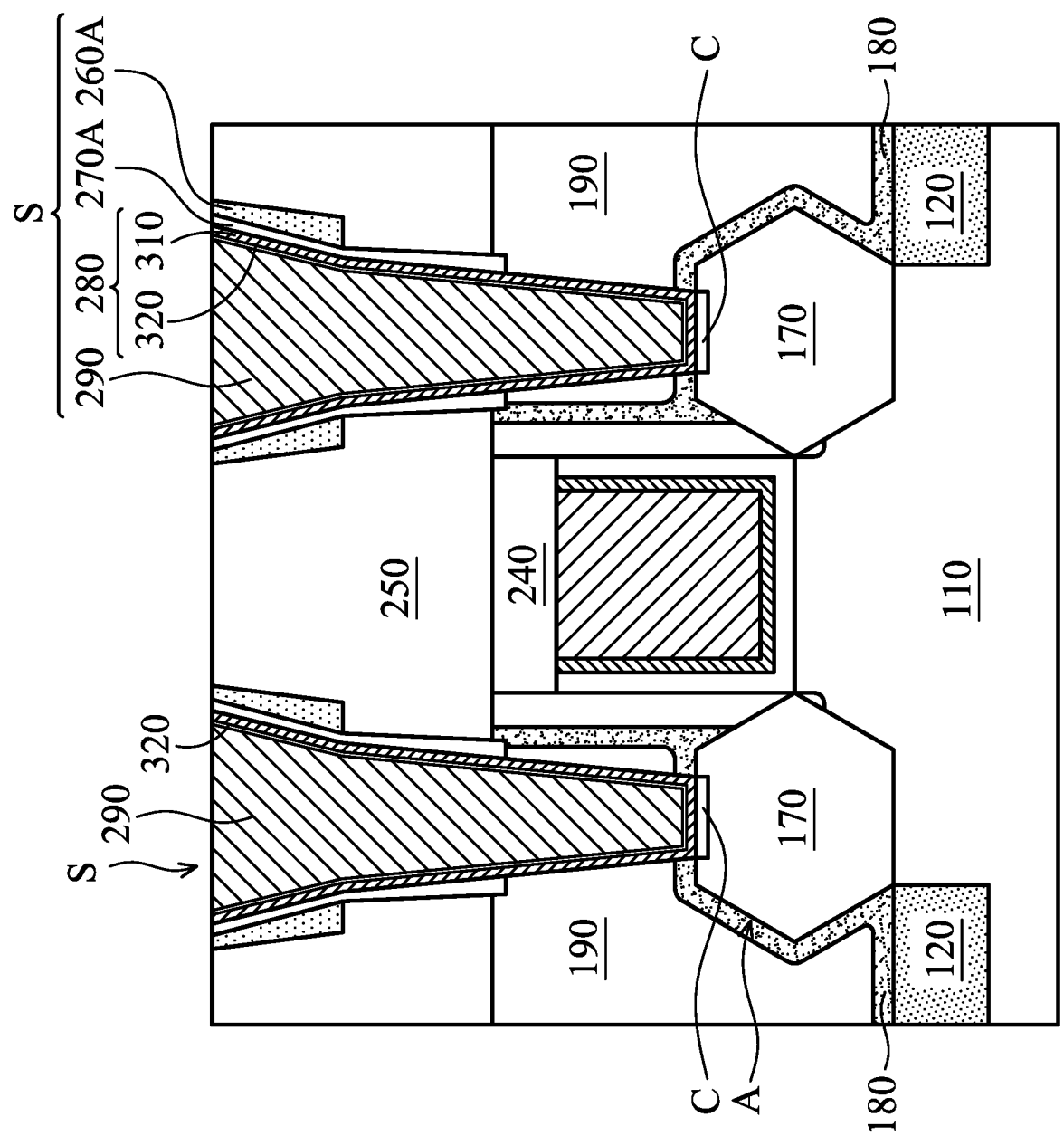

FIGS. 10A-10B are cross-sectional views of various stages of a process for forming a semiconductor device structure, in accordance with some embodiments. As shown in FIG. 10A, after the step of FIG. 7D, a metal layer 310 is formed over the barrier layer 270A, the dielectric layer 190, and the source/drain structures 170, in accordance with some embodiments. The metal layer 310 is in direct contact with the barrier layer 270A, the dielectric layer 190, and the source/drain structures 170, in accordance with some embodiments. The materials and the forming method of the metal layer 310 are the same as that of the metal layer 310 of FIG. 3A, in accordance with some embodiments.

As shown in FIG. 10A, an annealing process is performed on the metal layer 310 and the source/drain structures 170 to react the metal layer 310 with the source/drain structures 170 so as to form metal silicide layers C between the metal layer 310 and the source/drain structures 170, in accordance with some embodiments. The metal silicide layers C include TiSi$_2$ (titanium disilicide), CoSi2, or RuSi, in accordance with some embodiments.

As shown in FIG. 10A, a metal nitride layer 320 is formed over the metal layer 310, in accordance with some embodiments. In some embodiments, the metal silicide layers C are formed before the metal nitride layer 320 is formed. In some other embodiments, the metal silicide layers C are formed after the metal nitride layer 320 is formed. The materials and the forming method of the metal nitride layer 320 are the same as that of the metal nitride layer 320 of FIG. 3A, in accordance with some embodiments.

As shown in FIG. 10B, steps of FIGS. 7F-7G are performed, in accordance with some embodiments. The metal layer 310 and the metal nitride layer 320 together form a barrier layer 280, in accordance with some embodiments. The contact layer 290, the barrier layers 260A, 270A, and 280 remaining in the recesses 252, 254 and 192 over the same source/drain structure 170 together form a contact structure S, in accordance with some embodiments.

The metal layer 310 is in direct contact with the metal silicide layers C, in accordance with some embodiments. The metal nitride layer 320 is in direct contact with the contact layer 290, in accordance with some embodiments. The contact layer 290 is made of tungsten (W), in accordance with some embodiments. The metal nitride layer 320 separates the contact layer 290 from the metal layer 310 to prevent tungsten in the contact layer 290 from reacting with the metal layer 310, in accordance with some embodiments.

Figure 11A:
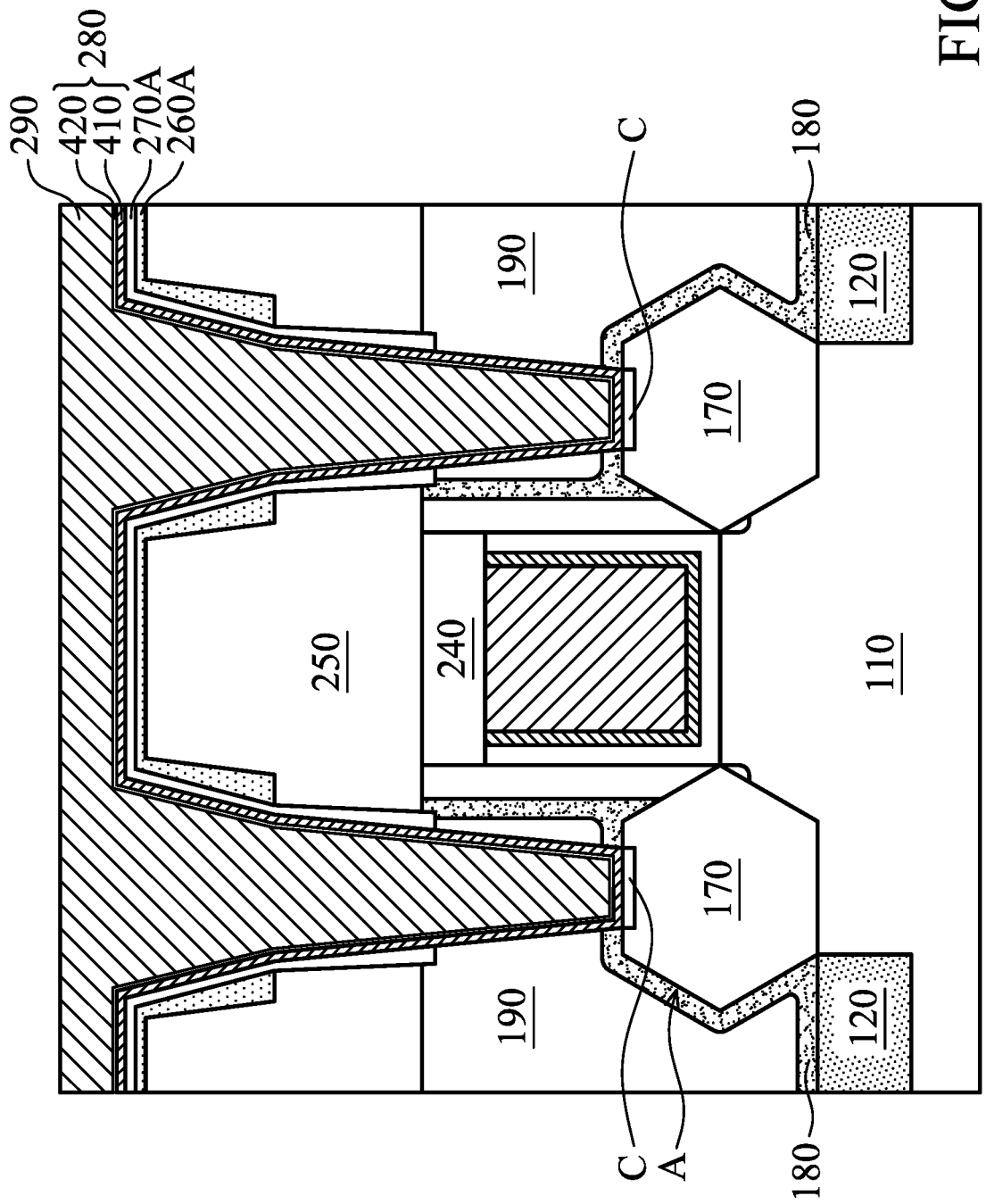
FIGS. 11A-11B are cross-sectional views of various stages of a process for forming a semiconductor device structure, in accordance with some embodiments.
Figure 11B:
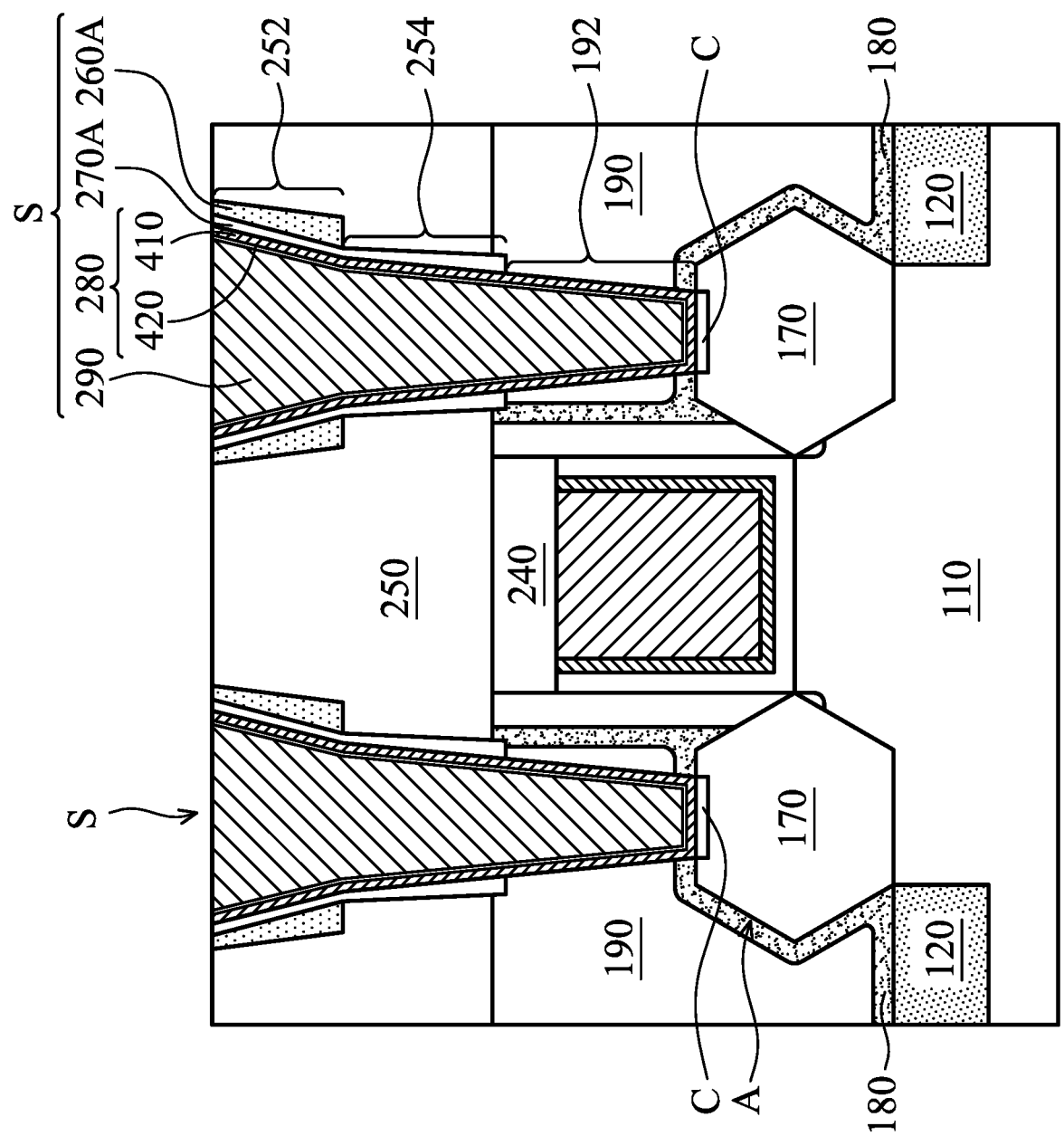

FIGS. 11A-11B are cross-sectional views of various stages of a process for forming a semiconductor device structure, in accordance with some embodiments. As shown in FIG. 11A, after the step of FIG. 7D, metal silicide layers C are formed over the source/drain structures 170, in accordance with some embodiments. The formation of the metal silicide layers C includes depositing a metal layer (not shown) over the source/drain structures 170; annealing the metal layer and the source/drain structures 170 to form the metal silicide layers C between the metal layer and the source/drain structures 170; and removing the metal layer.

As shown in FIG. 11A, a metal nitride film 410 is formed over the barrier layer 270A, the dielectric layer 190, and the metal silicide layers C, in accordance with some embodiments. The metal nitride film 410 is in direct contact with the barrier layer 270A, the dielectric layer 190, and the metal silicide layers C, in accordance with some embodiments.

As shown in FIG. 11A, a metal layer 420 is formed over the metal nitride film 410, in accordance with some embodiments. The metal layer 420 is in direct contact with the metal nitride film 410, in accordance with some embodiments. The materials and the forming methods of the metal nitride film 410 and the metal layer 420 are the same as that of the metal nitride film 410 and the metal layer 420 of FIG. 4A, in accordance with some embodiments. As shown in FIG. 11A, a contact layer 290 is formed over the metal layer 420, in accordance with some embodiments. The materials and the forming methods of the contact layer 290 are the same as that of the contact layer 290 of FIG. 4A, in accordance with some embodiments.

As shown in FIG. 11B, a step of FIG. 7G is performed, in accordance with some embodiments. The metal nitride film 410 and the metal layer 420 together form a barrier layer 280, in accordance with some embodiments. The contact layer 290, the barrier layers 260A, 270A, and 280 remaining in the recesses 252, 254 and 192 over the same source/drain structure 170 together form a contact structure S, in accordance with some embodiments. In some embodiments, the barrier layers 260A and 270A are metal nitride films. The barrier layer 260A is thicker than the barrier layer 270A, and the barrier layer 270A is thicker than the metal nitride film 410 of the barrier layer 280, in accordance with some embodiments. The barrier layer 280 of FIG. 7G may be replaced by the barrier layer 280 of FIG. 10B or the barrier layer 280 of FIG. 11B.

Figure 12:
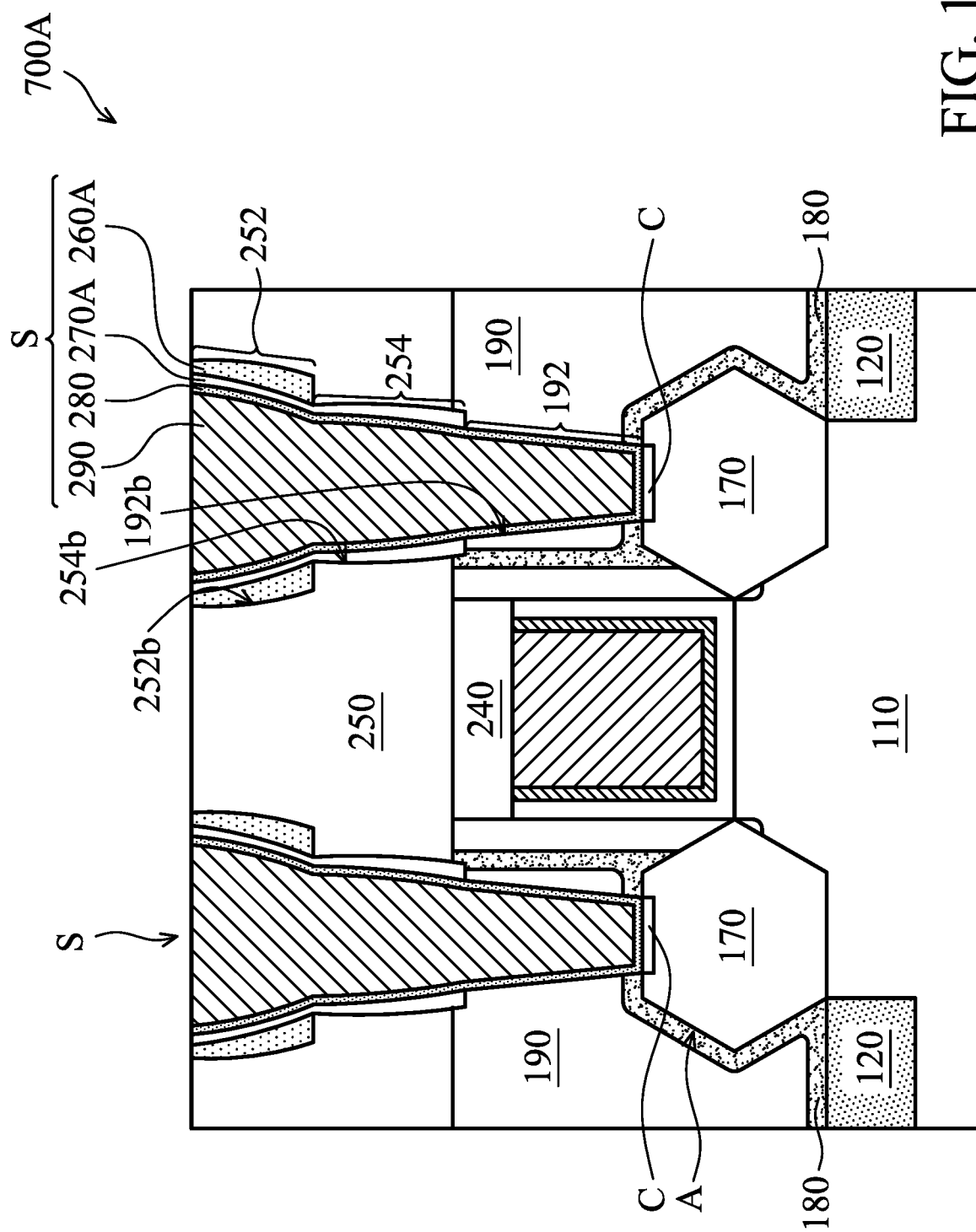
FIG. 12 is a cross-sectional view illustrating a semiconductor device structure, in accordance with some embodiments.

FIG. 12 is a cross-sectional view illustrating a semiconductor device structure 700A, in accordance with some embodiments. As shown in FIG. 12, the semiconductor device structure 700A is similar to the semiconductor device structure 700 of FIG. 7G, except that the inner walls 252b, 254b, and 192b of the recesses 252, 254, and 192 of the semiconductor device structure 700A are curved inner walls, in accordance with some embodiments. The barrier layers 260A, 270A, and 280 conformally covers the inner walls 252b, 254b, and 192b, in accordance with some embodiments. The inner walls 252b, 254b, and 192b are discontinuous, in accordance with some embodiments.

Figure 13:
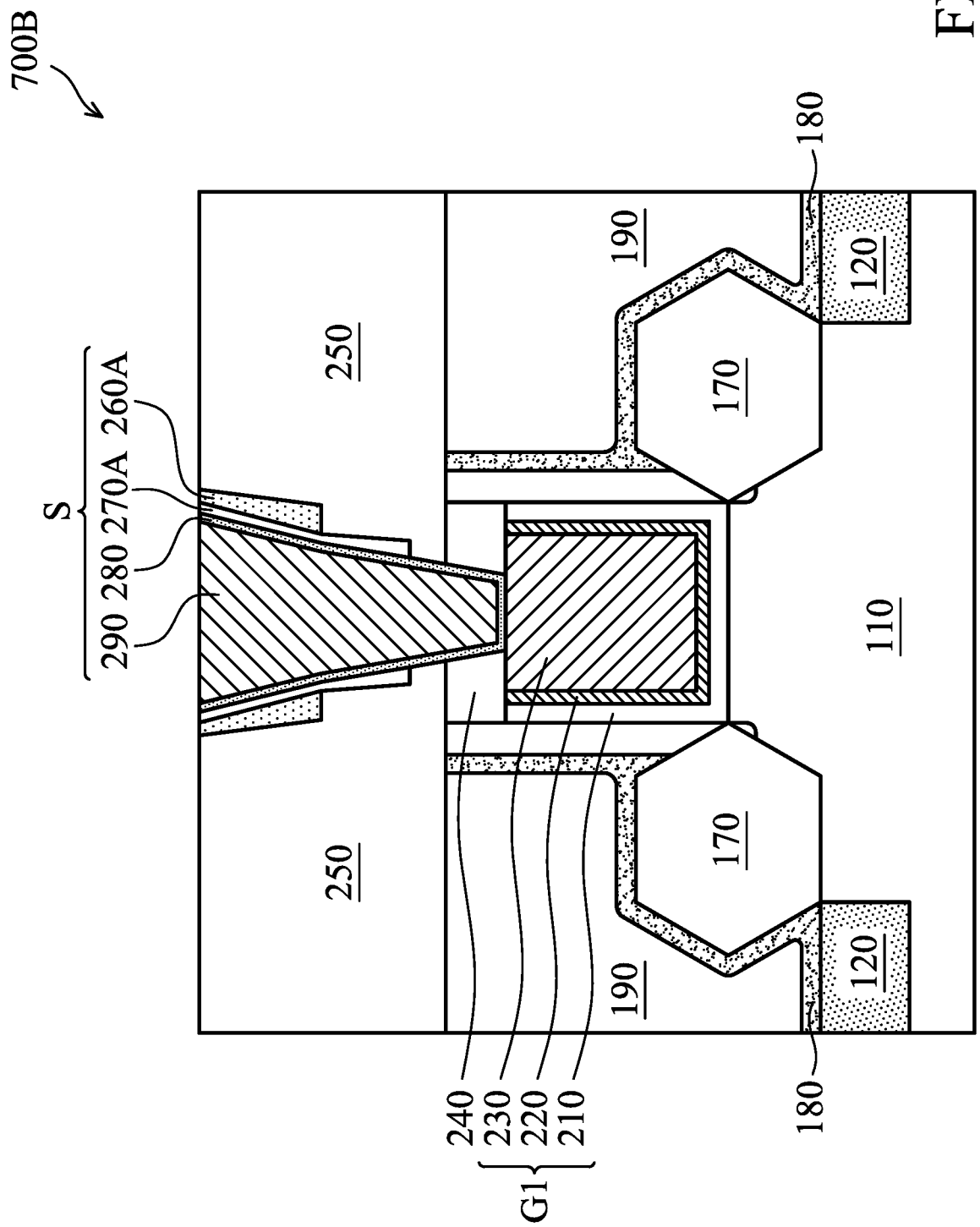
FIG. 13 is a cross-sectional view illustrating a semiconductor device structure, in accordance with some embodiments.

FIG. 13 is a cross-sectional view illustrating a semiconductor device structure 700B, in accordance with some embodiments. As shown in FIG. 13, the semiconductor device structure 700B is similar to the semiconductor device structure 700 of FIG. 7G, except that the contact structure S is formed directly over the gate stack G1, in accordance with some embodiments. The contact structure S passes through the dielectric layer 250 and the cap layer 240, in accordance with some embodiments. The contact structure S is electrically connected to the gate electrode layer 230 of the gate stack G1, in accordance with some embodiments. In some embodiments where the semiconductor device structure 700B is free of the cap layer 240, an interface between the contact structure S and the gate stack G1 is substantially co-planar with a bottom surface of the dielectric layer 250.

In accordance with some embodiments, semiconductor device structures and methods for forming the same are provided. The methods (for forming the semiconductor device structure) form a contact hole using multiple etching processes, which use multiple barrier layers as etching masks. Therefore, the methods prevent the contact hole from having a neck profile resulting from using a single etching process to form a contact hole. As a result, the yield of the barrier layers formed over the inner walls of the contact hole is improved. The barrier layers are formed over the inner walls of the contact hole during the time interval between the etching processes. The barrier layers protect the inner walls thereunder from being etched during the subsequent etching processes. Therefore, the barrier layers prevent the width of the contact hole from being enlarged by the subsequent etching processes.

In accordance with some embodiments, a semiconductor device structure is provided. The semiconductor device structure includes a dielectric structure over a substrate. The semiconductor device structure includes a contact structure passing through the dielectric structure. The contact structure includes a contact layer, a first barrier layer, and a second barrier layer. The first barrier layer surrounds the contact layer, the second barrier layer surrounds a first upper portion of the first barrier layer, the contact layer passes through the first barrier layer and extends into the dielectric structure, and the first barrier layer passes through the second barrier layer and extends into the dielectric structure.

In accordance with some embodiments, a semiconductor device structure is provided. The semiconductor device structure includes a metal-containing layer over a substrate. The semiconductor device structure includes a dielectric structure over the substrate and covering the metal-containing layer. A contact structure passing through the dielectric structure and connected to the metal-containing layer. The contact structure includes a contact layer, a first barrier layer, and a second barrier layer. The first barrier layer surrounds the contact layer, the second barrier layer surrounds a first upper portion of the first barrier layer, a first bottom surface of the contact layer is lower than a second bottom surface of the first barrier layer, and the second bottom surface is lower than a third bottom surface of the second barrier layer in a cross-sectional view of the contact structure.

In accordance with some embodiments, a semiconductor device structure is provided. The semiconductor device structure includes a transistor over a substrate. The semiconductor device structure includes a dielectric structure over the substrate and covering the transistor. The semiconductor device structure includes a contact structure passing through the dielectric structure and electrically connected to the transistor. The contact structure includes a contact layer, a first barrier layer, and a second barrier layer. The first barrier layer passes through the second barrier layer and extends into the dielectric structure under the second barrier layer, the contact layer passes through the first barrier layer and extends into the dielectric structure under the first barrier layer, and a lower portion of the first barrier layer has a first curved sidewall.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a dielectric structure over a substrate; and
    a contact structure passing through the dielectric structure, wherein the contact structure comprises a contact layer, a first barrier layer, and a second barrier layer,
    the first barrier layer surrounds the contact layer, the second barrier layer surrounds a first upper portion of the first barrier layer, the contact layer passes through the first barrier layer and extends into the dielectric structure, the first barrier layer passes through the second barrier layer and extends into the dielectric structure, and a first lower portion of the first barrier layer is in direct contact with the dielectric structure.

2. The semiconductor device structure as claimed in claim 1, wherein the second barrier layer is in direct contact with the dielectric structure and the first barrier layer.

3. The semiconductor device structure as claimed in claim 1, wherein a second upper portion of the contact layer surrounded by the second barrier layer is wider than a second lower portion of the contact layer surrounded by the first lower portion of the first barrier layer.

4. The semiconductor device structure as claimed in claim 1, wherein the first barrier layer separates the second barrier layer from the contact layer.

5. The semiconductor device structure as claimed in claim 1, wherein a first thickness of the second barrier layer increases toward the substrate.

6. The semiconductor device structure as claimed in claim 5, wherein a second thickness of the first lower portion of the first barrier layer increases toward the substrate.

7. The semiconductor device structure as claimed in claim 1, further comprising:
    a transistor over the substrate, wherein the contact structure is over and electrically connected to the transistor.

8. The semiconductor device structure as claimed in claim 7, wherein the transistor comprises a source/drain structure, and the contact structure is over and connected to the source/drain structure.

9. The semiconductor device structure as claimed in claim 7, wherein the transistor comprises a gate stack, and the contact structure is over and connected to the gate stack.

10. The semiconductor device structure as claimed in claim 1, wherein the second barrier layer is thicker than the first upper portion of the first barrier layer.

11. A semiconductor device structure, comprising:
    a metal-containing layer over a substrate;
    a dielectric structure over the substrate and covering the metal-containing layer; and
    a contact structure passing through the dielectric structure and connected to the metal-containing layer, wherein the contact structure comprises a contact layer, a first barrier layer, and a second barrier layer,
    the first barrier layer surrounds the contact layer, the second barrier layer surrounds a first upper portion of the first barrier layer, a first bottom surface of the contact layer is lower than a second bottom surface of the first barrier layer, and the second bottom surface is lower than a third bottom surface of the second barrier layer in a cross-sectional view of the contact structure.

12. The semiconductor device structure as claimed in claim 11, wherein the contact structure further comprises:
    a third barrier layer surrounding the contact structure, wherein the first barrier layer surrounds a second upper portion of the third barrier layer, and a first lower portion of the third barrier layer is in direct contact with the dielectric structure.

13. The semiconductor device structure as claimed in claim 12, wherein a fourth bottom surface of the third barrier layer is lower than the first bottom surface of the contact structure.

14. The semiconductor device structure as claimed in claim 12, wherein the third barrier layer comprises a metal layer and a metal nitride layer over the metal layer.

15. The semiconductor device structure as claimed in claim 11, wherein the second bottom surface and a first sidewall of a lower portion of the first barrier layer and the third bottom surface and a second sidewall of the second barrier layer together form a step-like sidewall.

16. A semiconductor device structure, comprising:
a transistor over a substrate;
a dielectric structure over the substrate and covering the transistor; and
a contact structure passing through the dielectric structure and electrically connected to the transistor, wherein the contact structure comprises a contact layer, a first barrier layer, and a second barrier layer,
the first barrier layer passes through the second barrier layer and extends into the dielectric structure under the second barrier layer, the contact layer passes through the first barrier layer and extends into the dielectric structure under the first barrier layer, and a lower portion of the first barrier layer has a first curved sidewall.

17. The semiconductor device structure as claimed in claim 16, wherein the first barrier layer has a first length, the second barrier layer has a second length, the contact layer has a third length, the third length is greater than the first length, the first length is greater than the second length, and the first length, the second length, and the third length are measured from a fourth top surface of the dielectric structure.

18. The semiconductor device structure as claimed in claim 16, wherein a lower portion of the second barrier layer is thicker than an upper portion of the second barrier layer.

19. The semiconductor device structure as claimed in claim 16, wherein a first top surface of the first barrier layer, a second top surface of the second barrier layer, and a third top surface of the contact layer are substantially level with each other.

20. The semiconductor device structure as claimed in claim 16, wherein the second barrier layer has a second curved sidewall.

* * * * *